(12) United States Patent
Mori et al.

(10) Patent No.: US 9,405,190 B2
(45) Date of Patent: Aug. 2, 2016

(54) METHOD FOR FORMING RESIST PATTERN AND RESIST COMPOSITION

(71) Applicant: Tokyo Ohka Kogyo Co., Ltd., Kawasaki-shi (JP)

(72) Inventors: Takayoshi Mori, Kawasaki (JP); Junichi Tsuchiya, Kawasaki (JP); Yusuke Suzuki, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/519,879

(22) Filed: Oct. 21, 2014

(65) Prior Publication Data

US 2015/0118616 A1 Apr. 30, 2015

(30) Foreign Application Priority Data

Oct. 25, 2013 (JP) ................................. 2013-222564

(51) Int. Cl.
| | |
|---|---|
| G03F 7/30 | (2006.01) |
| G03F 7/38 | (2006.01) |
| G03F 7/038 | (2006.01) |
| G03F 7/039 | (2006.01) |
| G03F 7/20 | (2006.01) |
| G03F 7/32 | (2006.01) |

(52) U.S. Cl.
CPC ............ *G03F 7/0397* (2013.01); *G03F 7/0382* (2013.01); *G03F 7/2041* (2013.01); *G03F 7/325* (2013.01)

(58) Field of Classification Search
None
See application file for complete search history.

(56) References Cited

U.S. PATENT DOCUMENTS

| | | | | |
|---|---|---|---|---|
| 6,200,725 | B1 * | 3/2001 | Takechi | G03F 7/039 430/270.1 |
| 2004/0110085 | A1 | 6/2004 | Iwai et al. | |
| 2005/0227174 | A1 * | 10/2005 | Hatakeyama | G03F 7/0045 430/270.1 |
| 2007/0072115 | A1 * | 3/2007 | Hatakeyama | C08F 220/18 430/270.1 |
| 2007/0275324 | A1 * | 11/2007 | Allen | C08F 220/18 430/270.1 |
| 2008/0187860 | A1 * | 8/2008 | Tsubaki et al. | 430/270.1 |
| 2009/0197204 | A1 | 8/2009 | Shiono et al. | |
| 2009/0214982 | A1 | 8/2009 | Shimizu et al. | |
| 2009/0269694 | A1 | 10/2009 | Shimizu et al. | |
| 2009/0317743 | A1 * | 12/2009 | Shiono et al. | 430/270.1 |
| 2010/0310985 | A1 | 12/2010 | Mori et al. | |
| 2011/0117499 | A1 | 5/2011 | Matsumiya et al. | |
| 2012/0149916 | A1 * | 6/2012 | Utsumi et al. | 549/49 |

FOREIGN PATENT DOCUMENTS

| | | | |
|---|---|---|---|
| JP | 10-301284 | * | 11/1998 |
| JP | 2000-056459 | * | 2/2000 |
| JP | A-2002-131917 | | 5/2002 |
| JP | A-2003-241385 | | 8/2003 |
| JP | 2007-140188 | * | 6/2007 |
| JP | A-2009-223300 | | 10/2009 |
| JP | A-2009-244395 | | 10/2009 |
| JP | A-2010-002870 | | 1/2010 |
| JP | A-2010-032994 | | 2/2010 |
| JP | A-2010-277043 | | 12/2010 |
| JP | A-2011-013569 | | 1/2011 |
| JP | A-2011-128226 | | 6/2011 |
| JP | 2012-162498 | * | 8/2012 |

OTHER PUBLICATIONS

Office Action in U.S. Appl. No. 14/597,555, mailed Feb. 3, 2016.
Notice of Allowance in U.S. Appl. No. 14/597,555, dated May 10, 2016.

* cited by examiner

*Primary Examiner* — Martin Angebranndt
(74) *Attorney, Agent, or Firm* — Knobbe Martens Olson & Bear LLP

(57) ABSTRACT

A resist pattern formation method with enhanced resolution and process margin in forming a resist pattern. The method includes using a resist composition containing a high-molecular weight compound having a constituent unit represented by the general formula (a0-1) and conducting patterning by negative type development with a developing solution containing an organic solvent to form a resist pattern

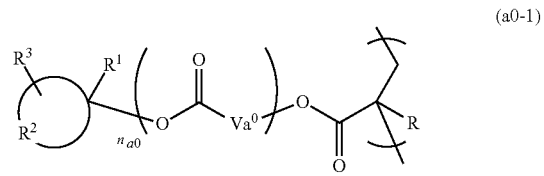

(a0-1)

in which R represents a hydrogen atom, an alkyl group having 1 to 5 carbon atoms, or a halogenated alkyl group having 1 to 5 carbon atoms; $Va^0$ represents a divalent hydrocarbon group; $n_{a0}$ is an integer of 0 to 2; $R^1$ represents a chain or cyclic aliphatic hydrocarbon group; $R^2$ represents a group for forming a monocyclic group together with the carbon atom to which $R^1$ is bonded; and $R^3$ represents an optionally substituted cyclic group.

6 Claims, No Drawings

METHOD FOR FORMING RESIST PATTERN AND RESIST COMPOSITION

CROSS-REFERENCE TO RELATED APPLICATIONS

This application claims priority to Japanese Patent Application No. 2013-222564, filed Oct. 25, 2013, the content of which is incorporated herein by reference.

TECHNICAL FIELD

The present invention relates to a method for forming a resist pattern and a resist composition.

RELATED ART

Techniques (pattern-forming techniques) in which a fine pattern is formed on the top of a substrate, and a lower layer beneath that pattern is then processed by conducting etching by using this pattern as a mask are widely adopted in the production of semiconductor elements and liquid crystal display elements. These types of fine patterns are usually composed of an organic material and formed by using a technique such as a lithography method and a nanoimprint method. For example, the lithography method is conducted by steps including forming a resist film on a support such as a substrate by using a resist material containing a base material component such as a resin and selectively exposing the resist film with light and radial rays such as electron beams, followed by conducting a development treatment, thereby forming a resist pattern having a prescribed shape on the resist film. A semiconductor element or the like is then produced through a step of processing the substrate by means of etching by using the resist pattern as a mask.

The above-described resist material is classified into a positive type and a negative type. A resist material in which the exposed portions exhibit increased solubility in a developing solution is called a positive type, and a resist material in which the exposed portions exhibit decreased solubility in a developing solution is called a negative type.

In general, an alkali aqueous solution (alkali developing solution) such as a tetramethylammonium hydroxide (TMAH) aqueous solution is used as the developing solution. In addition, a developing solution (organic developing solution) containing an organic solvent such as an aromatic organic solvent, an aliphatic hydrocarbon-based organic solvent, an ether-based organic solvent, a ketone-based organic solvent, an ester-based organic solvent, an amide-based organic solvent, and an alcohol-based organic solvent is also used as the developing solution.

In recent years, advances in lithography techniques have led to rapid progress in the field of pattern miniaturization.

In general, the miniaturization techniques involve shortening of the wavelength (increasing the energy) of the exposure light source. Specifically, ultraviolet rays represented by g-line or i-line have hitherto been used. But, nowadays KrF excimer lasers and ArF excimer lasers are starting to be introduced in mass production of semiconductor elements. In addition, investigations are also being conducted on EB (electron beams), EUV (extreme ultraviolet radiation), X rays, and the like, which have a shorter wavelength (higher energy) than these excimer lasers.

Following shortening of the wavelength of the exposure light source, the resist material is required to have enhancements of lithography properties such as sensitivity to the exposure light source and resolution capable of reproducing patterns of minute dimensions. As the resist material that satisfies such requirements, a chemically amplified resist composition is known.

As the chemically amplified resist composition, a composition containing a base material component which exhibits changed solubility in a developing solution by the action of an acid and an acid generator component that generates an acid upon exposure is generally used. For example, in the case where the developing solution is an alkali developing solution (alkali development process), a material exhibiting increased solubility in the alkali developing solution by the action of an acid is used as the base material component.

Conventionally, a resin (base resin) is mainly used as the base material component of the chemically amplified resist composition. At present, because of excellent transparency in the vicinity of 193 nm, a resin having a constituent unit derived from a (meth)acrylic ester in a main chain thereof (acrylic resin) is the mainstream as the base resin for the chemically amplified resist composition which is used in the ArF excimer laser lithography or the like.

Here, the term "(meth)acrylic acid" means either one or both of acrylic acid having a hydrogen atom bonded at the α-position and methacrylic acid having a methyl group bonded at the α-position. The term "(meth)acrylic ester" means either one or both of an acrylic ester having a hydrogen atom bonded at the α-position and a methacrylic ester having a methyl group bonded at the α-position. The term "(meth)acrylate" means either one or both of an acrylate having a hydrogen atom bonded at the α-position and a methacrylate having a methyl group bonded at the α-position.

In general, the base resin of the chemically amplified resist composition has plural kinds of constituent units for the purpose of enhancing lithography properties and the like. For example, a constituent unit having a lactone structure, a constituent unit having a polar group such as a hydroxyl group, or the like as well as a constituent unit having an acid decomposable group which is decomposed by the action of an acid generated from an acid generator to generate an alkali-soluble group, is used (see, for example, Patent Document 1). In the case where the base resin is an acrylic resin, in general, a resin in which a carboxy group in (meth)acrylic acid or the like is protected by an acid dissociable group such as a tertiary alkyl group and an acetal group is used as the acid decomposable group.

As compared with a negative type development process using a combination of a negative type, chemically amplified resist composition with an alkali developing solution, a positive type development process using a combination of a positive type, chemically amplified resist composition, namely a chemically amplified resist composition whose solubility in an alkali developing solution increases upon exposure, with an alkali developing solution has such advantages that a structure of a photomask can be simplified; and that properties of a formed pattern are excellent. For that reason, at present, the positive type development process using a combination of a positive type, chemically amplified resist composition with an alkali developing solution is manly used for the formation of a fine resist pattern (see, for example, Patent Document 2).

In the case of applying the positive type development process, when a resist film obtained by coating the chemically amplified resist composition on a support is selectively exposed, exposed areas of the resist film change from sparingly soluble properties to soluble properties in the alkali developing solution upon decomposition of the acid decomposable group in the base resin by the action of an acid generated from the acid generator or the like, whereas unexposed areas of the resist film do not change in the state where they are still sparingly alkali-soluble. Thus, by the development with the alkali developing solution, a dissolution contrast can be created between the exposed areas and the unexposed areas, and a positive type resist pattern can be formed.

DOCUMENT OF RELATED ART

Patent Document

Patent Document 1: Japanese Unexamined Patent Application, Publication No. 2003-241385
Patent Document 2: Japanese Unexamined Patent Application, Publication No. 2009-244395

SUMMARY OF THE INVENTION

In recent years, as further progress is made in lithography techniques and expansion of the application field is being advanced, further improvements have also been demanded in terms of various lithography properties in the positive type development process.

However, even if it is contemplated to apply the positive type development process to form a finer pattern (for example, a trench pattern or a fine and high-density contact hole pattern), in the exposed areas of the resist film, a region with a weak optical intensity is generated particularly in the film thickness direction, whereby the resolution of the resist pattern is easily lowered. In addition, there is involved such a problem that it is difficult to ensure a process margin due to a difference of the pattern as a target.

In view of the foregoing circumstances, the present invention has been made, and an object thereof is to enhance resolution and process margin in forming a resist pattern.

For solving the above-described problem, the present invention employs the following constitutions.

Specifically, a first aspect of the present invention is concerned with a method for forming a resist pattern including: a step of forming a resist film on a support by using a resist composition which generates an acid upon exposure and in which its solubility in a developing solution changes by the action of the acid; a step of exposing the resist film; and a step of subjecting the exposed resist film to patterning by negative type development with a developing solution containing an organic solvent, to form a resist pattern, the resist composition containing a high-molecular weight compound having a constituent unit represented by the following general formula (a0-1).

(Chemical formula 1)

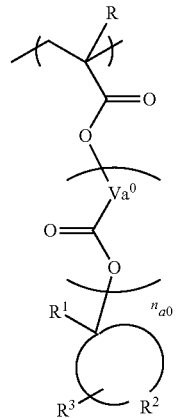

(a0-1)

In the formula, R represents a hydrogen atom, an alkyl group having 1 to 5 carbon atoms, or a halogenated alkyl group having 1 to 5 carbon atoms; $Va^0$ represents a divalent hydrocarbon group which may have an ether bond, a urethane bond, or an amide bond; $n_{a0}$ is an integer of 0 to 2; $R^1$ represents a chain or cyclic aliphatic hydrocarbon group; $R^2$ represents a group for forming a monocyclic group together with the carbon atom to which $R^1$ is bonded; and $R^3$ represents a cyclic group which may have a substituent.

A second aspect of the present invention is concerned with a resist composition which is used for a method for forming a resist pattern including: a step of forming a resist film on a support by using a resist composition which generates an acid upon exposure and in which its solubility in a developing solution changes by the action of the acid; a step of exposing the resist film; and a step of subjecting the exposed resist film to patterning by negative type development with a developing solution containing an organic solvent, to form a resist pattern, the resist composition containing a high-molecular weight compound having a constituent unit represented by the following general formula (a0-1).

(Chemical formula 2)

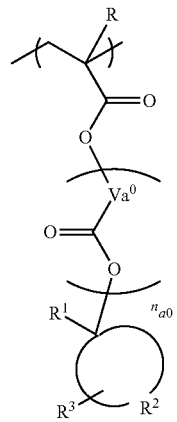

(a0-1)

In the formula, R represents a hydrogen atom, an alkyl group having 1 to 5 carbon atoms, or a halogenated alkyl group having 1 to 5 carbon atoms; $Va^0$ represents a divalent hydrocarbon group which may have an ether bond, a urethane bond, or an amide bond; $n_{a0}$ is an integer of 0 to 2; $R^1$ represents a chain or cyclic aliphatic hydrocarbon group; $R^2$ represents a group for forming a monocyclic group together with the carbon atom to which $R^1$ is bonded; and $R^3$ represents a cyclic group which may have a substituent.

According to the resist composition and the method for forming a resist pattern using the same of the present invention, it is possible to form a resist pattern with high resolution and also to sufficiently ensure a process margin.

DETAILED DESCRIPTION OF THE INVENTION

In the present specification and claims, the term "aliphatic" is a relative concept used in relation to the term "aromatic" and means a group or a compound each having no aromaticity.

The term "alkyl group" includes a linear, branched or cyclic, monovalent saturated hydrocarbon group, unless otherwise specified. The same applies for the alkyl group within an alkoxy group.

The term "alkylene group" includes a linear, branched or cyclic, divalent saturated hydrocarbon group, unless otherwise specified.

The term "halogenated alkyl group" refers to a group in which a part or all of hydrogen atoms of an alkyl group are substituted with a halogen atom. Examples of the halogen atom include a fluorine atom, a chlorine atom, a bromine atom, and an iodine atom.

The term "fluorinated alkyl group" or "fluorinated alkylene group" refers to a group in which a part or all of hydrogen atoms of an alkyl group or an alkylene group are substituted with a fluorine atom.

The term "constituent unit" means a monomer unit constituting a high-molecular weight compound (for example, a resin, a polymer, or a copolymer).

The case of describing "may have a substituent" or "optionally substituted" includes both of the case where the hydrogen atom (—H) is substituted with a monovalent group and the case where the methylene group (—CH$_2$—) is substituted with a divalent group.

The term "exposure" is a concept including irradiation with any form of radial rays.

The term "constituent unit derived from an acrylic ester" means a constituent unit constituted upon cleavage of an ethylenic double bond of an acrylic ester.

The term "acrylic ester" refers to a compound in which a terminal hydrogen atom of a carboxy group of acrylic acid (CH$_2$=CH—COOH) is substituted with an organic group.

In the acrylic ester, a hydrogen atom bonded to a carbon atom at the α-position may be substituted with a substituent. The substituent ($R^{\alpha 0}$) with which the hydrogen atom bonded to the carbon atom at the α-position is substituted is an atom other than the hydrogen atom or a group, and examples thereof include an alkyl group having 1 to 5 carbon atoms and a halogenated alkyl group having 1 to 5 carbon atoms. In addition, examples of the acrylic ester also include an itaconic acid diester in which the substituent ($R^{\alpha 0}$) is substituted with an ester bond-containing substituent and an α-hydroxyacrylic ester in which the substituent ($R^{\alpha 0}$) is substituted with a hydroxyalkyl group or a group in which the hydroxyl group of the hydroxyalkyl group is modified. It is to be noted that the carbon atom at the α-position of the acrylic ester refers to a carbon atom to which the carbonyl group of acrylic acid is bonded, unless otherwise specified.

The acrylic ester in which the hydrogen atom bonded to the carbon atom at the α-position is substituted with a substituent is hereinafter sometimes referred to as "α-substituted acrylic ester". In addition, the acrylic ester and the α-substituted acrylic ester are sometimes referred to comprehensively as "(α-substituted) acrylic ester".

The term "constituent unit derived from acrylamide" means a constituent unit constituted upon cleavage of an ethylenic double bond of acrylamide.

In the acrylamide, the hydrogen atom bonded to the carbon atom at the α-position may be substituted with a substituent, and either one or both of the hydrogen atoms of the amino group of the acrylamide may be substituted with a substituent. It is to be noted that the carbon atom at the α-position of the acrylamide refers to a carbon atom to which the carbonyl group of the acrylamide is bonded, unless otherwise specified.

Examples of the substituent with which the hydrogen atom bonded to the carbon atom at the α-position of the acrylamide is substituted include those exemplified above as the substituent (substituent ($R^{\alpha 0}$)) at the α-position for the α-substituted acrylic ester.

The term "constituent unit derived from hydroxystyrene or a hydroxystyrene derivative" means a constituent unit constituted upon cleavage of an ethylenic double bond of hydroxystyrene or a hydroxystyrene derivative.

The term "hydroxystyrene derivative" is a concept including compounds in which the hydrogen atom at the α-position of hydroxystyrene is substituted with other substituent such as an alkyl group and a halogenated alkyl group, and derivatives thereof. Examples of such derivatives include those in which the hydrogen atom of the hydroxyl group of hydroxystyrene in which the hydrogen atom at the α-position may be substituted with a substituent is substituted with an organic group; and those in which a substituent other than the hydroxyl group is bonded to the benzene ring of hydroxystyrene in which the hydrogen atom at the α-position may be substituted with a substituent. It is to be noted that the term "α-position of hydroxystyrene" (carbon atom at the α-position) refers to a carbon atom to which the benzene ring is bonded, unless otherwise specified.

Examples of the substituent with which the hydrogen atom at the α-position of hydroxystyrene is substituted include those exemplified above as the substituent at the α-position for the α-substituted acrylic ester.

The term "constituent unit derived from vinylbenzoic acid or a vinylbenzoic acid derivative" means a constituent unit constituted upon cleavage of an ethylenic double bond of vinylbenzoic acid or a vinylbenzoic acid derivative.

The term "vinylbenzoic acid derivative" is a concept including compounds in which the hydrogen atom at the α-position of vinylbenzoic acid is substituted with other substituent such as an alkyl group and a halogenated alkyl group, and derivatives thereof. Examples of such derivatives include those in which the hydrogen atom of the carboxy group of vinylbenzoic acid in which the hydrogen atom at the α-position may be substituted with a substituent is substituted with an organic group; and those in which a substituent other than a hydroxyl group and a carboxy group is bonded to the benzene ring of vinylbenzoic acid in which the hydrogen atom at the α-position may be substituted with a substituent. It is to be noted that the term "α-position of vinylbenzoic acid" (carbon atom at the α-position) refers to a carbon atom to which the benzene ring is bonded, unless otherwise specified.

The term "styrene" is a concept including styrene and compounds in which the hydrogen atom at the α-position of styrene is substituted with other substituent such as an alkyl group and a halogenated alkyl group.

The term "constituent unit derived from styrene" or "constituent unit derived from a styrene derivative" means a constituent unit constituted upon cleavage of an ethylenic double bond of styrene or a styrene derivative.

The alkyl group as the substituent at the α-position is preferably a linear or branched alkyl group. Specifically, examples thereof include an alkyl group having 1 to 5 carbon atoms (for example, a methyl group, an ethyl group, a propyl group, an isopropyl group, an n-butyl group, an isobutyl group, a tert-butyl group, a pentyl group, an isopentyl group, or a neopentyl group).

In addition, specifically, examples of the halogenated alkyl group as the substituent at the α-position include a group in which a part or all of the hydrogen atoms of the above-described "alkyl group as the substituent at the α-position" are substituted with a halogen atom. Examples of the halogen atom include a fluorine atom, a chlorine atom, a bromine atom, and an iodine atom, with a fluorine atom being especially preferable.

In addition, specifically, examples of the hydroxyalkyl group as the substituent at the α-position include a group in which a part or all of the hydrogen atoms of the above-described "alkyl group as the substituent at the α-position" are substituted with a hydroxyl group. The number of hydroxyl group in the hydroxyalkyl group is preferably 1 to 5, and most preferably 1.

<Resist Pattern Formation Method>

The resist pattern formation method of the present invention includes a step of forming a resist film on a support by using a resist composition which generates an acid upon exposure and in which its solubility in a developing solution changes by the action of the acid; a step of exposing the resist film; and a step of subjecting the exposed resist film to patterning by negative type development with a developing solution containing an organic solvent, to form a resist pattern.

The resist pattern formation method of the present invention can be, for example, conducted in the following manner.

First of all, a resist composition which generates an acid upon exposure and in which its solubility in a developing solution changes by the action of the acid is coated on a support by using a spinner or the like, and a bake (post-apply bake (PAB)) treatment is conducted under a temperature condition of, for example, 80 to 150° C. for 40 to 120 seconds, and preferably 60 to 90 seconds, thereby forming a resist film.

As the resist composition as referred to herein, the same resist composition of the present invention as described later can be used.

Subsequently, by using an exposure apparatus, for example, an ArF exposure apparatus, an electron beam drawing apparatus, or an EUV exposure apparatus, the resist film is exposed through a photomask having a prescribed pattern formed thereon (mask pattern) or selectively exposed without using a photomask by drawing by means of direct irradiation with electron beams, or the like.

Thereafter, a bake (post exposure bake (PEB)) treatment is conducted under a temperature condition of, for example, 80 to 150° C. for 40 to 120 seconds, and preferably 60 to 90 seconds.

Subsequently, the resist film after the exposure and bake (PEB) treatment is subjected to negative type development. The negative type development treatment is conducted by using a developing solution containing an organic solvent (organic developing solution).

In the resist pattern formation method of the present invention, by conducting patterning by negative type development with an organic developing solution to form a resist pattern, even if it is contemplated to form a finer pattern (for example, a trench pattern or a fine and high-density contact hole pattern), a pattern with high resolution is easily obtained. In addition thereto, the resist pattern formed with a large process margin has excellent lithography properties and satisfactory shape.

After the negative type development, it is preferable to conduct a rinse treatment. It is preferable to use a rinse solution containing an organic solvent for the rinse treatment. Furthermore, after the negative type development or rinse treatment, a treatment of removing the organic developing solution or rinse solution deposited on the resist pattern with a supercritical fluid may be conducted.

Subsequently, after the negative type development or rinse treatment, drying is conducted. In addition, as the case may be, a bake treatment (post bake) may be conducted after the negative type development.

By conducting the above-described operation, a fine resist pattern can be formed.

The support is not particularly limited, and a conventionally known support can be used. For example, substrates for electronic components, and such substrates having a prescribed wiring pattern formed thereon can be exemplified. More specifically, examples thereof include a silicon wafer; a substrate made of a metal such as copper, chromium, iron, and aluminum; and a glass substrate. As a material for the wiring pattern, for example, copper, aluminum, nickel, or gold can be used.

In addition, as the support, a support in which an inorganic and/or organic film is provided on the above-described substrate may also be used. Examples of the inorganic film include an inorganic antireflection film (inorganic BARC). Examples of the organic film include an organic film such as an organic antireflection film (organic BARC) and a lower layer organic film in the multilayer resist method.

Here, the term "multilayer resist method" is a method in which at least one layer of an organic film (lower layer organic film) and at least one layer of a resist film (upper layer resist film) are provided on a substrate, and the lower layer organic film is subjected to patterning while using, as a mask, a resist pattern formed on the upper layer resist film, and it is said that a pattern with a high aspect ratio can be formed. That is, according to the multilayer resist method, since a required thickness can be ensured by the lower layer organic film, the resist film can be made thin, so that it becomes possible to form a fine pattern with a high aspect ratio.

Basically, the multilayer resist method is classified into a method of forming a two-layer structure of an upper layer resist film and a lower layer organic film (two-layer resist method); and a method of forming a multilayer structure of three or more layers, in which one or more interlayers (for example, a metal thin film) are provided between an upper layer resist film and a lower layer organic film (three-layer resist method).

The wavelength to be used for the exposure is not particularly limited, and the exposure can be conducted by using ArF excimer lasers, KrF excimer lasers, $F_2$ excimer lasers, EUV (extreme ultraviolet rays), VUV (vacuum ultraviolet rays), radial rays such as EB (electron beams), X rays, and soft X rays. The resist pattern formation method of the present invention is high in usefulness for KrF excimer lasers, ArF excimer lasers, EB, or EUV, and is especially useful for ArF excimer lasers, EB, or EUV.

The exposure method of the resist film may be conducted by means of general exposure (dry exposure) which is conducted in air or an inert gas such as nitrogen, or it may be conducted by means of liquid immersion lithography.

The liquid immersion lithography is an exposure method in which a region between a resist film and a lens located at the lowermost position of an exposure apparatus is previously filled with a solvent (liquid immersion medium) having a refractive index larger than a refractive index of air, and the exposure (immersion exposure) is conducted in that state.

The liquid immersion medium is preferably a solvent having a refractive index larger than a refractive index of air and smaller than a refractive index of a resist film to be exposed. The refractive index of such a solvent is not particularly limited so long as it falls within the foregoing range.

Examples of the solvent having a refractive index larger than a refractive index of air and smaller than a refractive index of the resist film include water, a fluorine-based inert liquid, a silicon-based organic solvent, and a hydrocarbon-based organic solvent.

Specific examples of the fluorine-based inert liquid include a liquid composed mainly of a fluorine-based compound such as $C_3HCl_2F_5$, $C_4F_9OCH_3$, $C_4F_9OC_2H_5$, and $C_5H_3F_7$. Of these, fluorine-based inert liquids having a boiling point of 70 to 180° C. are preferable, and those having a boiling point of 80 to 160° C. are more preferable. A fluorine-based inert liquid having a boiling point falling within the foregoing range is preferable because after completion of the exposure, the removal of the medium used for the liquid immersion can be conducted by a simple method.

As the fluorine-based inert liquid, in particular, a perfluoroalkyl compound in which all of hydrogen atoms of an alkyl group are substituted with a fluorine atom is preferable. Specifically, examples of the perfluoroalkyl compound include a perfluoroalkylether compound and a perfluoroalkylamine compound.

Furthermore, specifically, examples of the perfluoroalkylether compound include perfluoro(2-butyl-tetrahydrofuran) (boiling point: 102° C.); and examples of the perfluoroalkylamine compound include perfluorotributylamine (boiling point: 174° C.)

As the liquid immersion medium, water is preferably used from the viewpoints of cost, safety, environmental issue, and versatility.

The organic solvent which is contained in an organic developing solution to be used for the treatment of negative type development may be an organic solvent capable of dissolving a component (A1) as described later (component (A1) before the exposure) therein, and it can be properly selected among known organic solvents. Specifically, examples thereof include a polar solvent and a hydrocarbon-based organic solvent such as a ketone-based organic solvent, an ester-based organic solvent, an alcohol-based organic solvent, a nitrile-based organic solvent, an amide-based organic solvent, and an ether-based organic solvent.

The ketone-based organic solvent is an organic solvent containing C—C(=O)—C in a structure thereof. The ester-based organic solvent is an organic solvent containing C—C(=O)—O—C in a structure thereof. The alcohol-based organic solvent is an organic solvent containing an alcoholic hydroxyl group in a structure thereof, and the term "alcoholic hydroxyl group" means a hydroxyl group bonded to a carbon atom of an aliphatic hydrocarbon group. The nitrile-based organic solvent is an organic solvent containing a nitrile group in a structure thereof. The amide-based organic solvent is an organic solvent containing an amide group in a structure thereof. The ether-based organic solvent is an organic solvent containing C—O—C in a structure thereof.

Among organic solvents, there is also present an organic solvent containing plural kinds of functional groups which characterize the above-described respective solvents, in a structure thereof. In that case, any solvent species containing a functional group which the subject organic solvent has falls under the definition thereof. For example, diethylene glycol monomethyl ether falls under the definition of any of the alcohol-based organic solvent and the ether-based organic solvent in the above-described classification.

The hydrocarbon-based organic solvent is a hydrocarbon solvent which is composed of a hydrocarbon which may be halogenated but does not have a substituent other than the halogen atom. Examples of the halogen atom include a fluorine atom, a chlorine atom, a bromine atom, and an iodine atom, with a fluorine atom being preferable.

Of the foregoing, in view of the fact that a resist pattern with high resolution is easily obtained, the developing solution which is used for the negative type development preferably contains one or more organic solvents selected from the group consisting of an ester-based organic solvent and a ketone-based organic solvent, and more preferably contains an ester-based organic solvent.

Examples of the ester-based organic solvent include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate.

Of the foregoing, butyl acetate is preferable as the ester-based organic solvent.

Examples of the ketone-based organic solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, γ-butyrolactone, and methyl amyl ketone (2-heptanone).

As the ketone-based organic solvent, methyl amyl ketone (2-heptanone) is preferable.

If desired, the organic developing solution can be blended with a known additive. Examples of the additive include a surfactant. Though the surfactant is not particularly limited, for example, an ionic or nonionic fluorine-based and/or silicon-based surfactant can be used. As the surfactant, a nonionic surfactant is preferable, and a fluorine-based surfactant or a silicon-based surfactant is more preferable.

In the case of blending the surfactant, a blending amount thereof is usually 0.001 to 5 mass %, preferably 0.005 to 2 mass %, and more preferably 0.01 to 0.5 mass % relative to the whole amount of the organic developing solution.

It is possible to carry out the treatment of negative type development by a known development method. Examples of the treatment include a method of dipping a support in a developing solution for a certain period of time (dip method); a method of raising a developing solution on the surface of a support due to a surface tension and making it stationary for a certain period of time (puddle method); a method of spraying a developing solution onto the surface of a support (spray method); and a method of continuously dispensing a developing solution onto a support rotating at a fixed rate while scanning a developing solution dispense nozzle at a fixed rate (dynamic dispense method).

As the organic solvent which is contained in the rinse solution to be used for the rinse treatment after the negative type development, among the organic solvents exemplified above as the organic solvent which is used in the organic developing solution, an organic solvent which hardly dissolves the resist pattern therein can be properly selected and used. In general, at least one solvent selected from a hydrocarbon-based organic solvent, a ketone-based organic solvent, an ester-based organic solvent, an alcohol-based organic solvent, an amide-based organic solvent, and an ether-based organic solvent is used. Of these, at least one solvent selected from a hydrocarbon-based organic solvent, a ketone-based organic solvent, an ester-based organic solvent, an alcohol-based organic solvent, and an amide-based organic solvent is preferable; at least one solvent selected from an ester-based organic solvent and a ketone-based organic solvent is more preferable; and an ester-based organic solvent is especially preferable.

These organic solvents may be used solely, or may be used in admixture of two or more kinds thereof. In addition, such an organic solvent may be mixed with an organic solvent other than the foregoing organic solvents or water and used. However, taking into consideration the development properties, a blending amount of water in the rinse solution is preferably 30 mass % or less, more preferably 10 mass % or less, still more preferably 5 mass % or less, and especially preferably 3 mass % or less relative to the whole amount of the rinse solution.

The rinse solution can be blended with a known additive, if desired. Examples of the additive include a surfactant. Examples of the surfactant include the same surfactants as those described above. Above all, a nonionic surfactant is preferable, and a fluorine-based surfactant or a silicon-based surfactant is more preferable.

In the case of blending the surfactant in the rinse solution, its blending amount is usually 0.001 to 5 mass %, preferably 0.005 to 2 mass %, and more preferably 0.01 to 0.5 mass % relative to the whole amount of the rinse solution.

The rinse treatment (washing treatment) with a rinse solution can be carried out by a known rinse method. Examples of the method include a method of continuously dispensing a rinse solution onto a support rotating at a fixed rate (rotary coating method); a method of dipping a support in a rinse solution for a certain period of time (dip method); and a method of spraying a rinse solution onto the surface of a support (spray method).

<Resist Composition>

The resist composition of the present invention is a resist composition to be used for the above-described resist pattern formation method of the present invention, which generates an acid upon exposure and in which its solubility in a developing solution changes by the action of the acid.

Such a resist composition contains a base material component (A) (hereinafter also referred to as "component (A)") whose solubility in an organic solvent contained in an organic developing solution decreases by the action of an acid.

When a resist film is formed by using such a resist composition, and the resist film is selectively exposed, in exposed areas of the resist film, an acid is generated, and the solubility of the component (A) in an organic solvent contained in an organic developing solution decreases by the action of an acid, whereas in unexposed areas of the resist film, the solubility of the component (A) in the organic solvent contained in the organic developing solution does not change, and therefore, a difference in the solubility in the organic solvent is generated between the exposed areas and the unexposed areas. For that reason, when the resist film is developed with the organic developing solution, the unexposed areas of the resist film are dissolved and removed, whereby a negative type resist pattern is formed.

In the present specification, a resist composition in which unexposed areas are dissolved and removed, thereby forming a negative type resist pattern is called a negative type resist composition, and a resist composition in which exposed areas are dissolved and removed, thereby forming a positive type resist pattern is called a positive type resist composition.

The resist composition of the present invention is a resist composition having acid generating ability of generating an acid upon exposure, and the component (A) may generate an acid upon exposure, or an additive component blended separately from the component (A) may generate an acid upon exposure.

Specifically, the resist composition of the present invention may be (1) a resist composition containing an acid generator component (B) (hereinafter referred to as "component (B)") which generates an acid upon exposure;

(2) a resist composition in which the component (A) is a component which generates an acid upon exposure; or (3) a resist composition in which the component (A) is a component which generates an acid upon exposure and which further contains the component (B).

That is, in the above-described cases (2) and (3), the component (A) becomes a "base material component which generates an acid upon exposure and in which its solubility in an organic solvent contained in an organic developing solution changes by the action of the acid". In that case, it is preferable that a component (A1) as described later is a high-molecular weight compound which generates an acid upon exposure and in which its solubility in an organic solvent contained in an organic developing solution decreases by the action of the acid. As such a high-molecular weight compound, a resin having a constituent unit which generates an acid upon exposure can be used. As the constituent unit which generates an acid upon exposure, known constituent units can be used.

The resist composition of the present invention is preferably the resist composition of the above-described case (1).

<<Component (A)>>

In the present invention, the term "base material component" refers to an organic compound having film forming ability, and an organic compound having a molecular weight of 500 or more is preferably used. In view of the fact that the molecular weight of the organic compound is 500 or more, the film forming ability is enhanced, and in addition thereto, a resist pattern of a nano-level order is easily formed.

The organic compound which is used as the base material component is roughly classified into a nonpolymer and a polymer.

As the nonpolymer, in general, a material having a molecular weight of 500 or more and less than 4,000 is used. Hereinafter, in the case of referring to the term "low-molecular weight compound", a nonpolymer having a molecular weight of 500 or more and less than 4,000 is meant.

As the polymer, in general, a material having a molecular weight of 1,000 or more is used. Hereinafter, in the case of referring to the term "resin" or "high-molecular weight compound", a polymer having a molecular weight of 1,000 or more is meant.

As the molecular weight of the polymer, a mass average molecular weight as converted into polystyrene by means of GPC (gel permeation chromatography) is adopted.

As the component (A) which is used for the resist composition of the present invention, at least the component (A1) is used, and other high-molecular weight compound and/or low-molecular weight compound may be used jointly together with the component (A1).

[Component (A1)]

The resist composition of the present invention contains a high-molecular weight compound having a constituent unit represented by the general formula (a0-1) (this constituent unit will be hereinafter referred to as "constituent unit (a0)") (this high-molecular weight compound will be hereinafter referred to as "component (A1)").

In the case of exposing the resist film formed by using the resist composition containing such a component (A1), in the constituent unit (a0), at least a part of the bond in the structure thereof is cleaved by the action of an acid, whereby the polarity increases. For this reason, the resist composition of the present invention becomes a negative type in the case where the developing solution is an organic developing solution (solvent development process), whereas it becomes a positive type in the case where the developing solution is an alkali developing solution (alkali development process). In the component (A1), the polarity changes before and after the exposure, and therefore, by using the component (A1), a satisfactory development contrast can be obtained in not only the alkali development process but the solvent development process.

Namely, in the case of applying the solvent development process, the component (A1) is highly soluble in an organic developing solution before the exposure, and when an acid is generated upon exposure, the polarity becomes high by the action of the acid, whereby the solubility in the organic developing solution decreases. For that reason, in the formation of a resist pattern, when a resist film obtained by coating the resist composition on a support is selectively exposed, exposed areas change from soluble properties to sparingly soluble properties in the organic developing solution, whereas unexposed areas do not change in the state where they are still soluble. Thus, by conducting the development with the organic developing solution, a contrast can be given between the exposed areas and the unexposed areas, and a negative type resist pattern can be formed.

(Constituent Unit (a0))

The constituent unit (a0) is a constituent unit represented by the following general formula (a0-1) and contains an acid decomposable group whose polarity increases by the action of an acid, in a side chain end thereof. In the constituent unit (a0), a bond between the oxy group (—O—) of the carbonyloxy group and the carbon atom of —C($R^1$)< may be cleaved by the action of an acid.

(Chemical formula 3)

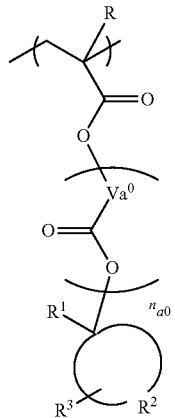

(a0-1)

In the formula, R represents a hydrogen atom, an alkyl group having 1 to 5 carbon atoms, or a halogenated alkyl group having 1 to 5 carbon atoms; $Va^0$ represents a divalent hydrocarbon group which may have an ether bond, a urethane bond, or an amide bond; $n_{a0}$ is an integer of 0 to 2; $R^1$ represents a chain or cyclic aliphatic hydrocarbon group; $R^2$ represents a group for forming a monocyclic group together with the carbon atom to which $R^1$ is bonded; and $R^3$ represents a cyclic group which may be have a substituent.

In the foregoing formula (a0-1), R represents a hydrogen atom, an alkyl group having 1 to 5 carbon atoms, or a halogenated alkyl group having 1 to 5 carbon atoms.

The alkyl group having 1 to 5 carbon atoms represented by R is preferably a linear or branched alkyl group having 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which a part or all of the hydrogen atoms of the above-described alkyl group having 1 to 5 carbon atoms are substituted with a halogen atom. Examples of the halogen atom include a fluorine atom, a chlorine atom, a bromine atom, and an iodine atom, with a fluorine atom being especially preferable.

R is preferably a hydrogen atom, an alkyl group having 1 to 5 carbon atoms, or a fluorinated alkyl group having 1 to 5 carbon atoms, and R is especially preferably a hydrogen atom or a methyl group from the viewpoint of easiness of availability in the industry.

In the foregoing formula (a0-1), $Va^0$ represents a divalent hydrocarbon group which may have an ether bond, a urethane bond, or an amide bond.

The divalent hydrocarbon group in $Va^0$ may be either an aliphatic hydrocarbon group or an aromatic hydrocarbon group.

The aliphatic hydrocarbon group as the divalent hydrocarbon group in $Va^0$ may be either saturated or unsaturated, and in general, it is preferably saturated.

More specifically, examples of the aliphatic hydrocarbon group include a linear or branched aliphatic hydrocarbon group and an aliphatic hydrocarbon group containing a ring in a structure thereof.

The carbon number of the linear or branched aliphatic hydrocarbon group is preferably 1 to 10, more preferably 1 to 6, still more preferably 1 to 4, and most preferably 1 to 3.

The linear aliphatic hydrocarbon group is preferably a linear alkylene group. Specifically, examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group. Specifically, examples thereof include an alkylalkylene group such as an alkylmethylene group, for example, —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an alkylethylene group, for example, —$CH(CH_3)CH_2$—, —$CH(CH_3)CH(CH_3)$—, —$C(CH_3)_2CH_2$—, —$CH(CH_2CH_3)CH_2$—, or —$C(CH_2CH_3)_2$—$CH_2$—; an alkyltrimethylene group, for example, —$CH(CH_3)CH_2CH_2$— or —$CH_2CH(CH_3)CH_2$—; and an alkyltetramethylene group, for example, —$CH(CH_3)CH_2CH_2CH_2$— or —$CH_2CH(CH_3)CH_2CH_2$—. The alkyl group in the alkylalkylene group is preferably a linear alkyl group having 1 to 5 carbon atoms.

Examples of the aliphatic hydrocarbon group containing a ring in a structure thereof include an alicyclic hydrocarbon group (a group in which two hydrogen atoms are eliminated from an aliphatic hydrocarbon ring); a group in which an alicyclic hydrocarbon group is bonded to an end of a linear or branched aliphatic hydrocarbon group; and a group in which an alicyclic hydrocarbon group intervenes on the way of a linear or branched aliphatic hydrocarbon group. Examples of the linear or branched aliphatic hydrocarbon group include the same groups as those described above.

The carbon number of the alicyclic hydrocarbon group is preferably 3 to 20, and more preferably 3 to 12.

The alicyclic hydrocarbon group may be either a polycyclic group or a monocyclic group. The monocyclic alicyclic hydrocarbon group is preferably a group in which two hydrogen atoms are eliminated from a monocycloalkane. The monocycloalkane is preferably one having 3 to 6 carbon atoms. Specifically, examples thereof include cyclopentane and cyclohexane. The polycyclic alicyclic hydrocarbon group is preferably a group in which two hydrogen atoms are eliminated from a polycycloalkane. The polycycloalkane is preferably one having 7 to 12 carbon atoms. Specifically, examples thereof include adamantane, norbornane, isobornane, tricyclodecane, and tetracyclododecane.

The aromatic hydrocarbon group as the divalent hydrocarbon group in $Va^0$ is a hydrocarbon group having an aromatic ring.

The carbon number of such an aromatic hydrocarbon group is preferably 3 to 30, more preferably 5 to 30, still more preferably 5 to 20, especially preferably 6 to 15, and most preferably 6 to 10. However, it is to be noted that the carbon number does not include the carbon number in the substituent.

Specifically, examples of the aromatic ring which the aromatic hydrocarbon group has include an aromatic hydrocarbon ring such as benzene, biphenyl, fluorene, naphthalene, anthracene, and phenanthrene; and an aromatic heterocyclic ring in which a part of the carbon atoms constituting the above-described aromatic hydrocarbon ring is substituted with a hetero atom. Examples of the hetero atom in the aromatic heterocyclic ring include an oxygen atom, a sulfur atom, and a nitrogen atom.

Specifically, examples of the aromatic hydrocarbon group include a group in which two hydrogen atoms are eliminated from the above-described aromatic hydrocarbon ring (an arylene group); and a group in which one of the hydrogen atoms of a group in which one hydrogen atom is eliminated from the above-described aromatic hydrocarbon ring (an aryl group) is substituted with an alkylene group (for example, a group in which one hydrogen atom is further eliminated from an aryl group in an arylalkyl group such as a benzyl group, a phenethyl group, a 1-naphthylmethyl group, a 2-naphthylmethyl group, a 1-naphthylethyl group, and a 2-naphthylethyl group). The carbon number of the above-described alkylene group (the alkyl chain in the arylalkyl group) is preferably 1 to 4, more preferably 1 to 2, and especially preferably 1.

In addition, examples of $Va^0$ include a group in which the above-described divalent hydrocarbon groups are bonded to each other via an ether bond, a urethane bond, or an amide bond; and a group having such a bond in a hydrocarbon chain.

In the foregoing formula (a0-1), $n_{a0}$ is an integer of 0 to 2, preferably 0 or 1, and more preferably 0.

In the foregoing formula (a0-1), $R^1$ is a chain or cyclic aliphatic hydrocarbon group.

The aliphatic hydrocarbon group in $R^1$ may be either a saturated aliphatic hydrocarbon group or an unsaturated aliphatic hydrocarbon group and is preferably a saturated aliphatic hydrocarbon group.

The chain aliphatic hydrocarbon group in $R^1$ is preferably a chain alkyl group, and it may be either a linear alkyl group or a branched alkyl group.

The carbon number of the linear alkyl group is preferably 1 to 5, more preferably 1 to 4, and still more preferably 1 or 2. Specifically, examples of the linear alkyl group include a methyl group, an ethyl group, an n-propyl group, an n-butyl group, and an n-pentyl group. Of these, a methyl group, an ethyl group, or an n-butyl group is preferable, a methyl group or an ethyl group is more preferable, and an ethyl group is especially preferable.

The carbon number of the branched alkyl group is preferably 3 to 10, and more preferably 3 to 5. Specifically, examples of the branched alkyl group include an isopropyl group, an isobutyl group, a tert-butyl group, an isopentyl group, a neopentyl group, a 1,1-diethylpropyl group, and a 2,2-dimethylbutyl group, with an isopropyl group being preferable.

The cyclic aliphatic hydrocarbon group in $R^1$ may be either a polycyclic group or a monocyclic group.

The monocyclic aliphatic hydrocarbon group is preferably a group in which one hydrogen atom is eliminated from a monocycloalkane. The monocycloalkane is preferably one having 3 to 6 carbon atoms, and specifically, examples thereof include cyclopentane and cyclohexane, with cyclopentane being especially preferable.

The polycyclic aliphatic hydrocarbon group is preferably a group in which one hydrogen atom is eliminated from a polycycloalkane. The polycycloalkane is preferably one having 7 to 12 carbon atoms, and specifically, examples thereof include adamantane, norbornane, isobornane, tricyclodecane, and tetracyclododecane.

Of the foregoing, $R^1$ is preferably a chain aliphatic hydrocarbon group, and more preferably a linear alkyl group.

In the foregoing formula (a0-1), $R^2$ is a group for forming a monocyclic group together with the carbon atom to which $R^1$ is bonded. Examples of the monocyclic group which $R^2$ may form include a monocyclic aliphatic hydrocarbon group.

The monocyclic aliphatic hydrocarbon group which $R^2$ may form is preferably a group in which one hydrogen atom is eliminated from a monocycloalkane. The monocycloalkane is preferably one having 3 to 6 carbon atoms, and specifically, examples thereof include cyclopentane and cyclohexane. Of these, cyclopentane and cyclohexane are more preferable, with cyclopentane being especially preferable. In addition, in this monocyclic aliphatic hydrocarbon group, a part of the carbon atoms constituting the ring may be substituted with a hetero atom (e.g., an oxygen atom, a sulfur atom, or a nitrogen atom).

In the foregoing formula (a0-1), $R^3$ is a cyclic group which may have a substituent.

The cyclic group in $R^3$ may be either an aliphatic hydrocarbon group or an aromatic hydrocarbon group, and it may be either a polycyclic group or a monocyclic group.

The monocyclic aliphatic hydrocarbon group is preferably a group in which one hydrogen atom is eliminated from a monocycloalkane. The monocycloalkane is preferably one having 3 to 6 carbon atoms, and specifically, examples thereof include cyclopentane and cyclohexane, with cyclopentane being especially preferable.

The polycyclic aliphatic hydrocarbon group is preferably a group in which one hydrogen atom is eliminated from a polycycloalkane. The polycycloalkane is preferably one having 7 to 12 carbon atoms, and specifically, examples thereof include adamantane, norbornane, isobornane, tricyclodecane, and tetracyclododecane.

In the case where the cyclic group in $R^3$ is an aromatic hydrocarbon group, the aromatic hydrocarbon group is a hydrocarbon group having at least one aromatic ring.

This aromatic ring is not particularly limited so long as it is a cyclic conjugated system having π electrons in the number of (4n+2), and it may be either monocyclic or polycyclic. The carbon number of the aromatic ring is preferably 5 to 30, more preferably 5 to 20, still more preferably 6 to 15, and especially preferably 6 to 12. Specifically, examples of the aromatic ring include an aromatic hydrocarbon ring such as benzene, naphthalene, anthracene, and phenanthrene; and an aromatic heterocyclic ring in which a part of the carbon atoms constituting this aromatic hydrocarbon ring is substituted with a hetero atom. Examples of the hetero atom in the aromatic heterocyclic ring include an oxygen atom, a sulfur atom, and a nitrogen atom. Specifically, examples of the aromatic heterocyclic ring include a pyridine ring and a thiophene ring.

Specifically, examples of the aromatic hydrocarbon group in $R^3$ include a group in which one hydrogen atom is eliminated from the above-described aromatic hydrocarbon ring or aromatic heterocyclic ring (an aryl group or a heteroaryl group); a group in which one hydrogen atom is eliminated from an aromatic compound containing two or more aromatic rings (for example, biphenyl or fluorene); and a group in which one of the hydrogen atoms of the above-described aromatic hydrocarbon ring or aromatic heterocyclic ring is substituted with an alkylene group (for example, an arylalkyl group such as a benzyl group, a phenethyl group, a 1-naphthylmethyl group, a 2-naphthylmethyl group, a 1-naphthylethyl group, and a 2-naphthylethyl group). The carbon number of the alkylene group bonded to the above-described aromatic hydrocarbon ring or aromatic heterocyclic ring is preferably 1 to 4, more preferably 1 to 2, and especially preferably 1.

In $R^3$, the terms "may have a substituent" mean that a part or all of the hydrogen atoms in the above-described cyclic group may be substituted with a substituent (other atom or group than a hydrogen atom).

The number of substituents in $R^3$ may be one, or it may be two or more.

Examples of the substituent include a halogen atom, a hetero atom, an alkyl group, an ester bond, and an oxo group (=O).

Examples of the halogen atom as the substituent include a fluorine atom, a chlorine atom, a bromine atom, and an iodine atom, with a fluorine atom being preferable.

Examples of the hetero atom as the substituent include an oxygen atom, a nitrogen atom, and a sulfur atom.

The alkyl group as the substituent is preferably an alkyl group having 1 to 6 carbon atoms. The alkyl group is preferably linear or branched. Specifically, examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Of these, a methyl group or an ethyl group is preferable, and a methyl group is especially preferable.

Examples of the ester bond as the substituent (the case where the methylene group (—$CH_2$—) is substituted with a divalent group) include —C(=O)—O—, —O—C(=O)—, —O—S(=O)$_2$—, and —S(=O)$_2$—O—.

Of the foregoing, $R^3$ is preferably an alicyclic group (monocyclic or polycyclic aliphatic hydrocarbon group), and more preferably a monocyclic aliphatic hydrocarbon group.

In addition, the binding position of $R^3$ in the monocyclic group which $R^2$ may form is not particularly limited, and in view of the fact that the effects of the present invention are more enhanced, it is preferable that $R^3$ is bonded to the carbon atom that forms a bond to the carbon atom to which $R^1$ is bonded (the constituent unit represented by the general formula (a0-1) in that case is described below).

[Chemical formula 4]

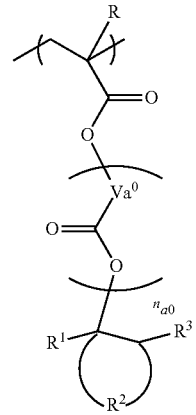

In the formula, R, $R^1$, $R^2$, $R^3$, and $n_{a0}$ are the same as R, $R^1$, $R^2$, $R^3$, and $n_{a0}$ in the foregoing general formula (a0-1), respectively.

Specific examples of the constituent unit (a0) are given below. In each of the following formulae, $R^\alpha$ represents a hydrogen atom, a methyl group, or a trifluoromethyl group.

[Chemical formula 5]

(a0-1-1)

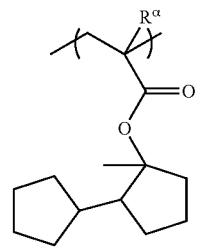

-continued (a0-1-2)
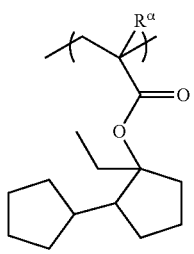

(a0-1-3)
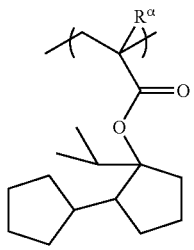

(a0-1-4)
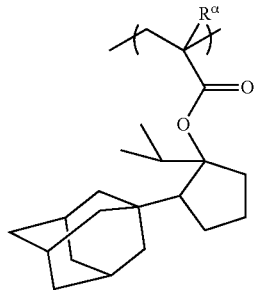

(a0-1-5)
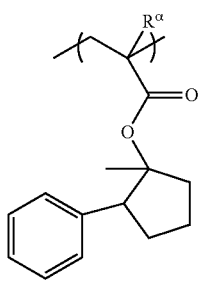

Of the foregoing, the constituent unit (a0) is preferably at least one member selected from the group consisting of the constituent units represented by the chemical formulae (a0-1-1) to (a0-1-5), respectively; more preferably at least one member selected from the group consisting of the constituent units represented by the chemical formulae (a0-1-1) to (a0-1-4), respectively; still more preferably at least one member selected from the group consisting of the constituent units represented by the chemical formulae (a0-1-1) to (a0-1-3), respectively; and especially preferably at least one member selected from the group consisting of the constituent unit represented by the chemical formula (a0-1-1) and the constituent unit represented by the chemical formula (a0-1-2).

The constituent unit (a0) which the component (A1) has may be either one kind or two or more kinds.

A proportion of the constituent unit (a0) is preferably 20 to 80 mol %, more preferably 30 to 70 mol %, still more preferably 40 to 60 mol %, and especially preferably 40 to 50 mol % relative to a total sum of all of the constituent units constituting the component (A1).

When the proportion of the constituent unit (a0) is the preferred lower limit value or more, on the occasion of con- templating to form a finer pattern (for example, a trench pattern or a fine and high-density contact hole pattern), a pattern with high resolution is easily obtained. In addition thereto, a process margin is easily ensured. On the other hand, when the proportion of the constituent unit (a0) is the preferred upper limit value or less, a balance with other constituent units is easily taken, and in the formed resist pattern, lithography properties are excellent, and a satisfactory shape is easily obtained.

(Other Constituent Units)

The component (A1) may further have, in addition to the constituent unit (a0), other constituent units.

The other constituent units are not particularly limited so long as they are a constituent unit which is not classified into the above-described constituent unit (a0). A large number of constituent units which have been conventionally known to be used for resins for the use of resist, such as those for ArF excimer lasers and KrF excimer lasers (preferably those for ArF excimer lasers), can be used. Examples thereof include constituent units (a1) to (a4) described below and the constituent unit which generates an acid upon exposure.

Constituent Unit (a1):

The constituent unit (a1) is a constituent unit containing an acid decomposable group whose polarity increases by the action of an acid, other than the constituent unit (a0).

The "acid decomposable group" is a group having acid decomposability such that at least a part of the bond in a structure of the acid decomposable group may be cleaved by the action of an acid.

Examples of the acid decomposable group whose polarity increases by the action of an acid include a group which is decomposed by the action of an acid to form a polar group.

Examples of the polar group include a carboxy group, a hydroxyl group, an amino group, and a sulfo group ($—SO_3H$). Of these, a polar group containing —OH in a structure thereof (hereinafter sometimes referred to as "OH-containing polar group") is preferable, a carboxy group or a hydroxyl group is more preferable, and a carboxy group is especially preferable.

More specifically, examples of the acid decomposable group include a group in which the above-described polar group is protected by an acid dissociable group (for example, a group in which the hydrogen atom of the OH-containing polar group is protected by an acid dissociable group).

Here, the term "acid dissociable group" refers to either one or both of the following groups.

(i) A group having such acid dissociation properties that the bond between the acid dissociable group and the atom adjacent to the acid dissociable group may be cleaved by the action of an acid.

(ii) A group in which after a part of the bond is cleaved by the action of an acid, a decarboxylation reaction is further caused, whereby the bond between the acid dissociable group and the atom adjacent to the acid dissociable group may be cleaved.

It is necessary that the acid dissociable group constituting the acid decomposable group is a group with lower polarity than a polar group formed upon dissociation of the acid dissociable group. According to this, on the occasion of dissociation of the acid dissociable group by the action of an acid, a polar group having higher polarity than the acid dissociable group is formed, whereby the polarity increases. As a result, the polarity of the whole of the component (A1) increases. When the polarity increases, the solubility in a developing solution relatively changes, and in the case where the developing solution is an organic developing solution, the solubility decreases.

The acid dissociable group is not particularly limited, and those which have been so far proposed as the acid dissociable group of a base resin for a chemically amplified resist can be used.

Examples of the acid dissociable group that protects a carboxy group or a hydroxyl group among the above-described polar groups include an acid dissociable group represented by the following general formula (a1-r-1) (hereinafter sometimes referred to as "acetal type acid dissociable group" for the sake of convenience).

(Chemical formula 6)

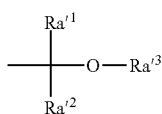

(a1-r-1)

In the formula, each of $Ra'^1$ and $Ra'^2$ represents a hydrogen atom or an alkyl group; $Ra'^3$ represents a hydrocarbon group; and $Ra'^3$ may be bonded to any one of $Ra'^1$ and $Ra'^2$ to form a ring.

In the formula (a1-r-1), examples of the alkyl group represented by $Ra'^1$ and $Ra'^2$ include the same alkyl groups as those exemplified as the substituent which may be bonded to the carbon atom at the α-position in the explanation with respect to the above-described α-substituted acrylic ester. Of these, a methyl group or an ethyl group is preferable, with a methyl group being the most preferable.

The hydrocarbon group represented by $Ra'^3$ is preferably an alkyl group having 1 to 20 carbon atoms, and more preferably an alkyl group having 1 to 10 carbon atoms. Of these, a linear or branched alkyl group is preferable. Specifically, examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group, and a 2,2-dimethylbutyl group.

In the case where $Ra'^3$ is a cyclic hydrocarbon group, the hydrocarbon group may be either an aliphatic hydrocarbon group or an aromatic hydrocarbon group, and it may be either a polycyclic group or a monocyclic group. The monocyclic alicyclic hydrocarbon group is preferably a group in which one hydrogen atom is eliminated from a monocycloalkane. The monocycloalkane is preferably one having 3 to 8 carbon atoms, and specifically, examples thereof include cyclopentane, cyclohexane, and cyclooctane. The polycyclic alicyclic hydrocarbon group is preferably a group in which one hydrogen atom is eliminated from a polycycloalkane. The polycycloalkane is preferably one having 7 to 12 carbon atoms, and specifically, examples thereof include adamantane, norbornane, isobornane, tricyclodecane, and tetracyclododecane.

In the case where $Ra'^3$ is an aromatic hydrocarbon group, specifically, examples of the aromatic ring to be contained include an aromatic hydrocarbon ring such as benzene, biphenyl, fluorene, naphthalene, anthracene, and phenanthrene; and an aromatic heterocyclic ring in which a part of the carbon atoms constituting the above-described aromatic hydrocarbon ring is substituted with a hetero atom. Examples of the hetero atom in the aromatic heterocyclic ring include an oxygen atom, a sulfur atom, and a nitrogen atom.

Specifically, examples of the aromatic hydrocarbon group include a group in which one hydrogen atom is eliminated from the above-described aromatic hydrocarbon ring (an aryl group); and a group in which one of the hydrogen atoms of the above-described aryl group is substituted with an alkylene group (for example, an arylalkyl group such as a benzyl group, a phenethyl group, a 1-naphthylmethyl group, a 2-naphthylmethyl group, a 1-naphthylethyl group, and a 2-naphthylethyl group). The carbon number of the above-described alkylene group (an alkyl chain in the arylalkyl group) is preferably 1 to 4, more preferably 1 to 2, and especially preferably 1.

In the case where $Ra'^3$ is bonded to any one of $Ra'^1$ and $Ra'^2$ to form a ring, the cyclic group is preferably a 4-membered to 7-membered ring, and more preferably a 4-membered to 6-membered ring. Specific examples of the cyclic group include a tetrahydropyranyl group and a tetrahydrofuranyl group.

Examples of the acid dissociable group that protects a carboxyl group among the above-described polar groups include an acid dissociable group represented by the following general formula (a1-r-2) (among the acid dissociable groups represented by the following formula (a1-r-2), a group constituted of an alkyl group is hereinafter sometimes referred to as a "tertiary alkyl ester type acid dissociable group" for the sake of convenience).

(Chemical formula 7)

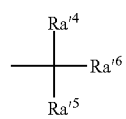

(a1-r-2)

In the formula, each of $Ra'^4$ to $Ra'^6$ represents a hydrocarbon group, and $Ra'^5$ and $Ra'^6$ may be bonded to each other to form a ring.

Examples of the hydrocarbon group represented by $Ra'^4$ to $Ra'^6$ include the same hydrocarbon groups as those exemplified above for $Ra'^3$. $Ra'^4$ is preferably an alkyl group having 1 to 5 carbon atoms. In the case where $Ra'^5$ and $Ra'^6$ are bonded to each other to form a ring, a group represented by the following general formula (a1-r2-1) is exemplified.

On the other hand, in the case where $Ra'^4$ to $Ra'^6$ are not bonded to each other and are each an independent hydrocarbon group, a group represented by the following general formula (a1-r2-2) is exemplified.

(Chemical formula 8)

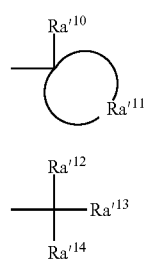

(a1-r2-1)

(a1-r2-2)

In the formulae, $Ra'^{10}$ represents an alkyl group having 1 to 10 carbon atoms; $Ra'^{11}$ represents a group for forming an aliphatic cyclic group together with the carbon atom to which $Ra'^{10}$ is bonded; and each of $Ra'^{12}$ to $Ra'^{14}$ independently represents a hydrocarbon group.

In the formula (a1-r2-1), the alkyl group having 1 to 10 carbon atoms represented by $Ra'^{10}$ is preferably the group exemplified as the linear or branched alkyl group represented by $Ra'^3$ in the formula (a1-r-1). In the formula (a1-r2-1), the aliphatic cyclic group constituted by $Ra'^{11}$ is preferably the group exemplified as the cyclic alkyl group represented by $Ra'^3$ in the formula (a1-r-1).

In the formula (a1-r2-2), it is preferable that each of $Ra'^{12}$ and $Ra'^{14}$ is independently an alkyl group having 1 to 10 carbon atoms. The alkyl group is more preferably the group exemplified as the linear or branched alkyl group represented by $Ra'^3$ in the formula (a1-r-1), still more preferably a linear alkyl group having 1 to 5 carbon atoms, and especially preferably a methyl group or an ethyl group.

In the formula (a1-r2-2), $Ra'^{13}$ is preferably the linear, branched or cyclic alkyl group exemplified as the hydrocarbon group represented by $Ra'^3$ in the formula (a1-r-1). Of these, $Ra'^{13}$ is more preferably the group exemplified as the cyclic alkyl group represented by $Ra'^3$.

Specific examples of the group represented by the foregoing formula (a1-r2-1) are given below. In the following formulae, the symbol * represents a bond (hereinafter the same).

(Chemical formula 9)

(r-pr-m1)

(r-pr-m2)

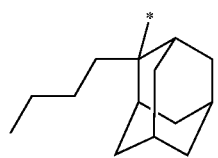
(r-pr-m3)

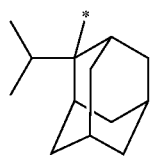
(r-pr-m4)

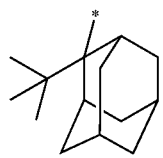
(r-pr-m5)

(r-pr-m6)

-continued

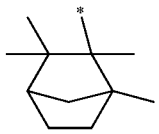
(r-pr-m7)

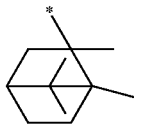
(r-pr-m8)

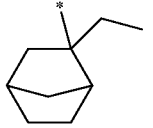
(r-pr-m9)

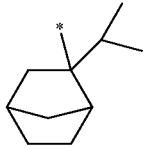
(r-pr-m10)

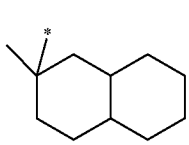
(r-pr-m11)

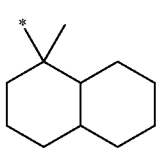
(r-pr-m12)

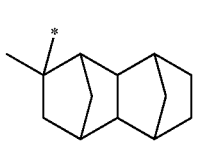
(r-pr-m13)

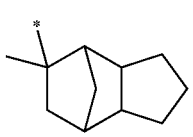
(r-pr-m14)

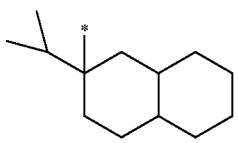
(r-pr-m15)

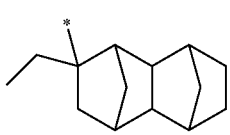
(r-pr-m16)

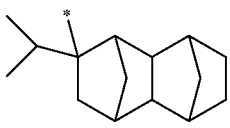
(r-pr-m17)

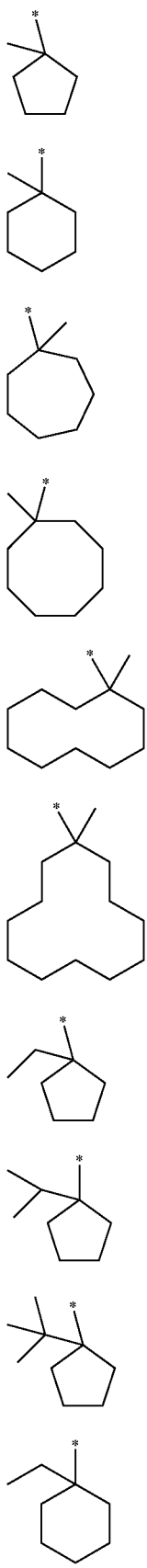
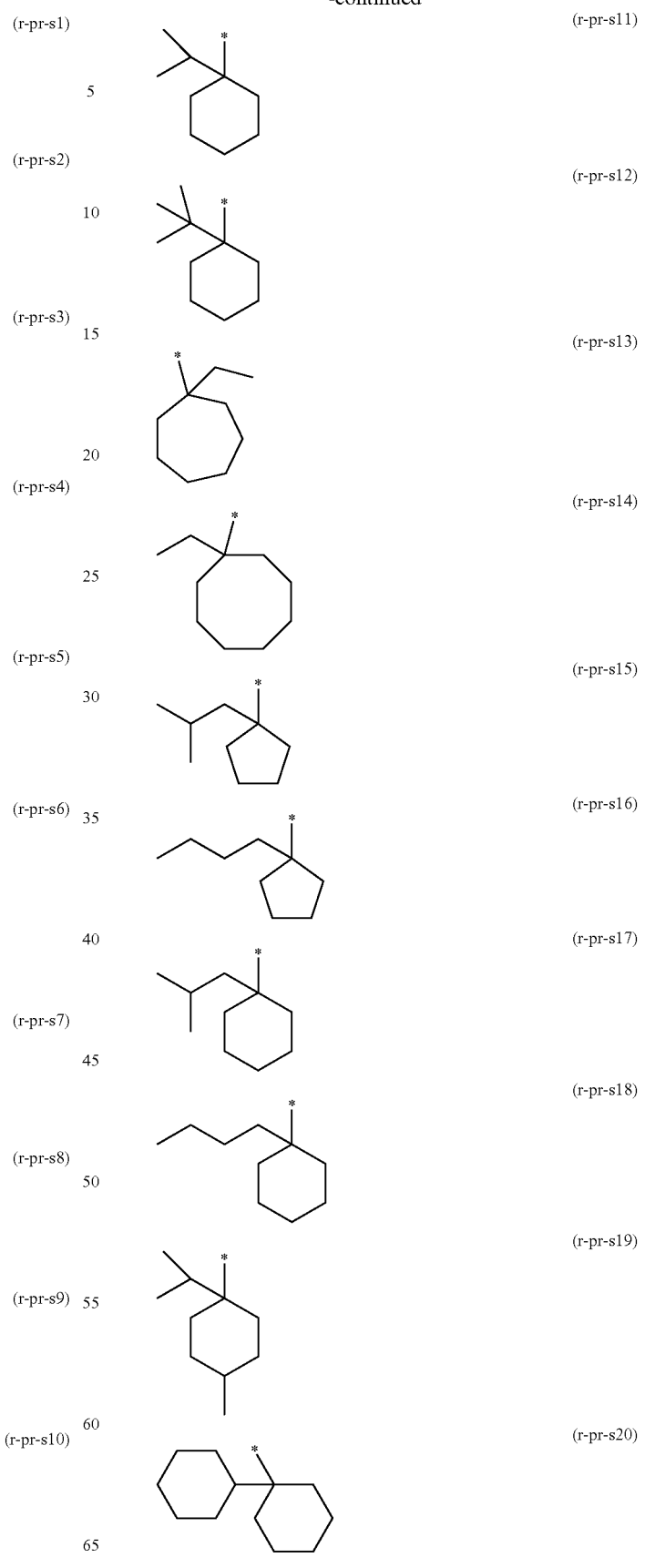

Specific examples of the group represented by the foregoing formula (a1-r2-2) are given below.
(Chemical formula 10)
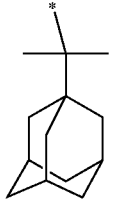
(r-pr-cm1)
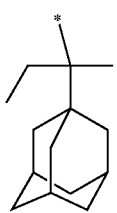
(r-pr-cm2)
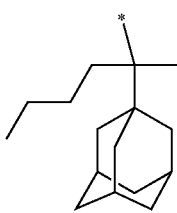
(r-pr-cm3)
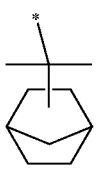
(r-pr-cm4)
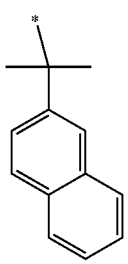
(r-pr-cm5)
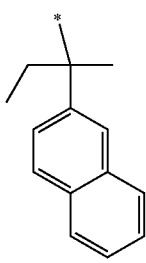
(r-pr-cm6)
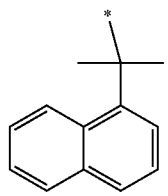
(r-pr-cm7)
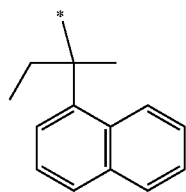
(r-pr-cm8)
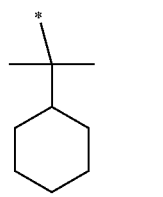
(r-pr-cs1)
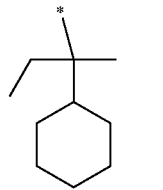
(r-pr-cs2)
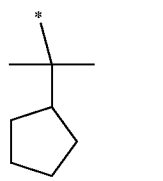
(r-pr-cs3)
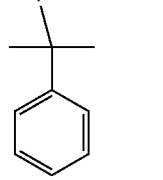
(r-pr-cs4)
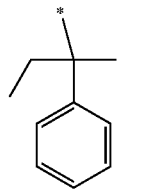
(r-pr-cs5)
(r-pr-c1)

-continued

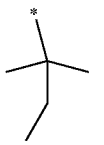 (r-pr-c2)

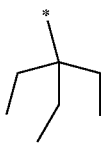 (r-pr-c3)

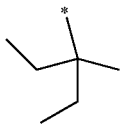 (r-pr-c4)

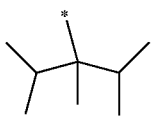 (r-pr-c5)

In addition, examples of the acid dissociable group that protects a hydroxyl group among the above-described polar groups include an acid dissociable group represented by the following general formula (a1-r-3) (hereinafter sometimes referred to as "tertiary alkyloxycarbonyl acid dissociable group" for the sake of convenience).

(Chemical formula 11)

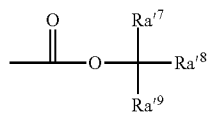 (a1-r-3)

In the formula, each of $Ra'^7$ to $Ra'^9$ represents an alkyl group.

In the formula (a1-r-3), each of $Ra'^7$ to $Ra'^9$ is preferably an alkyl group having 1 to 5 carbon atoms, and more preferably an alkyl group having 1 to 3 carbon atoms.

In addition, the carbon number of a total sum of the respective alkyl groups is preferably 3 to 7, more preferably 3 to 5, and most preferably 3 to 4.

Examples of the constituent unit (a1) include a constituent unit derived from an acrylic ester in which the hydrogen atom bonded to the carbon atom at the α-position may be substituted with a substituent, the constituent unit containing an acid decomposable group whose polarity increases by the action of an acid; a constituent unit in which at least a part of hydrogen atoms of hydroxyl groups of a constituent unit derived from hydroxystyrene or a hydroxystyrene derivative is protected by a substituent containing the above-described acid decomposable group; and a constituent unit in which at least a part of hydrogen atoms in —C(═O)—OH of the constituent unit derived from vinylbenzoic acid or a vinylbenzoic acid derivative is protected by a substituent containing the above-described acid decomposable group.

Of the foregoing, the constituent unit (a1) is preferably a constituent unit derived from an acrylic ester in which the hydrogen atom bonded to the carbon atom at the α-position may be substituted with a substituent.

The constituent unit (a1) is preferably a constituent unit represented by any one of the following general formulae (a1-1) to (a1-3).

(Chemical formula 12)

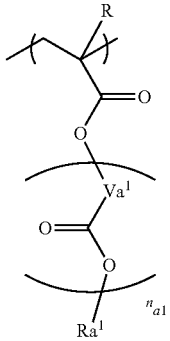 (a1-1)

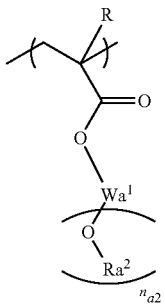 (a1-2)

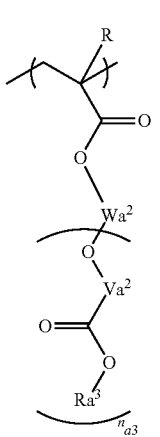 (a1-3)

In the formulae, R represents a hydrogen atom, an alkyl group having 1 to 5 carbon atoms, or a halogenated alkyl group having 1 to 5 carbon atoms; $Va^1$ represents a divalent hydrocarbon group which may have an ether bond, a urethane bond, or an amide bond; $n_{a1}$ is an integer of 0 to 2; $Ra^1$ represents the acid dissociable group represented by the foregoing formula (a1-r-1) or (a1-r-2); $Wa^1$ represents an ($n_{a2}$+1)-valent hydrocarbon group; $n_{a2}$ is an integer of 1 to 3; $Ra^2$ represents the acid dissociable group represented by the foregoing formula (a1-r-1) or (a1-r-3); $Wa^2$ represents an ($n_{a3}$+1)-valent hydrocarbon group; $n_{a3}$ is an integer of 1 to 3; $Va^2$ represents a divalent hydrocarbon group which may have an ether bond, a urethane bond, or an amide bond; and $Ra^3$ represents the acid dissociable group represented by the foregoing formula (a1-r-1) or (a1-r-2).

In the foregoing general formulae (a1-1) to (a1-3), the alkyl group having 1 to 5 carbon atoms in R is preferably a linear or branched alkyl group having 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms in R is a group in which a part or all of the hydrogen atoms of the above-described alkyl group having 1 to 5 carbon atoms are substituted with a halogen atom. Examples of the halogen atom include a fluorine atom, a chlorine atom, a bromine atom, and an iodine atom, with a fluorine atom being especially preferable.

R is preferably a hydrogen atom, an alkyl group having 1 to 5 carbon atoms, or a fluorinated alkyl group having 1 to 5 carbon atoms, and R is most preferably a hydrogen atom or a methyl group from the viewpoint of easiness of availability in the industry.

In the foregoing formula (a1-1), examples of $Va^1$ include the same groups as those for $Va^0$ in the foregoing formula (a0-1).

In the foregoing formula (a1-1), $n_{a1}$ is an integer of 0 to 2, preferably 0 or 1, and more preferably 0.

In the foregoing formula (a1-2), the ($n_{a2}$+1)-valent hydrocarbon group in $Wa^1$ may be either an aliphatic hydrocarbon group or an aromatic hydrocarbon group. The aliphatic hydrocarbon group means a hydrocarbon group having no aromaticity. The aliphatic hydrocarbon group may be either saturated or unsaturated, and in general, it is preferably saturated. Examples of the aliphatic hydrocarbon group include a linear or branched aliphatic hydrocarbon group, an aliphatic hydrocarbon group containing a ring in a structure thereof, and a group in which a linear or branched aliphatic hydrocarbon group and an aliphatic hydrocarbon group containing a ring in a structure thereof are combined. Specifically, examples thereof include the same groups as those for $Va^0$ in the foregoing formula (a0-1).

The valence of ($n_{a2}$+1) is preferably divalent to tetravalent, and more preferably divalent or trivalent.

In the foregoing formula (a1-3), the ($n_{a3}$+1)-valent hydrocarbon group in $Wa^2$ may be either an aliphatic hydrocarbon group or an aromatic hydrocarbon group. The aliphatic hydrocarbon group means a hydrocarbon group having no aromaticity. The aliphatic hydrocarbon group may be either saturated or unsaturated, and in general, it is preferably saturated. Examples of the aliphatic hydrocarbon group include a linear or branched aliphatic hydrocarbon group, an aliphatic hydrocarbon group containing a ring in a structure thereof, and a group in which a linear or branched aliphatic hydrocarbon group and an aliphatic hydrocarbon group containing a ring in a structure thereof are combined. Specifically, examples thereof include the same groups as those for $Va^0$ in the foregoing formula (a0-1).

The valence of ($n_{a3}$+1) is preferably divalent to tetravalent, and more preferably divalent or trivalent.

In the foregoing formula (a1-3), examples of $Va^2$ include the same groups as those for $Va^0$ in the formula (a0-1).

As the foregoing formula (a1-2), a constituent unit represented by the following general formula (a1-2-01) is especially preferable.

(Chemical formula 13)

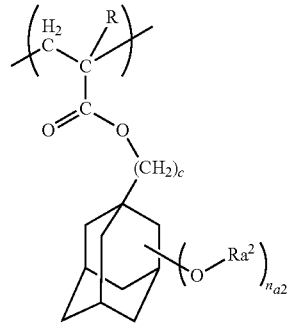

(a1-2-01)

In the formula (a1-2-01), $Ra^2$ is the acid dissociable group represented by the foregoing formula (a1-r-1) or (a1-r-3); $n_{a2}$ is an integer of 1 to 3, preferably 1 or 2, and more preferably 1; c is an integer of 0 to 3, preferably 0 or 1, and more preferably 1; and R is the same as that described above.

Specific examples of the constituent unit represented by each of the foregoing formulae (a1-1) and (a1-2) are given below. In each of the following formulae, $R^\alpha$ represents a hydrogen atom, a methyl group, or a trifluoromethyl group.

(Chemical formula 14)

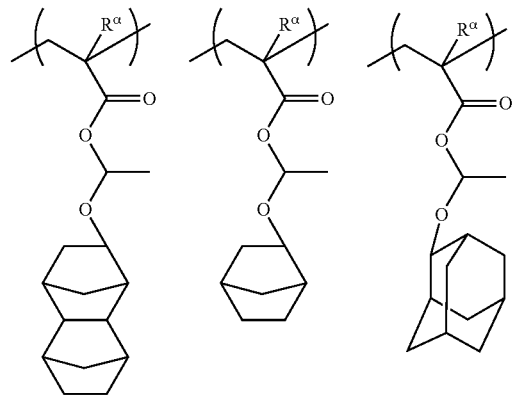

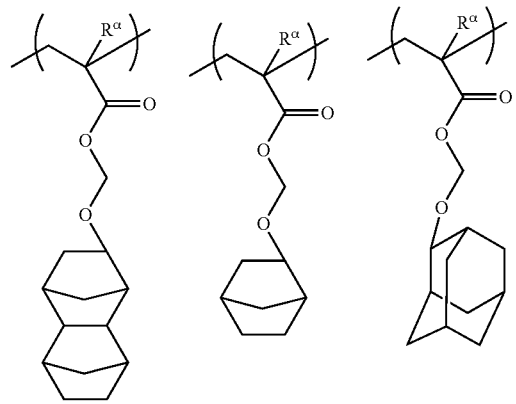

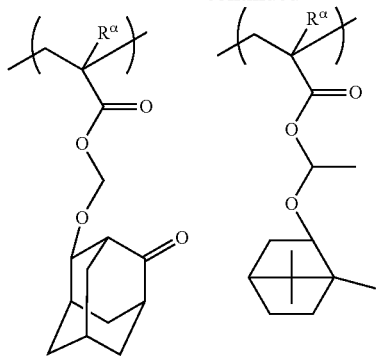
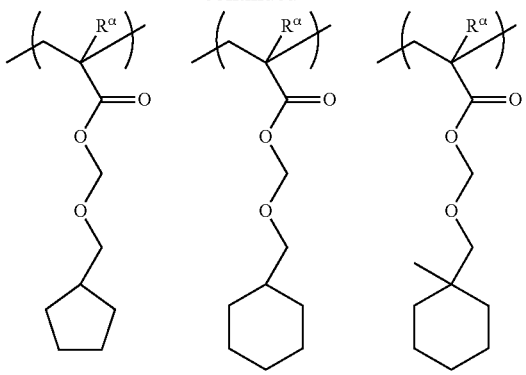
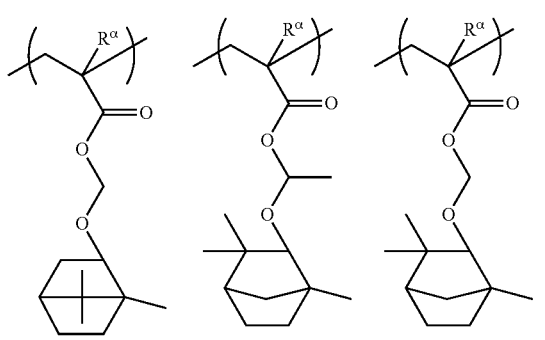
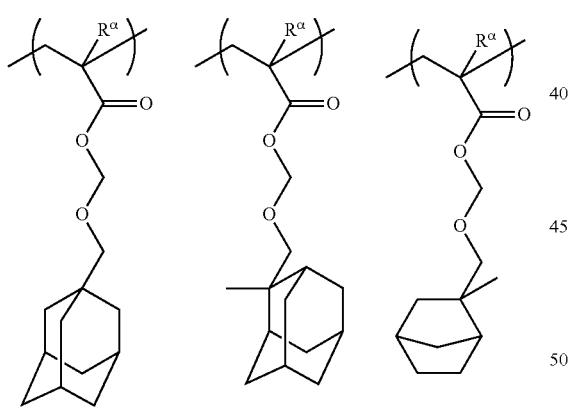
(Chemical formula 15)
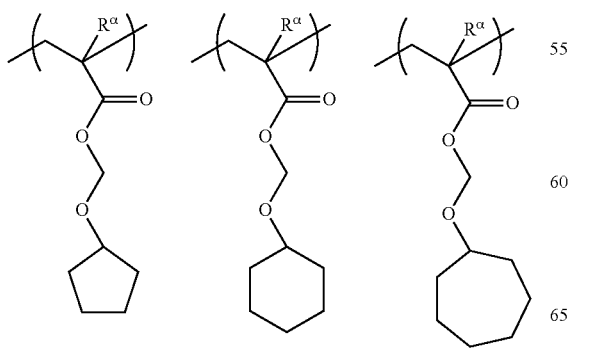
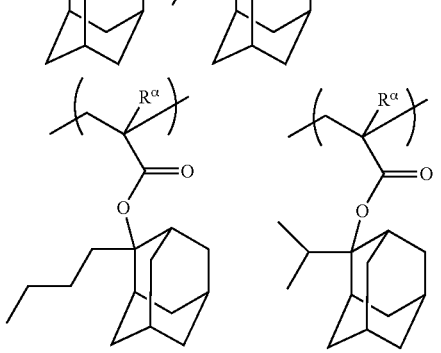
(Chemical formula 16)

35
-continued
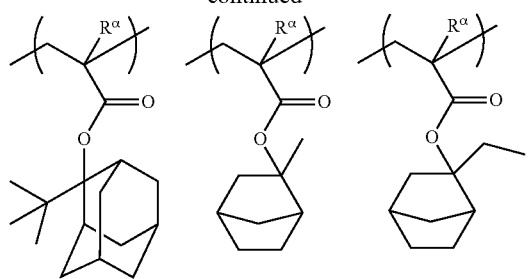
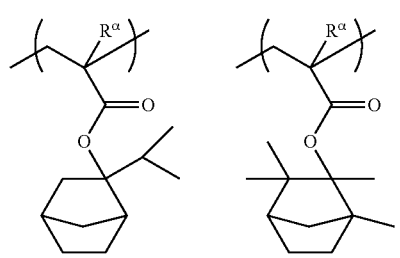
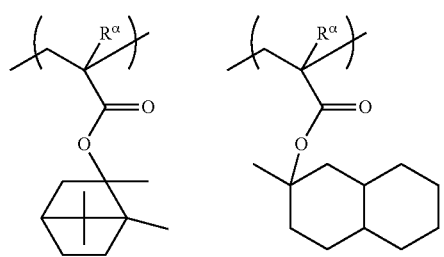
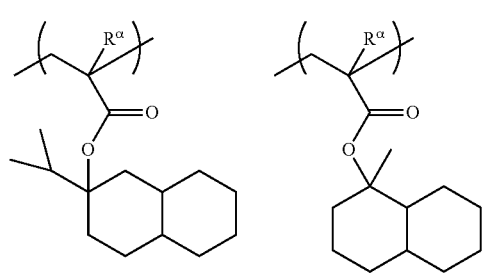
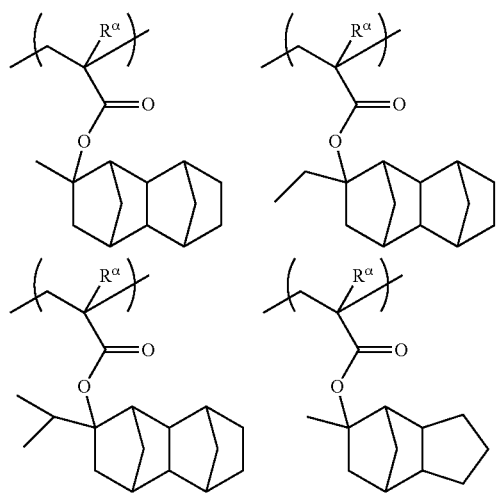
36
-continued
(Chemical formula 17)
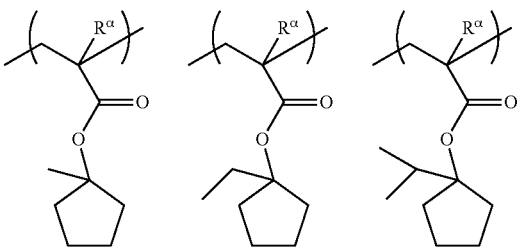
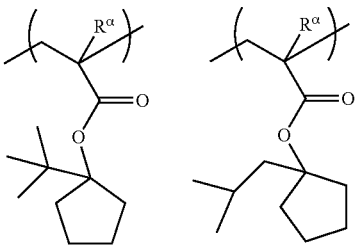
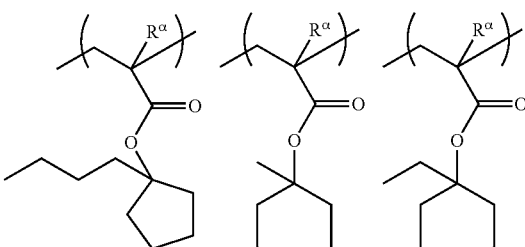
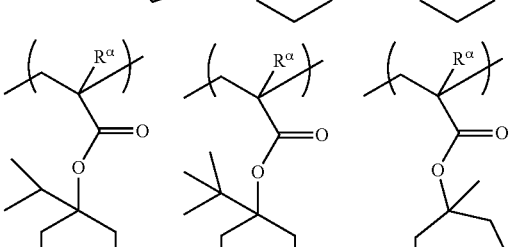
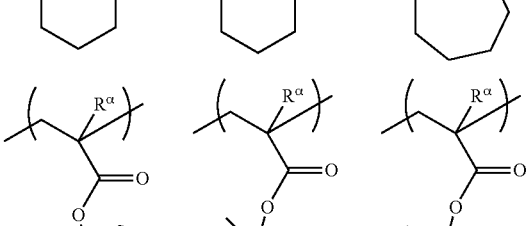
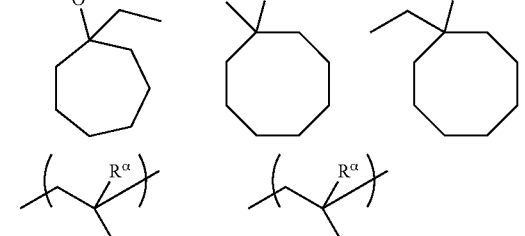
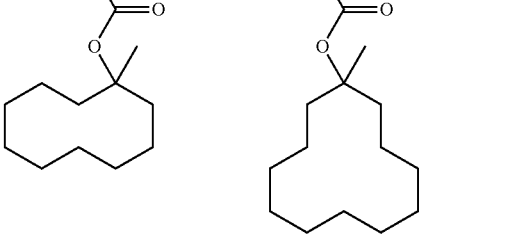

(Chemical formula 18)
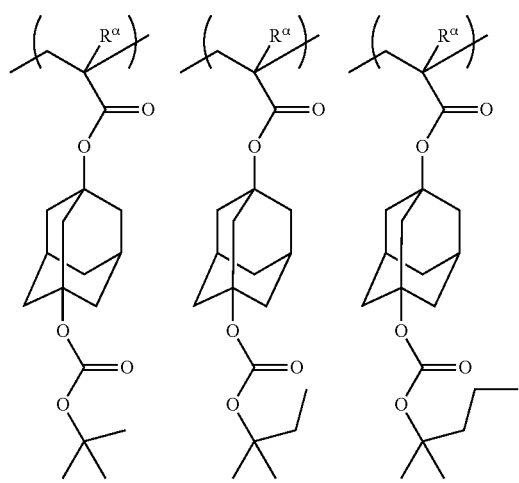
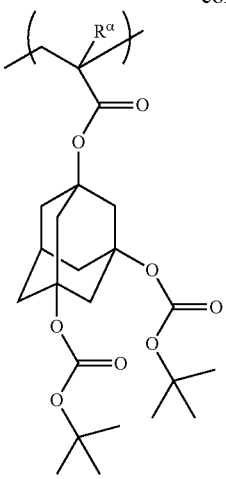
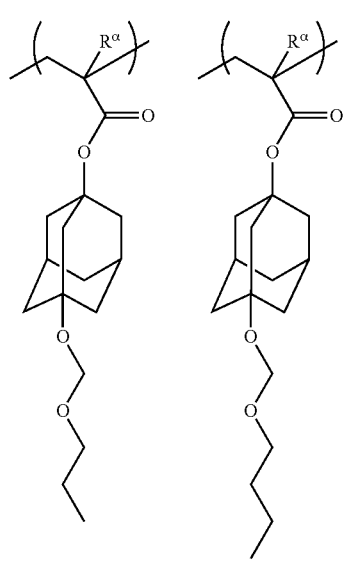
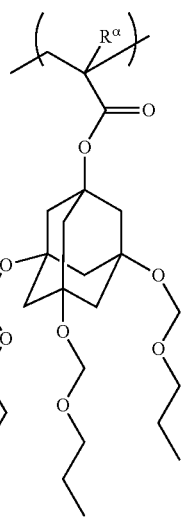
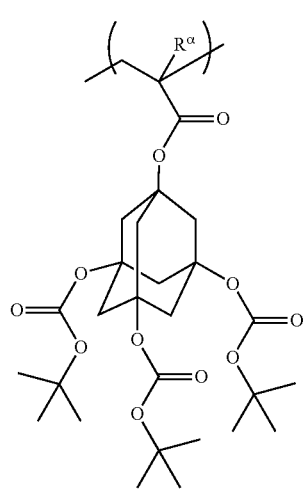
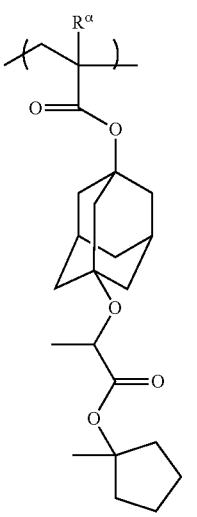 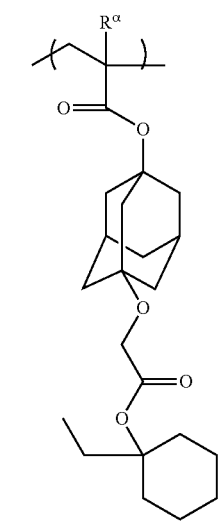

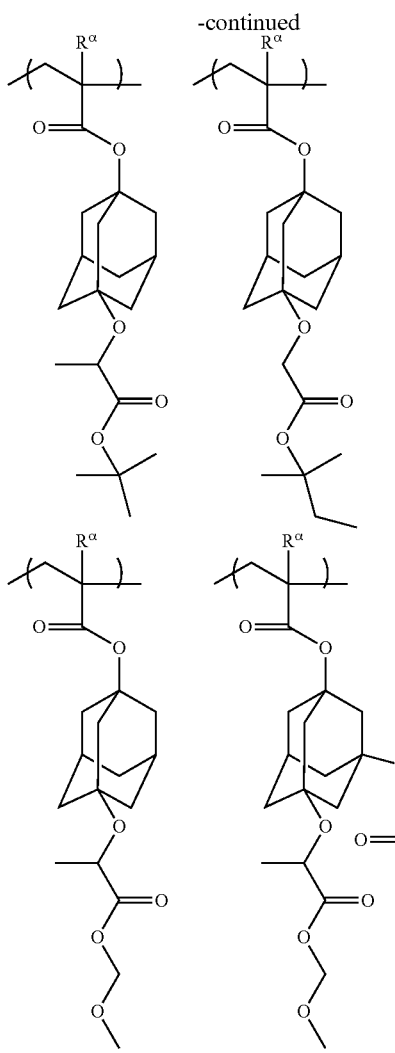

The constituent unit (a1) which the component (A1) has may be either one kind or two or more kinds.

A proportion of the constituent unit (a1) in the component (A1) is preferably 20 to 80 mol %, more preferably 20 to 75 mol %, and still more preferably 25 to 70 mol % relative to all of the constituent units constituting the component (A1). When the proportion of the constituent unit (a1) is the lower limit value or more, lithography properties such as sensitivity, resolution, and LWR are enhanced, too. On the other hand, when the proportion of the constituent unit (a1) is the upper limit value or less, a balance with other constituent units can be easily taken.

Constituent Unit (a2):

The constituent unit (a2) is a constituent unit containing a lactone-containing cyclic group, an —$SO_2$—-containing cyclic group, or a carbonate-containing cyclic group.

In the case of using the component (A1) for the formation of a resist film, the lactone-containing cyclic group, —$SO_2$—-containing cyclic group, or carbonate-containing cyclic group of the constituent unit (a2) is effective for increasing the adhesion of the resist film to a substrate.

It is to be noted that in the case where the above-described constituent unit (a0) or constituent unit (a1) is a constituent unit containing a lactone-containing cyclic group, an —$SO_2$—-containing cyclic group, or a carbonate-containing cyclic group in a structure thereof, the subject constituent unit falls under the definition of the constituent unit (a2), too; however, it is to be noted that such a constituent unit falls under the definition of the constituent unit (a0) or constituent unit (a1) and does not fall under the definition of the constituent unit (a2).

The term "lactone-containing cyclic group" refers to a cyclic group containing a ring containing —O—C(═O)— in a ring skeleton thereof (lactone ring). When the lactone ring is counted as the first ring, in the case of having only a lactone ring, the cyclic group is called a monocyclic group, whereas in the case of further having other ring structure, the cyclic group is called a polycyclic group regardless of a structure thereof. The lactone-containing cyclic group may be either a monocyclic group or a polycyclic group.

The lactone-containing cyclic group is not particularly limited, and any arbitrary lactone-containing cyclic group can be used. Specifically, examples thereof include groups represented by the following general formulae (a2-r-1) to (a2-r-7), respectively.

(Chemical formula 19)

(a2-r-1)
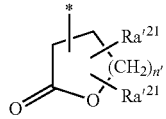

(a2-r-2)
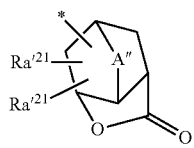

(a2-r-3)
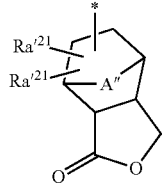

(a2-r-4)
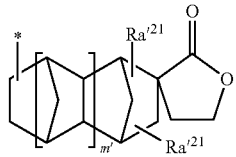

(a2-r-5)
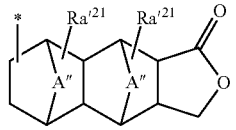

(a2-r-6)
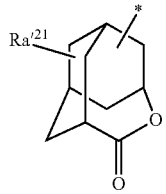

(a2-r-7)

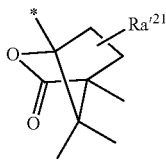

In the formulae, each Ra'$^{21}$ independently represents a hydrogen atom, an alkyl group, an alkoxy group, a halogen atom, a halogenated alkyl group, a hydroxyl group, —COOR", —OC(═O)R", a hydroxyalkyl group, or a cyano group; R" represents a hydrogen atom, an alkyl group, a lactone-containing cyclic group, a carbonate-containing cyclic group, or an —SO$_2$—-containing cyclic group; A" represents an alkylene group having 1 to 5 carbon atoms, which may contain an oxygen atom or a sulfur atom, an oxygen atom, or a sulfur atom; n' is an integer of 0 to 2; and m' is 0 or 1.

In the foregoing general formulae (a2-r-1) to (a2-r-7), A" represents an alkylene group having 1 to 5 carbon atoms, which may contain an oxygen atom (—O—) or a sulfur atom (—S—), an oxygen atom, or a sulfur atom. The alkylene group having 1 to 5 carbon atoms in A" is preferably a linear or branched alkylene group, and examples thereof include a methylene group, an ethylene group, an n-propylene group, and an isopropylene group. In the case where the alkylene group contains an oxygen atom or a sulfur atom, specific examples thereof include a group in which —O— or —S— intervenes at an end or between the carbon atoms of the above-described alkylene group. Examples thereof include —O—CH$_2$—, —CH$_2$—O—CH$_2$—, —S—CH$_2$—, and —CH$_2$—S—CH$_2$—. A" is preferably an alkylene group having 1 to 5 carbon atoms or —O—, more preferably an alkylene group having 1 to 5 carbon atoms, and most preferably a methylene group.

In the foregoing general formulae (a2-r-1) to (a2-r-7), the alkyl group in Ra'$^{21}$ is preferably an alkyl group having 1 to 6 carbon atoms. The alkyl group is preferably linear or branched. Specifically, examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Of these, a methyl group or an ethyl group is preferable, and a methyl group is especially preferable.

The alkoxy group in Ra'$^{21}$ is preferably an alkoxy group having 1 to 6 carbon atoms. The alkoxy group is preferably linear or branched. Specifically, examples thereof include a group in which the alkyl group exemplified above as the alkyl group in Ra'$^{21}$ and an oxygen atom (—O—) are connected with each other.

Examples of the halogen atom in Ra'$^{21}$ include a fluorine atom, a chlorine atom, a bromine atom, and an iodine atom, with a fluorine atom being preferable.

Examples of the halogenated alkyl group in Ra'$^{21}$ include a group in which a part or all of the hydrogen atoms of the alkyl group in Ra'$^{21}$ are substituted with the above-described halogen atom. The halogenated alkyl group is preferably a fluorinated alkyl group, and especially preferably a perfluoroalkyl group.

In each of —COOR" and —OC(═O)R" in Ra'$^{21}$, R" is a hydrogen atom, an alkyl group, a lactone-containing cyclic group, a carbonate-containing cyclic group, or an —SO$_2$—-containing cyclic group.

The alkyl group in R" may be linear, branched, or cyclic, and the carbon number thereof is preferably 1 to 15.

In the case where R" is a linear or branched alkyl group, the carbon number thereof is preferably 1 to 10, and more preferably 1 to 5. Above all, R" is especially preferably a methyl group or an ethyl group.

In the case where R" is a cyclic alkyl group, the carbon number thereof is preferably 3 to 15, more preferably 4 to 12, and most preferably 5 to 10. Specifically, examples of the cyclic alkyl group include a group in which one or more hydrogen atoms are eliminated from a monocycloalkane which may or may not be substituted with a fluorine atom or a fluorinated alkyl group; and a group in which one or more hydrogen atoms are eliminated from a polycycloalkane such as a bicycloalkane, a tricycloalkane, and a tetracycloalkane. More specifically, examples of the cyclic alkyl group include a group in which one or more hydrogen atoms are eliminated from a monocycloalkane such as cyclopentane and cyclohexane; and a group in which one or more hydrogen atoms are eliminated from a polycycloalkane such as adamantane, norbornane, isobornane, tricyclodecane, and tetracyclododecane.

Examples of the lactone-containing cyclic group in R" include the same groups as those represented by the foregoing general formulae (a2-r-1) to (a2-r-7), respectively.

The carbonate-containing cyclic group in R" is the same as a carbonate-containing cyclic group as described later, and specifically, examples thereof include groups represented by general formulae (ax3-r-1) to (ax3-r-3), respectively.

The —SO$_2$—-containing cyclic group in R" is the same as an —SO$_2$—-containing cyclic group as described later, and specifically, examples thereof include groups represented by general formulae (a5-r-1) to (a5-r-4), respectively.

The hydroxyalkyl group in Ra'$^{21}$ is preferably one having 1 to 6 carbon atoms. Specifically, examples thereof include a group in which at least one of the hydrogen atoms of the alkyl group in Ra'$^{21}$ as described above is substituted with a hydroxyl group.

In the foregoing general formulae (a2-r-2), (a2-r-3), and (a2-r-5), the alkylene group having 1 to 5 carbon atoms in A" is preferably a linear or branched alkylene group, and examples thereof include a methylene group, an ethylene group, an n-propylene group, and an isopropylene group. In the case where the alkylene group contains an oxygen atom or a sulfur atom, specific examples thereof include a group in which —O— or —S— intervenes at an end or between the carbon atoms of the above-described alkylene group. Examples thereof include —O—CH$_2$—, —CH$_2$—O—CH$_2$—, —S—CH$_2$—, and —CH$_2$—S—CH$_2$—. A" is preferably an alkylene group having 1 to 5 carbon atoms or —O—, more preferably an alkylene group having 1 to 5 carbon atoms, and most preferably a methylene group.

Specific examples of each of the groups represented by the general formulae (a2-r-1) to (a2-r-7) are given below.

(Chemical formula 20)

(r-lc-1-1)

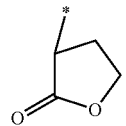

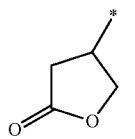 (r-lc-1-2)
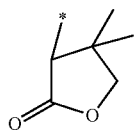 (r-lc-1-3)
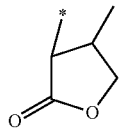 (r-lc-1-4)
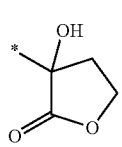 (r-lc-1-5)
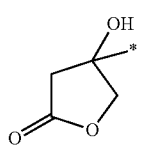 (r-lc-1-6)
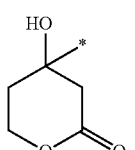 (r-lc-1-7)
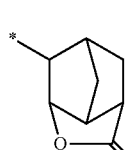 (r-lc-2-1)
 (r-lc-2-2)
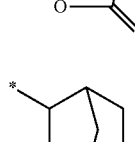 (r-lc-2-3)
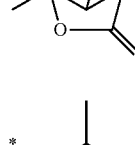 (r-lc-2-4)
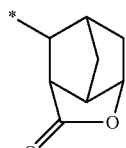 (r-lc-2-5)
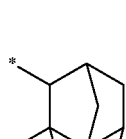 (r-lc-2-6)
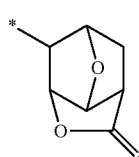 (r-lc-2-7)
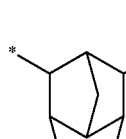 (r-lc-2-8)
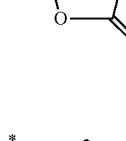 (r-lc-2-9)
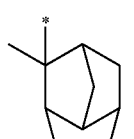 (r-lc-2-10)
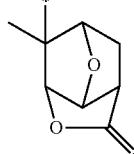 (r-lc-2-11)
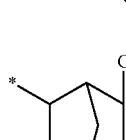 (r-lc-2-12)

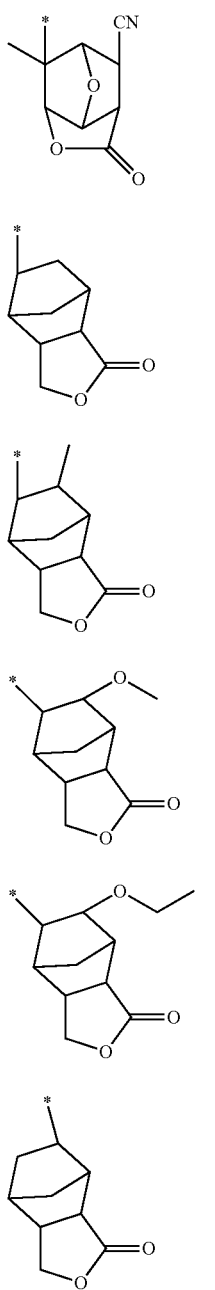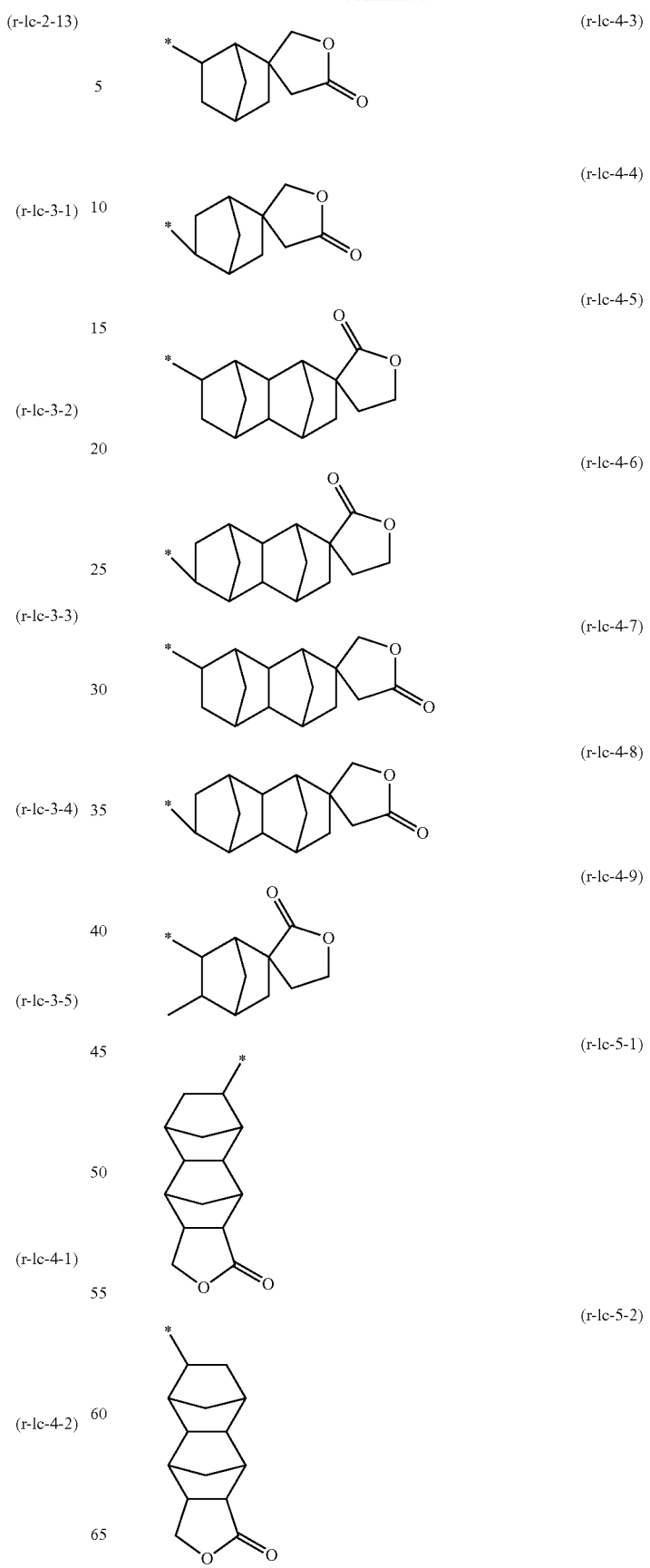

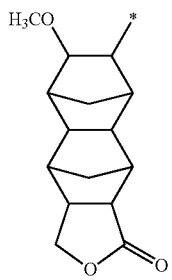
(r-lc-5-3)

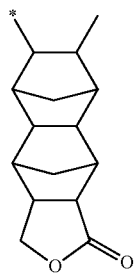
(r-lc-5-4)

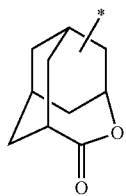
(r-lc-6-1)

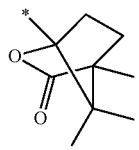
(r-lc-7-1)

The term "—$SO_2$—-containing cyclic group" represents a cyclic group containing a ring containing —$SO_2$— in a ring skeleton thereof, and specifically, it is a cyclic group in which the sulfur atom (S) in —$SO_2$— forms a part of the ring skeleton of the cyclic group. When the ring containing —$SO_2$— in a ring skeleton thereof is counted as the first ring, in the case of having only this ring, the cyclic group is called a monocyclic group, whereas in the case of further having other ring structure, the cyclic group is called a polycyclic group regardless of a structure thereof. The —$SO_2$—-containing cyclic group may be either a monocyclic group or a polycyclic group.

The —$SO_2$—-containing cyclic group is especially preferably a cyclic group containing —O—$SO_2$— in a ring skeleton thereof, namely a cyclic group containing a sultone ring in which —O—S— in —O—$SO_2$— forms a part of the ring skeleton. More specifically, examples of the —$SO_2$—-containing cyclic group include groups represented by the following general formulae (a5-r-1) to (a5-r-4), respectively.

(Chemical formula 22)

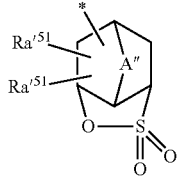
(a5-r-1)

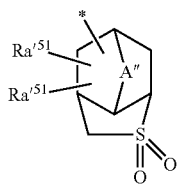
(a5-r-2)

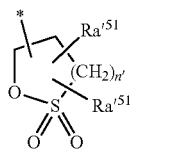
(a5-r-3)

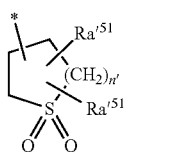
(a5-r-4)

In the formulae, each $Ra'^{51}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or an —$SO_2$—-containing cyclic group; A" represents an alkylene group having 1 to 5 carbon atoms, which may contain an oxygen atom or a sulfur atom, an oxygen atom, or a sulfur atom; and n' is an integer of 0 to 2.

In the foregoing general formulae (a5-r-1) to (a5-r-4), A" is the same as A" in the foregoing general formulae (a2-r-1) to (a2-r-7). The alkyl group, the alkoxy group, the halogen atom, the halogenated alkyl group, —COOR", —OC(=O)R", and the hydroxyalkyl group in $Ra'^{51}$ are the same as those for $Ra'^{21}$ in the foregoing formulae (a2-r-1) to (a2-r-7), respectively.

Specific examples of each of the groups represented by the general formulae (a5-r-1) to (a5-r-4) are given below. In the following formulae, "Ac" represents an acetyl group.

(Chemical formula 23)

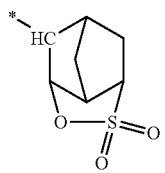
(r-sl-1-1)

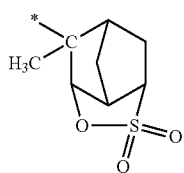 (r-sl-1-2)
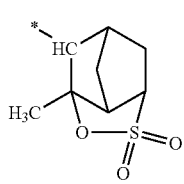 (r-sl-1-3)
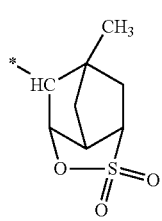 (r-sl-1-4)
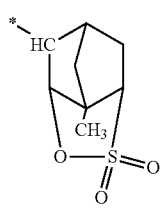 (r-sl-1-5)
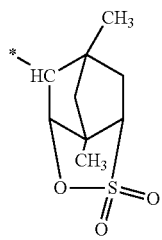 (r-sl-1-6)
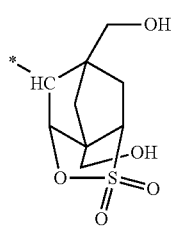 (r-sl-1-7)
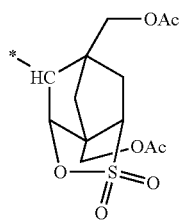 (r-sl-1-8)
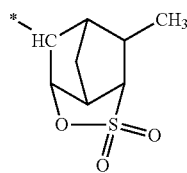 (r-sl-1-9)
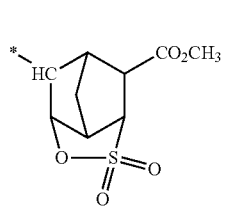 (r-sl-1-10)
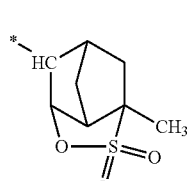 (r-sl-1-11)
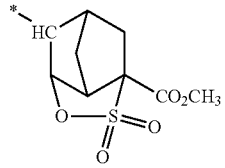 (r-sl-1-12)
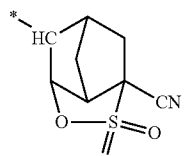 (r-sl-1-13)
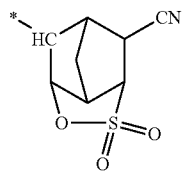 (r-sl-1-14)
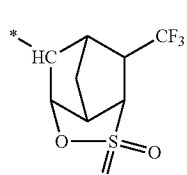 (r-sl-1-15)
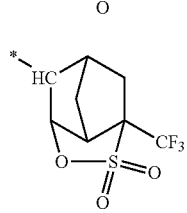 (r-sl-1-16)

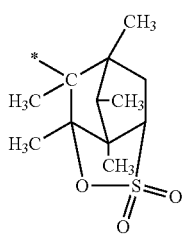 (r-sl-1-17)
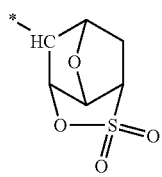 (r-sl-1-18)
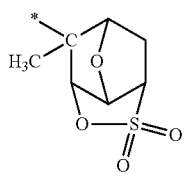 (r-sl-1-19)
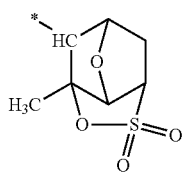 (r-sl-1-20)
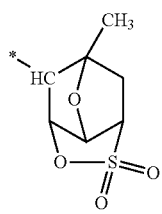 (r-sl-1-21)
(Chemical formula 24)
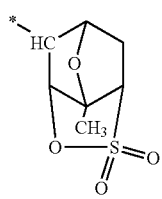 (r-sl-1-22)
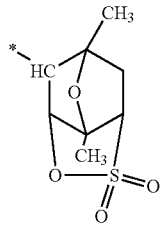 (r-sl-1-23)
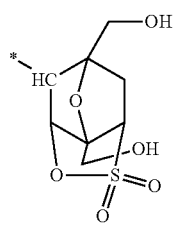 (r-sl-1-24)
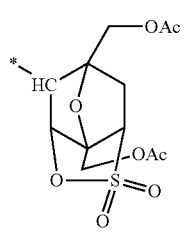 (r-sl-1-25)
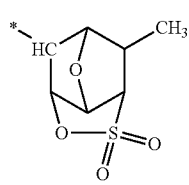 (r-sl-1-26)
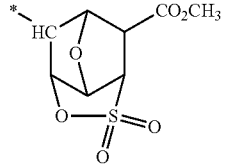 (r-sl-1-27)
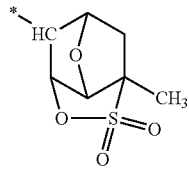 (r-sl-1-28)
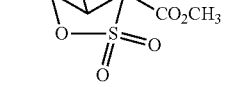 (r-sl-1-29)
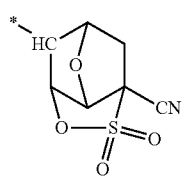 (r-sl-1-30)
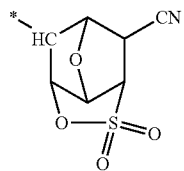 (r-sl-1-31)

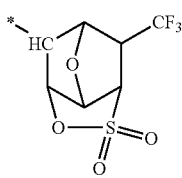

(r-sl-1-32)

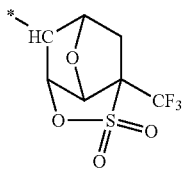

(r-sl-1-33)

(Chemical formula 25)

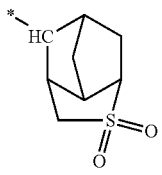

(r-sl-2-1)

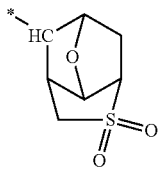

(r-sl-2-2)

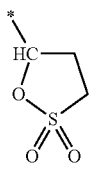

(r-sl-3-1)

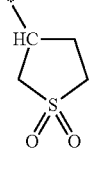

(r-sl-4-1)

Of the foregoing, the —SO$_2$—-containing cyclic group is preferably the group represented by the foregoing general formula (a5-r-1). Above all, it is more preferable to use at least one member selected from the group consisting of the groups represented by the foregoing chemical formulae (r-s1-1-1), (r-s1-1-18), (r-s1-3-1), and (r-s1-4-1), and it is the most preferable to use the group represented by the foregoing chemical formula (r-s1-1-1).

The term "carbonate-containing cyclic group" refers to a cyclic group containing a ring containing —O—C(=O)—O— in a ring skeleton thereof (carbonate ring). When the carbonate ring is counted as the first ring, in the case of having only a carbonate ring, the cyclic group is called a monocyclic group, whereas in the case of further having other ring structure, the cyclic group is called a polycyclic group regardless of a structure of the other rings. The carbonate-containing cyclic group may be either a monocyclic group or a polycyclic group.

The carbonate ring-containing cyclic group is not particularly limited, and any arbitrary carbonate ring-containing cyclic group can be used. Specifically, examples thereof include groups represented by the following general formulae (ax3-r-1) to (ax3-r-3), respectively.

(Chemical formula 26)

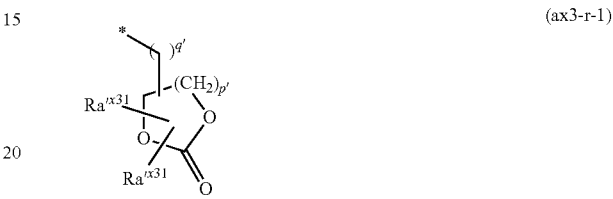

In the formulae, each Ra$'^{x31}$ independently represents a hydrogen atom, an alkyl group, an alkoxy group, a halogen atom, a halogenated alkyl group, a hydroxyl group, —COOR", —OC(=O) R", a hydroxyalkyl group, or a cyano group; R" represents a hydrogen atom, an alkyl group, a lactone-containing cyclic group, a carbonate-containing cyclic group, or an —SO$_2$—-containing cyclic group; A" represents an alkylene group having 1 to 5 carbon atoms, which may contain an oxygen atom or a sulfur atom, an oxygen atom, or a sulfur atom; p' is an integer of 0 to 3; and q' is 0 or 1.

In the foregoing general formulae (ax3-r-1) to (ax3-r-3), A" is the same as A" in the foregoing general formula (a2-r-1).

The alkyl group, the alkoxy group, the halogen atom, the halogenated alkyl group, —COOR", —OC(=O)R", and the hydroxyalkyl group in Ra$'^{x31}$ are the same as those described for Ra$'^{21}$ in the foregoing general formulae (a2-r-1) to (a2-r-7), respectively.

Specific examples of each of the groups represented by the general formulae (ax3-r-1) to (ax3-r-3) are given below.

(Chemical formula 27)
(r-cr-1-1) 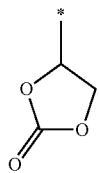
(r-cr-1-2) 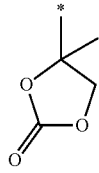
(r-cr-1-3) 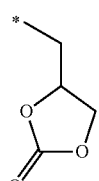
(r-cr-1-4) 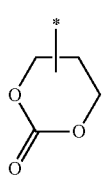
(r-cr-1-5) 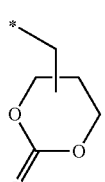
(r-cr-1-6) 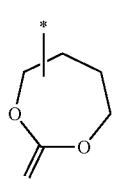
(r-cr-1-7) 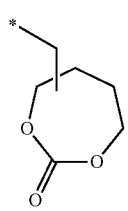
(r-cr-2-1) 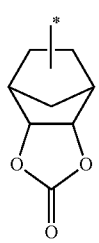
(r-cr-2-2) 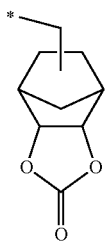
(r-cr-2-3) 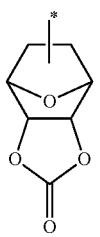
(r-cr-2-4) 
(r-cr-3-1) 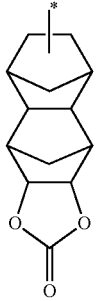
(r-cr-3-2) 

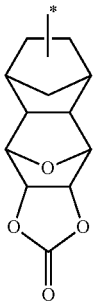

(r-cr-3-3)

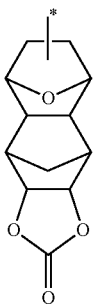

(r-cr-3-4)

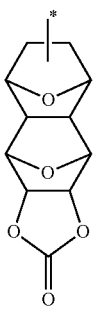

(r-cr-3-5)

Of the foregoing, the lactone-containing cyclic group or the —$SO_2$-containing cyclic group is preferable, with the lactone-containing cyclic group being more preferable. Specifically, the group represented by the foregoing general formula (a2-r-1), (a2-r-2), or (a5-r-1) is more preferable; and the group represented by any one of the foregoing chemical formulae (r-1c-1-1) to (r-1c-1-7), (r-1c-2-1) to (r-1c-2-13), (r-s1-1-1), and (r-s1-1-18) is preferable.

Above all, the constituent unit (a2) is preferably a constituent unit derived from an acrylic ester in which the hydrogen atom bonded to the carbon atom at the α-position may be substituted with a substituent.

Such a constituent unit (a2) is preferably a constituent unit represented by the following general formula (a2-1).

(Chemical formula 28)

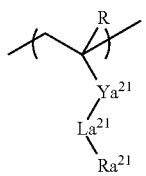

(a2-1)

In the formula, R represents a hydrogen atom, an alkyl group having 1 to 5 carbon atoms, or a halogenated alkyl group having 1 to 5 carbon atoms; $Ya^{21}$ represents a single bond or a divalent connecting group; $La^{21}$ represents —O—, —COO—, or —OCO—; R' represents a hydrogen atom or a methyl group, provided that in the case where $La^{21}$ is —O—, then $Ya^{21}$ is not —CO—; and $Ra^{21}$ represents a lactone-containing cyclic group, a carbonate-containing cyclic group, or an —$SO_2$—-containing cyclic group.

Though the divalent connecting group represented by $Ya^{21}$ is not particularly limited, suitable examples thereof include an optionally substituted divalent hydrocarbon group; and a divalent connecting group containing a hetero atom.

Optionally Substituted Divalent Hydrocarbon Group:

The hydrocarbon group as the divalent connecting group may be either an aliphatic hydrocarbon group or an aromatic hydrocarbon group.

The aliphatic hydrocarbon group means a hydrocarbon group having no aromaticity. The aliphatic hydrocarbon group may be either saturated or unsaturated, and in general, it is preferably saturated.

Examples of the aliphatic hydrocarbon group include a linear or branched aliphatic hydrocarbon group and an aliphatic hydrocarbon group containing a ring in a structure thereof. Specifically, examples thereof include the groups exemplified for $Va^0$ in the foregoing formula (a0-1).

The above-described linear or branched aliphatic hydrocarbon group may or may not have a substituent. Examples of the substituent include a fluorine atom, a fluorinated alkyl group having 1 to 5 carbon atoms, which is substituted with a fluorine atom, and a carbonyl group.

The cyclic aliphatic hydrocarbon group in the aliphatic hydrocarbon group containing a ring may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and most preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an isopropoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of the above-described alkyl group are substituted with the above-described halogen atom.

In the cyclic aliphatic hydrocarbon group, a part of the carbon atoms constituting a ring structure thereof may be substituted with a substituent containing a hetero atom. The substituent containing a hetero atom is preferably —O—, —C(=O)—O—, —S—, —S(=O)$_2$—, or —S(=O)$_2$—O—.

Specifically, examples of the aromatic hydrocarbon group as the divalent hydrocarbon group include the groups exemplified for $Va^0$ in the foregoing formula (a0-1).

In the above-described aromatic hydrocarbon group, the hydrogen atom(s) which the aromatic hydrocarbon group has may be substituted with a substituent. For example, the hydrogen atom(s) bonded to the aromatic ring in the aromatic hydrocarbon group may be substituted with a substituent.

Examples of the substituent include an alkyl group, an alkoxy group, a halogen atom, a halogenated alkyl group, and a hydroxyl group.

The alkyl group as the substituent is preferably an alkyl group having 1 to 5 carbon atoms. The alkyl group is most preferably a methyl group, an ethyl group, a propyl group, an n-butyl group, or a tert-butyl group.

Examples of the alkoxy group, the halogen atom, and the halogenated alkyl group as the substituent include those exemplified above as the substituent with which the hydrogen atom(s) which the cyclic aliphatic hydrocarbon group has is substituted.

Hetero Atom-Containing Divalent Connecting Group:

The hetero atom in the hetero atom-containing divalent connecting group refers to an atom other than the carbon atom and the hydrogen atom, and examples thereof include an oxygen atom, a nitrogen atom, a sulfur atom, and a halogen atom.

In the case where $Ya^{21}$ is a hetero atom-containing divalent connecting group, preferred examples of the connecting group include —O—, —C(=O)—O—, —C(=O)—, —O—C(=O)—O—, —C(=O)—NH—, —NH—, —NH—C(=NH)— (H may be substituted with a substituent such as an alkyl group and an acyl group), —S—, —S(=O)$_2$—, —S(=O)$_2$—O—, and a group represented by the general formula: —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m'}$—$Y^{22}$—, or —$Y^{21}$—O—C(=O)—$Y^{22}$— [in the formulae, each of $Y^{21}$ and $Y^{22}$ independently represents an optionally substituted divalent hydrocarbon group; O represents an oxygen atom; and m' is an integer of 0 to 3].

In the case where the hetero atom-containing divalent connecting group is —C(=O)—NH—, —NH—, or —NH—C(=NH)—, the H may be substituted with a substituent such as an alkyl group and an acyl group. The carbon number of the substituent (such as an alkyl group and an acyl group) is preferably 1 to 10, more preferably 1 to 8, and especially preferably 1 to 5.

In the formula: —$Y^{21}$—O—$Y^{22}$—, $Y^{21}$—O—, —$Y^{21}$—C(=O)—O—, —C(=O)—O—$Y^{21}$—, —[$Y^{21}$—C(=O)—O]$_{m'}$—$Y^{22}$—, or —$Y^{21}$—O—C(=O)—$Y^{22}$—, each of $Y^{21}$ and $Y^{22}$ independently represents an optionally substituted divalent hydrocarbon group. Examples of the divalent hydrocarbon group include the same divalent hydrocarbon groups as those exemplified above as the divalent connecting group for the "optionally substituted divalent hydrocarbon group".

$Y^{21}$ is preferably a linear aliphatic hydrocarbon group, more preferably a linear alkylene group, still more preferably a linear alkylene group having 1 to 5 carbon atoms, and especially preferably a methylene group or an ethylene group.

$Y^{22}$ is preferably a linear or branched aliphatic hydrocarbon group, and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

In the group represented by the formula: —[$Y^{21}$—C(=O)—O]$_{m'}$—$Y^{22}$—, m' is an integer of 0 to 3, preferably an integer of 0 to 2, more preferably 0 or 1, and especially preferably 1. Namely, the group represented by the formula: —[$Y^{21}$—C(=O)—O]$_{m'}$—$Y^{22}$— is especially preferably a group represented by the formula: —$Y^{21}$—C(=O)—O—$Y^{22}$—. Above all, a group represented by the formula: —(CH$_2$)$_{a'}$—C(=O)—O—(CH$_2$)$_{b'}$— is preferable. In the foregoing formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

$Ya^{21}$ is preferably a single bond, an ester bond [—C(=O)—O—], an ether bond (—O—), a linear or branched alkylene group, or a combination thereof.

In the foregoing formula (a2-1), $Ra^{21}$ is the above-described lactone-containing cyclic group, —SO$_2$—-containing cyclic group, or carbonate-containing cyclic group, preferably the lactone-containing cyclic group or —SO$_2$—-containing cyclic group, and especially preferably the lactone-containing cyclic group.

The constituent unit (a2) which the component (A1) has may be either one kind or two or more kinds.

In the case where the component (A1) has the constituent unit (a2), a proportion of the constituent unit (a2) is preferably 1 to 80 mol %, more preferably 5 to 70 mol %, still more preferably 10 to 65 mol %, and especially preferably 10 to 60 mol % relative to a total sum of all of the constituent units constituting the component (A1).

When the proportion of the constituent unit (a2) is the lower limit value or more, the effects to be brought due to the fact that the constituent unit (a2) is contained are sufficiently obtained. On the other hand, when the proportion of the constituent unit (a2) is the upper limit value or less, a balance with other constituent units can be taken, and various lithography properties and pattern shape become satisfactory.

Constituent Unit (a3):

The constituent unit (a3) is a constituent unit containing a polar group-containing aliphatic hydrocarbon group (provided that those which fall within the definition of any one of the above-described constituent unit (a0), constituent unit (a1), and constituent unit (a2) are excluded).

In view of the fact that the component (A1) has the constituent unit (a3), the hydrophilicity of the component (A) increases, resulting in contribution to an enhancement of the resolution.

Examples of the polar group include a hydroxyl group, a cyano group, a carboxy group, and a hydroxyalkyl group in which a part of hydrogen atoms of an alkyl group is substituted with a fluorine atom, with a hydroxyl group being especially preferable.

Examples of the aliphatic hydrocarbon group include a linear or branched hydrocarbon group having 1 to 10 carbon atoms (preferably an alkylene group) and a cyclic aliphatic hydrocarbon group (cyclic group). The cyclic group may be either a monocyclic group or a polycyclic group, and for example, it can be properly selected and used among a large number of groups proposed in resins for resist compositions for ArF excimer lasers. The cyclic group is preferably a polycyclic group, and more preferably a polycyclic group having 7 to 30 carbon atoms.

Above all, a constituent unit derived from an acrylic ester containing an aliphatic polycyclic group containing a hydroxyl group, a cyano group, a carboxy group, or a hydroxyalkyl group in which a part of hydrogen atoms of an alkyl group is substituted with a fluorine atom is more preferable. Examples of the polycyclic group include a group in which two or more hydrogen atoms are eliminated from a bicycloalkane, a tricycloalkane, a tetracycloalkane, or the like. Specifically, examples thereof include a group in which two or more hydrogen atoms are eliminated from a polycycloalkane such as adamantane, norbornane, isobornane, tricyclodecane, and tetracyclododecane. Among these polycyclic groups, a group in which two or more hydrogen atoms are eliminated from adamantane, a group in which two or more hydrogen atoms are eliminated from norbornane, or a group in which two or more hydrogen atoms are eliminated from tetracyclododecane is preferable from the industrial standpoint.

As the constituent unit (a3), an arbitrary constituent unit can be used without particular limitations so long as it contains a polar group-containing aliphatic hydrocarbon group.

The constituent unit (a3) is preferably a constituent unit derived from an acrylic ester in which the hydrogen atom bonded to the carbon atom at the α-position may be substituted with a substituent, the constituent unit containing a polar group-containing aliphatic hydrocarbon group.

When the hydrocarbon group in the polar group-containing aliphatic hydrocarbon group is a linear or branched hydrocarbon group having 1 to 10 carbon atoms, the constituent unit (a3) is preferably a constituent unit derived from a hydroxyethyl ester of acrylic acid, and when the subject hydrocarbon group is a polycyclic group, the constituent unit (a3) is preferably a constituent unit represented by the following formula (a3-1), a constituent unit represented by the following formula (a3-2), or a constituent unit represented by the following formula (a3-3).

(Chemical formula 29)

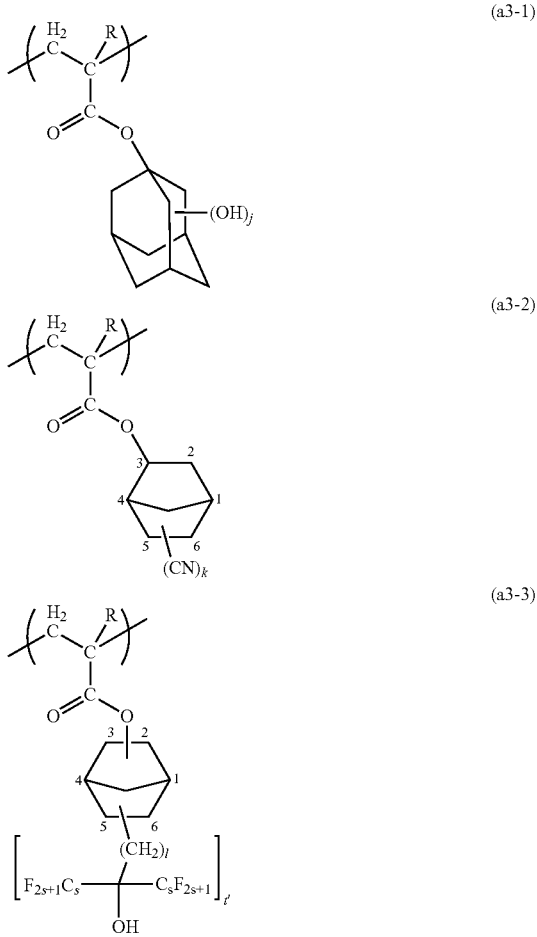

In the formulae, R is the same as that described above; j is an integer of 1 to 3; k is an integer of 1 to 3; t' is an integer of 1 to 3; l is an integer of 1 to 5; and s is an integer of 1 to 3.

In the formula (a3-1), j is preferably 1 or 2, and more preferably 1. In the case where j is 2, a constituent unit in which the hydroxyl group is bonded to the 3-position and 5-position of the adamantyl group is preferable. In the case where j is 1, a constituent unit in which the hydroxyl group is bonded to the 3-position of the adamantyl group is preferable.

j is preferably 1, and a constituent unit in which the hydroxyl group is bonded to the 3-position of the adamantyl group is especially preferable.

In the formula (a3-2), k is preferably 1; and the cyano group is preferably bonded to the 5-position or 6-position of the norbornyl group.

In the formula (a3-3), t' is preferably 1; l is preferably 1; and s is preferably 1. In these, it is preferable that the 2-norbonyl group or the 3-norbornyl group is bonded to an end of the carboxy group of acrylic acid. The fluorinated alkyl alcohol is preferably bonded to the 5- or 6-position of the norbornyl group.

The constituent unit (a3) which the component (A1) has may be either one kind or two or more kinds.

In the case where the component (A1) has the constituent unit (a3), a proportion of the constituent unit (a3) is preferably 1 to 40 mol %, more preferably 2 to 30 mol %, still more preferably 5 to 25 mol %, and especially preferably 10 to 20 mol % relative to a total sum of all of the constituent units constituting the component (A1).

When the proportion of the constituent unit (a3) is the preferred lower limit value or more, in the formation of a resist pattern, the resolution more increases. On the other hand, when the proportion of the constituent unit (a3) is the preferred upper limit value or less, a balance with other constituent units is easily taken.

Constituent Unit (a4):

The constituent unit (a4) is a constituent unit containing an acid nondissociable aliphatic cyclic group.

In view of the fact that the component (A1) has the constituent unit (a4), dry etching resistance of the formed resist pattern is enhanced. In addition, hydrophobicity of the component (A) increases. In particular, in the case of the solvent development process, the enhancement of hydrophobicity contributes to enhancements in resolution, resist pattern shape, and the like.

The "acid-nondissociable cyclic group" in the constituent unit (a4) is a cyclic group which on the occasion of generation of an acid in the resist composition upon exposure (for example, on the occasion of generation of an acid from a component (B) as described later), even when the acid acts, remains in the constituent unit as it is without being dissociated.

The constituent unit (a4) is, for example, preferably a constituent unit derived from an acrylic ester containing an acid nondissociable aliphatic cyclic group, or the like. As the cyclic group, a large number of groups which have been conventionally known to be used for resin components for resist composition such as those for ArF excimer lasers and KrF excimer lasers (preferably those for ArF excimer lasers), and the like can be used.

In particular, from the standpoint of easiness of industrial availability or the like, the constituent unit (a4) is preferably at least one member selected from a tricyclodecyl group, an adamantyl group, a tetracyclododecyl group, an isobornyl group, and a norbornyl group. Such a polycyclic group may have a linear or branched alkyl group having 1 to 5 carbon atoms as a substituent.

Specifically, examples of the constituent unit (a4) include constituent units represented by the following general formulae (a4-1) to (a4-7), respectively.

(Chemical formula 30)

(a4-1) 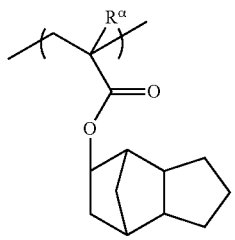

(a4-2) 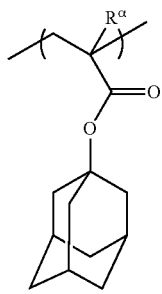

(a4-3) 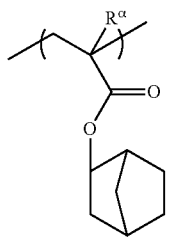

(a4-4) 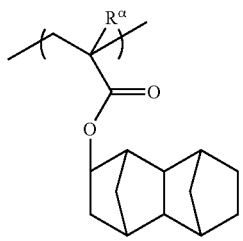

(a4-5) 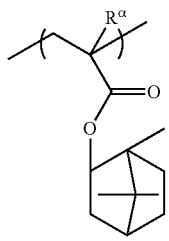

(a4-6) 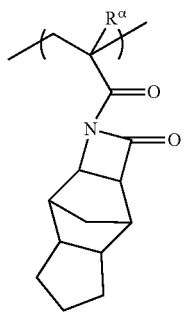

-continued (a4-7) 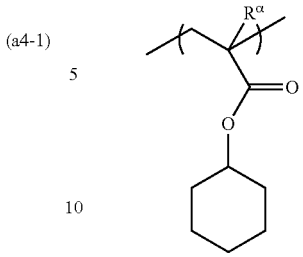

In the formulae, $R^\alpha$ is the same as that described above.

The constituent unit (a4) which the component (A1) has may be either one kind or two or more kinds.

In the case where the component (A1) has the constituent unit (a4), a proportion of the constituent unit (a4) is preferably 1 to 40 mol %, and more preferably 5 to 20 mol % relative to a total sum of all of the constituent units constituting the component (A1).

When the proportion of the constituent unit (a4) is the preferred lower limit value or more, the effects to be brought due to the fact that the constituent unit (a4) is contained are sufficiently obtained. On the other hand, when the proportion of the constituent unit (a4) is the preferred upper limit value or less, a balance with other constituent units is easily taken.

In the resist composition of the present invention, the component (A) contains the high-molecular weight compound (A1) having the constituent unit (a0). Specifically, as the component (A1), a high-molecular weight compound composed of a repeating structure of the constituent unit (a0) and the constituent unit (a2); a high-molecular weight compound composed of a repeating structure of the constituent unit (a0) and the constituent unit (a3); and a high-molecular weight compound composed of a repeating structure of the constituent unit (a0), the constituent unit (a2), and the constituent unit (a3) can be exemplified.

A mass average molecular weight (Mw) (as converted into standard polystyrene by means of gel permeation chromatography (GPC)) of the component (A1) is not particularly limited, and it is preferably 1,000 to 50,000, more preferably 1,500 to 30,000, and most preferably 2,000 to 20,000.

When Mw of the component (A1) is the preferred upper limit value of the foregoing range or less, sufficient solubility in a resist solvent for the use as a resist is revealed, and when it is the preferred lower limit value of the foregoing range or more, satisfactory dry etching resistance and resist pattern cross-sectional shape are revealed.

A degree of dispersion (Mw/Mn) of the component (A1) is not particularly limited, and it is preferably 1.0 to 5.0, more preferably 1.0 to 4.0, and most preferably 1.0 to 3.0. It is to be noted that Mn represents a number average molecular weight.

The component (A1) may be used solely, or may be used in combination of two or more kinds thereof.

A proportion of the component (A1) in the component (A) is preferably 25 mass % or more, more preferably 50 mass % or more, and still more preferably 75 mass % or more relative to a total mass of the component (A), and it may be even 100 mass %. In particular, when the proportion of the component (A1) in the component (A) is 25 mass % or more, the resolution of a pattern increases, and it becomes more easy to ensure a process margin such as exposure latitude (EL margin) and depth and width of focus (DOF) properties.

In the resist composition of the present invention, a base material component which does not fall under the definition of the component (A1) and whose solubility in a developing solution changes by the action of an acid (hereinafter referred to as "component (A2)") may be used jointly as the component (A).

The component (A2) is not particularly limited, and it may be arbitrarily selected and used among a large number of materials which have been conventionally known as base material components for a chemically amplified resist composition (for example, base resins for ArF excimer lasers and KrF excimer lasers (preferably those for ArF excimer lasers)). The component (A2) may be used solely, or may be used in combination of two or more kinds thereof.

In the resist composition of the present invention, the component (A) may be used solely, or may be used in combination of two or more kinds thereof.

In the resist composition of the present invention, a content of the component (A) may be adjusted in conformity with the thickness of the resist film which is intended to be formed, or the like.

<<Other Components>>

The resist composition of the present invention may further contain, in addition to the above-described component (A), other components than the component (A). Examples of other components include a component (B), a component (D), a component (E), a component (F), and a component (S) as described below.

[Component (B): Acid Generator Component]

The resist composition of the present invention may further contain, in addition to the component (A), an acid generator component (hereinafter referred to as "component (B)").

The component (B) is not particularly limited, and those which have been so far proposed as the acid generator for a chemically amplified resist can be used.

Examples of such an acid generator include a variety of acid generators such as an onium salt-based acid generator, for example, an iodonium salt or a sulfonium salt; an oxime sulfonate-based acid generator; a diazomethane-based acid generator, for example, a bisalkyl or bisaryl sulfonyl diazomethane or a poly(bissulfonyl)diazomethane; a nitrobenzylsulfonate-based acid generator; an iminosulfonate-based acid generator; and a disulfone-based acid generator. Above all, it is preferable to use an onium salt-based acid generator.

As the onium salt-based acid generator, for example, a compound represented by the following general formula (b-1) (hereinafter also referred to as "component (b-1)"), a compound represented by the following general formula (b-2) (hereinafter also referred to as "component (b-2)"), or a compound represented by the following general formula (b-3) (hereinafter also referred to as "component (b-3)") can be used.

(Chemical formula 31)

$$R^{101}-Y^{101}-V^{101}-\underset{F}{\overset{R^{102}}{\underset{|}{C}}}-SO_3^- \quad (M'^{m+})_{1/m} \quad (b-1)$$

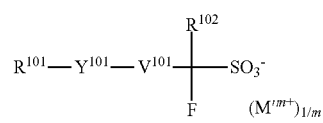

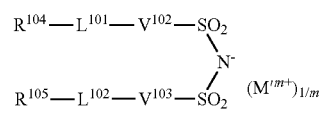

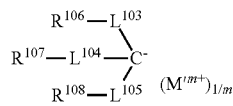

In the formulae, each of $R^{101}$ and $R^{104}$ to $R^{108}$ independently represents an optionally substituted cyclic group, an optionally substituted chain alkyl group, or an optionally substituted chain alkenyl group; $R^{104}$ and $R^{105}$ may be bonded to each other to form a ring; $R^{102}$ represents a fluorine atom or a fluorinated alkyl group having 1 to 5 carbon atoms; $Y^{101}$ represents a single bond or a divalent connecting group containing an oxygen atom; each of $V^{101}$ to $V^{103}$ independently represents a single bond, an alkylene group, or a fluorinated alkylene group; each of $L^{101}$ to $L^{102}$ independently represents a single bond or an oxygen atom; each of $L^{103}$ to $L^{105}$ independently represents a single bond, —CO—, or —SO$_2$—; m is an integer of 1 or more; and $M'^{m+}$ represents an m-valent onium cation.

{Anion Moiety}

Anion Moiety of the Component (b-1):

In the formula (b-1), $R^{101}$ represents an optionally substituted cyclic group, an optionally substituted chain alkyl group, or an optionally substituted chain alkenyl group.

Optionally Substituted Cyclic Group:

The cyclic group is preferably a cyclic hydrocarbon group, and the cyclic hydrocarbon group may be either an aromatic hydrocarbon group or an aliphatic hydrocarbon group. The aliphatic hydrocarbon group means a hydrocarbon group having no aromaticity. In addition, the aliphatic hydrocarbon group may be either saturated or unsaturated, and in general, it is preferably saturated.

The aromatic hydrocarbon group in $R^{101}$ is a hydrocarbon group having an aromatic ring. The carbon number of the aromatic hydrocarbon group is preferably 3 to 30, more preferably 5 to 30, still more preferably 5 to 20, especially preferably 6 to 15, and most preferably 6 to 10. However, the carbon number does not include the carbon number in the substituent.

Specifically, examples of the aromatic ring which the aromatic hydrocarbon group in $R^{101}$ has include benzene, fluorene, naphthalene, anthracene, phenanthrene, and biphenyl; and also an aromatic heterocyclic ring in which a part of the carbon atoms constituting the above-described aromatic ring is substituted with a hetero atom. Examples of the hetero atom in the aromatic heterocyclic ring include an oxygen atom, a sulfur atom, and a nitrogen atom.

Specifically, examples of the aromatic hydrocarbon group in $R^{101}$ include a group in which one hydrogen atom is eliminated from the above-described aromatic ring (an aryl group, for example, a phenyl group or a naphthyl group); and a group in which one of the hydrogen atoms of the above-described aromatic ring is substituted with an alkylene group (for example, an arylalkyl group such as a benzyl group, a phenethyl group, a 1-naphthylmethyl group, a 2-naphthylmethyl group, a 1-naphthylethyl group, and a 2-naphthylethyl group). The carbon number of the above-described alkylene group (the alkyl chain in the arylalkyl group) is preferably 1 to 4, more preferably 1 to 2, and especially preferably 1.

Examples of the cyclic aliphatic hydrocarbon group in $R^{101}$ include an aliphatic hydrocarbon group containing a ring in a structure thereof.

Examples of the aliphatic hydrocarbon group containing a ring in a structure thereof include an alicyclic hydrocarbon group (a group in which one hydrogen atom is eliminated from an aliphatic hydrocarbon ring); a group in which an alicyclic hydrocarbon group is bonded to an end of a linear or branched aliphatic hydrocarbon group; and a group in which an alicyclic hydrocarbon group intervenes on the way of a linear or branched aliphatic hydrocarbon group.

The carbon number of the above-described alicyclic hydrocarbon group is preferably 3 to 20, and more preferably 3 to 12.

The above-described alicyclic hydrocarbon group may be either a polycyclic group or a monocyclic group. The monocyclic alicyclic hydrocarbon group is preferably a group in which one or more hydrogen atoms are eliminated from a monocycloalkane. The monocycloalkane is preferably one having 3 to 6 carbon atoms, and specifically, examples thereof include cyclopentane and cyclohexane. The polycyclic alicyclic hydrocarbon group is preferably a group in which one or more hydrogen atoms are eliminated from a polycycloalkane. The polycycloalkane is preferably one having 7 to 30 carbon atoms. Above all, the polycycloalkane is more preferably a polycycloalkane having a polycyclic skeleton of a crosslinked ring system, such as adamantane, norbornane, isobornane, tricyclodecane, and tetracyclododecane; or a polycycloalkane having a polycyclic skeleton of a condensed ring system, such as a cyclic group having a steroid skeleton.

In the present specification, the term "steroid skeleton" means a skeleton (st) in which three 6-membered rings and one 5-membered ring are connected with each other, as represented by the following chemical formula.

(Chemical formula 32)

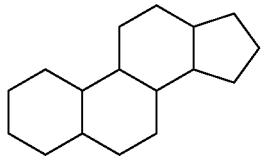

(st)

Above all, the cyclic aliphatic hydrocarbon group in $R^{101}$ is preferably a group in which one or more hydrogen atoms are eliminated from a monocycloalkane or a polycycloalkane, more preferably a group in which one hydrogen atom is eliminated from a polycycloalkane, especially preferably an adamantyl group or a norbornyl group, and most preferably an adamantyl group.

The carbon number of the linear or branched aliphatic hydrocarbon group which may be bonded to an alicyclic hydrocarbon group is preferably 1 to 10, more preferably 1 to 6, still more preferably 1 to 4, and most preferably 1 to 3.

The linear aliphatic hydrocarbon group is preferably a linear alkylene group. Specifically, examples thereof include a methylene group [—CH$_2$-], an ethylene group [—(CH$_2$)$_2$-], a trimethylene group [—(CH$_2$)$_3$-], a tetramethylene group [—(CH$_2$)$_4$-], and a pentamethylene group [—(CH$_2$)$_5$-].

The branched aliphatic hydrocarbon group is preferably a branched alkylene group. Specifically, examples thereof include an alkylalkylene group such as an alkylmethylene group, for example, —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, or —C(CH$_2$CH$_3$)$_2$—; an alkylethylene group, for example, —CH(CH$_3$)CH$_2$—, —CH(CH$_3$)CH(CH$_3$)—, —C(CH$_3$)$_2$CH$_2$—, —CH(CH$_2$CH$_3$)CH$_2$—, or —C(CH$_2$CH$_3$)$_2$—CH$_2$—; an alkyltrimethylene group, for example, —CH(CH$_3$)CH$_2$CH$_2$— or —CH$_2$CH(CH$_3$)CH$_2$—; and an alkyltetramethylene group, for example, —CH(CH$_3$) CH$_2$CH$_2$CH$_2$— or —CH$_2$CH(CH$_3$)CH$_2$CH$_2$—. The alkyl group in the alkylalkylene group is preferably a linear alkyl group having 1 to 5 carbon atoms.

In addition, the cyclic hydrocarbon group in $R^{101}$ may contain a hetero atom as in a heterocyclic ring or the like. Specifically, examples thereof include the lactone-containing cyclic groups represented by the foregoing general formulae (a2-r-1) to (a2-r-7), respectively and the —SO$_2$—-containing cyclic groups represented by the foregoing general formulae (a5-r-1) to (a5-r-4), respectively, and besides, heterocyclic groups as exemplified below.

(Chemical formula 33)

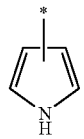
(r-hr-1)

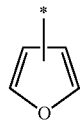
(r-hr-2)

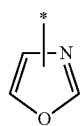
(r-hr-3)

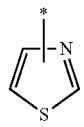
(r-hr-4)

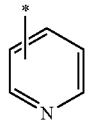
(r-hr-5)

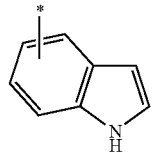
(r-hr-6)

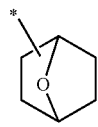
(r-hr-7)

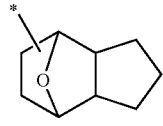
(r-hr-8)

-continued

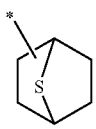
(r-hr-9)

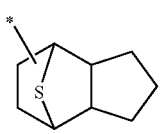
(r-hr-10)

(r-hr-11)

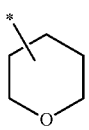
(r-hr-12)

(r-hr-13)

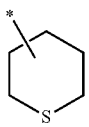
(r-hr-14)

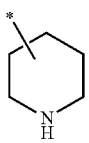
(r-hr-15)

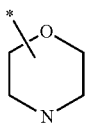
(r-hr-16)

Examples of the substituent in the cyclic group represented by $R^{101}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and most preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an isopropoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of hydrogen atoms of an alkyl group having 1 to 5 carbon atoms, for example, a methyl group, an ethyl group, a propyl group, an n-butyl group, or a tert-butyl group, are substituted with the above-described halogen atom.

The carbonyl group as the substituent is a group with which a methylene group ($-CH_2-$) constituting the cyclic hydrocarbon group is substituted.

Optionally Substituted Chain Alkyl Group:

The chain alkyl group represented by $R^{101}$ may be either linear or branched.

The carbon number of the linear alkyl group is preferably 1 to 20, more preferably 1 to 15, and most preferably 1 to 10. Specifically, examples of the linear alkyl group include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an eicosyl group, a heneicosyl group, and a docosyl group.

The carbon number of the branched alkyl group is preferably 3 to 20, more preferably 3 to 15, and most preferably 3 to 10. Specifically, examples of the branched alkyl group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Optionally Substituted Chain Alkenyl Group:

The chain alkenyl group represented by $R^{101}$ may be either linear or branched. The carbon number of the chain alkenyl group is preferably 2 to 10, more preferably 2 to 5, still more preferably 2 to 4, and especially preferably 3. Examples of the linear alkenyl group include a vinyl group, a propenyl group (allyl group), and a butynyl group. Examples of the branched alkenyl group include a 1-methylvinyl group, a 2-methylvinyl group, a 1-methylpropenyl group, and a 2-methylpropenyl group.

Above all, the chain alkenyl group is preferably a linear alkenyl group, more preferably a vinyl group or a propenyl group, and especially preferably a vinyl group.

Examples of the substituent in the chain alkyl group or alkenyl group represented by $R^{101}$ include an alkoxy group, a halogen atom, a halogenated alkyl group, a hydroxyl group, a carbonyl group, a nitro group, an amino group, and the cyclic groups in $R^{101}$ as described above.

Above all, $R^{101}$ is preferably an optionally substituted cyclic group, and more preferably an optionally substituted cyclic hydrocarbon group. More specifically, a group in which one or more hydrogen atoms are eliminated from a phenyl group, a naphthyl group, or a polycycloalkane; the lactone-containing cyclic groups represented by the foregoing general formulae (a2-r-1) to (a2-r-7), respectively; and the $-SO_2-$-containing cyclic groups represented by the foregoing general formulae (a5-r-1) to (a5-r-4), respectively are preferable.

In the formula (b-1), $Y^{101}$ represents a single bond or a divalent connecting group containing an oxygen atom.

In the case where $Y^{101}$ is a divalent connecting group containing an oxygen atom, $Y^{101}$ may contain an atom other than an oxygen atom. Examples of the atom other than an oxygen atom include a carbon atom, a hydrogen atom, a sulfur atom, and a nitrogen atom.

Examples of the divalent connecting group containing an oxygen atom include a non-hydrocarbon-based oxygen atom-containing connecting group such as an oxygen atom (ether bond: —O—), an ester bond (—C(=O)—O—), an oxycarbonyl group (—O—C(=O)—), an amide bond (—C(=O)—NH—), a carbonyl group (—C(=O)—), and a carbonate bond (—O—C(=O)—O—); and a combination of the subject non-hydrocarbon-based oxygen atom-containing connecting group with an alkylene group. A sulfonyl group (—SO$_2$—) may be further connected with this combination. Examples of such a divalent oxygen atom-containing connecting group include connecting groups represented by the following formulae (y-a1-1) to (y-a1-7), respectively.

(Chemical formula 34)

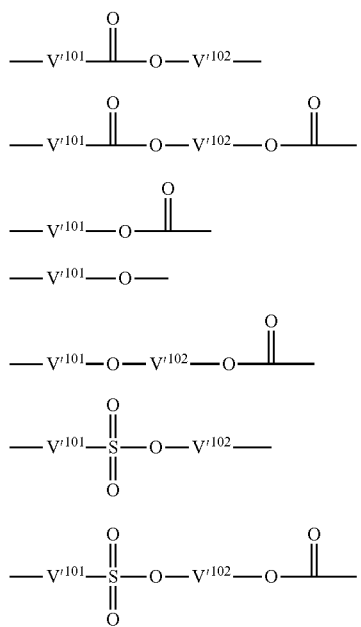

(y-a1-1)
(y-a1-2)
(y-a1-3)
(y-a1-4)
(y-a1-5)
(y-a1-6)
(y-a1-7)

In the formulae, $V'^{101}$ represents a single bond or an alkylene group having 1 to 5 carbon atoms; and $V'^{102}$ represents a divalent saturated hydrocarbon group having 1 to 30 carbon atoms.

The divalent saturated hydrocarbon group in $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group in $V'^{101}$ and $V'^{102}$ may be either a linear alkylene group or a branched alkylene group, and it is preferably a linear alkylene group.

Specifically, examples of the alkylene group in $V'^{101}$ and $V'^{102}$ include a methylene group [—CH$_2$—]; an alkylmethylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; an ethylene group [—CH$_2$CH$_2$-]; an alkylethylene group such as —CH(CH$_3$)CH$_2$—, —CH(CH$_3$)CH(CH$_3$)—, —C(CH$_3$)$_2$CH$_2$—, and —CH(CH$_2$CH$_3$)CH$_2$—; a trimethylene group (n-propylene group) [—CH$_2$CH$_2$CH$_2$-]; an alkyltrimethylene group such as —CH(CH$_3$)CH$_2$CH$_2$— and —CH$_2$CH(CH$_3$)CH$_2$—; a tetramethylene group [—CH$_2$CH$_2$CH$_2$CH$_2$-]; an alkyltetramethylene group such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$-].

In addition, a part of the methylene groups in the above-described alkylene group in $V'^{101}$ or $V'^{102}$ may be substituted with a divalent aliphatic cyclic group having 5 to 10 carbon atoms. The subject aliphatic cyclic group is preferably a divalent group in which one hydrogen atom is further eliminated from the cyclic aliphatic hydrocarbon group represented by $Ra'^3$ in the foregoing formula (a1-r-1) (a monocyclic aliphatic hydrocarbon group or a polycyclic aliphatic hydrocarbon group), and more preferably a cyclohexylene group, a 1,5-adamantylene group, or a 2,6-adamantylene group.

$Y^{101}$ is preferably a divalent connecting group containing an ester bond or a divalent connecting group containing an ether bond, and the connecting groups represented by the foregoing formulae (y-a1-1) to (y-a1-5), respectively are more preferable.

In the formula (b-1), $V^{101}$ represents a single bond, an alkylene group, or a fluorinated alkylene group. The carbon number of each of the alkylene group and the fluorinated alkylene group in $V^{101}$ is preferably 1 to 4. Examples of the fluorinated alkylene group in $V^{101}$ include a group in which a part or all of the hydrogen atoms of the alkylene group in $V^{101}$ are substituted with a fluorine atom. Above all, $V^{101}$ is preferably a single bond or a fluorinated alkylene group having 1 to 4 carbon atoms.

In the formula (b-1), $R^{102}$ represents a fluorine atom or a fluorinated alkyl group having 1 to 5 carbon atoms. $R^{102}$ is preferably a fluorine atom or a perfluoroalkyl group having 1 to 5 carbon atoms, and more preferably a fluorine atom.

As for specific examples of the anion moiety of the component (b-1), in the case where $Y^{101}$ is a single bond, examples thereof include a fluorinated alkyl sulfonate anion such as a trifluoromethane sulfonate anion and a perfluorobutane sulfonate anion; and in the case where $Y^{101}$ is a divalent connecting group containing an oxygen atom, examples thereof include anions represented by any one of the following formulae (an-1) to (an-3).

(Chemical formula 35)

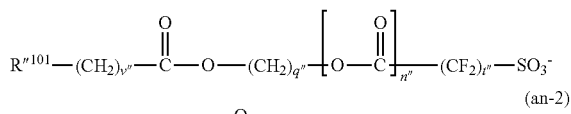

(an-1)

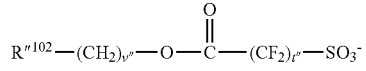

(an-2)

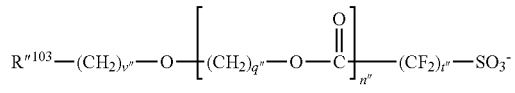

(an-3)

In the formulae, $R''^{101}$ represents an optionally substituted aliphatic cyclic group, a group represented by each of the foregoing formulae (r-hr-1) to (r-hr-6), or an optionally substituted chain alkyl group; $R''^{102}$ represents an optionally substituted aliphatic cyclic group, a lactone-containing cyclic group represented by each of the foregoing general formulae (a2-r-1) to (a2-r-7), or an —SO$_2$—-containing cyclic group represented by each of the foregoing formulae (a5-r-1) to (a5-r-4); $R''^{103}$ represents an optionally substituted aromatic cyclic group, an optionally substituted aliphatic cyclic group, or an optionally substituted chain alkenyl group; each of $v''$s is independently an integer of 0 to 3; each of $q''$s is independently an integer of 1 to 20; $t''$ is an integer of 1 to 3; and $n''$ is 0 or 1.

The optionally substituted aliphatic cyclic group represented by each of $R'''^{101}$, $R'''^{102}$, and $R'''^{103}$ is preferably the group exemplified above as the cyclic aliphatic hydrocarbon group in $R^{101}$. Examples of the substituent include the same substituents as those with which the cyclic aliphatic hydrocarbon group in $R^{101}$ may be substituted.

The optionally substituted aromatic cyclic group in $R'''^{103}$ is preferably the group exemplified above as the aromatic hydrocarbon group in the cyclic hydrocarbon group in $R^{101}$. Examples of the substituent include the same substituents as those with which the aromatic hydrocarbon group in $R^{101}$ may be substituted.

The optionally substituted chain alkyl group in $R'''^{101}$ is preferably the group exemplified above as the chain alkyl group in $R^{101}$. The optionally substituted chain alkenyl group in $R'''^{103}$ is preferably the group exemplified above as the chain alkenyl group in $R^{101}$.

Anion Moiety of the Component (b-2):

In the formula (b-2), each of $R^{104}$ and $R^{105}$ independently represents an optionally substituted cyclic group, an optionally substituted chain alkyl group, or an optionally substituted chain alkenyl group, and examples thereof include the same groups as those for $R^{101}$ in the formula (b-1). However, $R^{104}$ and $R^{105}$ may be bonded to each other to form a ring.

Each of $R^{104}$ and $R^{105}$ is preferably an optionally substituted chain alkyl group, and more preferably a linear or branched alkyl group or a linear or branched fluorinated alkyl group.

The carbon number of the chain alkyl group is preferably 1 to 10, more preferably 1 to 7, and still more preferably 1 to 3. The carbon number of the chain alkyl group represented by each of $R^{104}$ and $R^{105}$ is preferably smaller within the above-described range of the carbon number for reasons such as satisfactory solubility in a resist solvent. In addition, in the chain alkyl group represented by each of $R^{104}$ and $R^{105}$, the number of the hydrogen atoms substituted with a fluorine atom is preferably larger because the intensity of the acid becomes strong, and the transparency to a high energy light or electron beams of 200 nm or less is enhanced. A proportion of the fluorine atom in the chain alkyl group, namely a fluorination rate, is preferably 70 to 100%, and more preferably 90 to 100%. A perfluoroalkyl group in which all of hydrogen atoms thereof are substituted with a fluorine atom is the most preferable.

In the formula (b-2), each of $V^{102}$ and $V^{103}$ independently represents a single bond, an alkylene group, or a fluorinated alkylene group, and examples thereof include the same groups as those for $V^{101}$ in the formula (b-1).

In the formula (b-2), each of $L^{101}$ and $L^{102}$ independently represents a single bond or an oxygen atom.

Anion Moiety of the Component (b-3):

In the formula (b-3), each of $R^{106}$ to $R^{108}$ independently represents an optionally substituted cyclic group, an optionally substituted chain alkyl group, or an optionally substituted chain alkenyl group, and examples thereof include the same groups as those for $R^{101}$ in the formula (b-1).

Each of $L^{103}$ to $L^{105}$ independently represents a single bond, —CO—, or —$SO_2$—.

{Cation Moiety}

In the formulae (b-1), (b-2), and (b-3), m is an integer of 1 or more; and $M'^{m+}$ represents an m-valent onium cation, and suitably, examples of the onium cation include a sulfonium cation and an iodonium cation. Organic cations represented by the following general formulae (ca-1) to (ca-4), respectively are especially preferable.

(Chemical formula 36)

(ca-1)

(ca-2)

(ca-3)

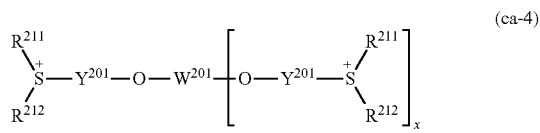
(ca-4)

In the formulae, each of $R^{201}$ to $R^{207}$ and $R^{211}$ to $R^{212}$ independently represents an aryl group, an alkyl group, or an alkenyl group, each of which may have a substituent, and $R^{201}$ to $R^{203}$, $R^{206}$ to $R^{207}$ or $R^{211}$ to $R^{212}$ may be bonded to each other to form a ring together with a sulfur atom in each formula; each of $R^{208}$ to $R^{209}$ independently represents a hydrogen atom or an alkyl group having 1 to 5 carbon atoms; $R^{210}$ represents an optionally substituted aryl group, an optionally substituted alkyl group, an optionally substituted alkenyl group, or an optionally substituted —$SO_2$—-containing cyclic group; $L^{201}$ represents —C(=O)— or —C(=O)—O—; each of $Y^{201}$s independently represents an arylene group, an alkylene group, or an alkenylene group; x is 1 or 2; and $W^{201}$ represents an (x+1)-valent connecting group.

Examples of the aryl group in $R^{201}$ to $R^{207}$ and $R^{211}$ to $R^{212}$ include an unsubstituted aryl group having 6 to 20 carbon atoms, and the aryl group is preferably a phenyl group or a naphthyl group.

The alkyl group in $R^{201}$ to $R^{207}$ and $R^{211}$ to $R^{212}$ is preferably a chain or cyclic alkyl group having 1 to 30 carbon atoms.

The carbon number of the alkenyl group in $R^{201}$ to $R^{207}$ and $R^{211}$ to $R^{212}$ is preferably 2 to 10.

Examples of the substituent which each of $R^{201}$ to $R^{207}$ and $R^{211}$ to $R^{212}$ may have include an alkyl group, a halogen atom, a halogenated alkyl group, a carbonyl group, a cyano group, an amino group, an aryl group, and groups represented by the following formulae (ca-r-1) to (ca-r-7), respectively.

(Chemical formula 37)

[ca-r-1]

[ca-r-2]

[ca-r-3]

[ca-r-4]

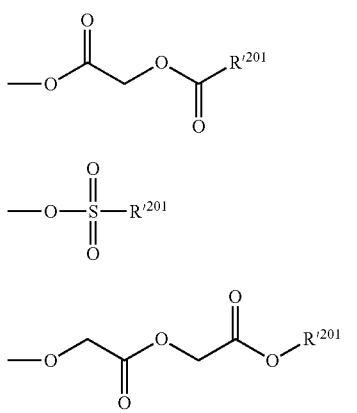

[ca-r-5]

[ca-r-6]

[ca-r-7]

In the formulae, each of $R'^{201}$s independently represents a hydrogen atom, an optionally substituted cyclic group, an optionally substituted chain alkyl group, or an optionally substituted chain alkenyl group.

Examples of the optionally substituted cyclic group, the optionally substituted chain alkyl group, or the optionally substituted chain alkenyl group represented by $R'^{201}$ include the same groups as those for $R^{101}$ in the foregoing formula (b-1). Besides, examples of the optionally substituted cyclic group or the optionally substituted chain alkyl group include the same acid dissociable group represented by the foregoing formula (a1-r-2).

In the case where $R^{201}$ to $R^{203}$, $R^{206}$ to $R^{207}$, or $R^{211}$ to $R^{212}$ are bonded to each other to form a ring together with a sulfur atom in each formula, they may be bonded to each other via a hetero atom such as a sulfur atom, an oxygen atom, and a nitrogen atom, or a functional group such as a carbonyl group, —SO—, —SO$_2$—, —SO$_3$—, —COO—, —CONH—, and —N(R$_N$)— (R$_N$ represents an alkyl group having 1 to 5 carbon atoms). As for the ring to be formed, one ring containing a sulfur atom in the formula in a ring skeleton thereof is preferably a 3- to 10-membered ring, and especially preferably a 5- to 7-membered ring including the sulfur atom. Specific examples of the ring to be formed include a thiophene ring, a thiazole ring, a benzothiophene ring, a thianthrene ring, a dibenzothiophene ring, a 9H-thioxanthene ring, a thioxanthone ring, a phenoxathiin ring, a tetrahydrothiophenium ring, and a tetrahydrothiopyranium ring.

Each of $R^{208}$ to $R^{209}$ independently represents a hydrogen atom or an alkyl group having 1 to 5 carbon atoms. Of these, a hydrogen atom or an alkyl group having 1 to 3 carbon atoms is preferable. In the case where each of $R^{208}$ to $R^{209}$ is an alkyl group, they may be bonded to each other to form a ring.

$R^{210}$ represents an optionally substituted aryl group, an optionally substituted alkyl group, an optionally substituted alkenyl group, or an optionally substituted —SO$_2$—-containing cyclic group.

Examples of the aryl group in $R^{210}$ include an unsubstituted aryl group having 6 to 20 carbon atoms. Above all, a phenyl group or a naphthyl group is preferable.

Examples of the alkyl group in $R^{210}$ include a chain or cyclic alkyl group. Above all, an alkyl group having 1 to 30 carbon atoms is preferable.

The carbon number of the alkenyl group in $R^{210}$ is preferably 2 to 10.

Examples of the optionally substituted —SO$_2$—-containing cyclic group in $R^{210}$ include the same —SO$_2$—-containing cyclic groups as those exemplified above for the "—SO$_2$—-containing cyclic group". Above all, the group represented by the general formula (a5-r-1) is preferable.

Each of $Y^{201}$s independently represents an arylene group, an alkylene group, or an alkenylene group.

Examples of the arylene group in $Y^{201}$ include a group in which one hydrogen atom is eliminated from an aryl group exemplified as the aromatic hydrocarbon group in $R^{101}$ in the foregoing formula (b-1).

Examples of the alkylene group and the alkenylene group in $Y^{201}$ include groups in which one hydrogen atom is eliminated from a group exemplified as the chain alkyl group or the chain alkenyl group in $R^{101}$ in the foregoing formula (b-1).

In the foregoing formula (ca-4), x is 1 or 2.

$W^{201}$ represents an (x+1)-valent (i.e., divalent or trivalent) connecting group.

The divalent connecting group in $W^{201}$ is preferably an optionally substituted divalent hydrocarbon group, and examples thereof include the same optionally substituted divalent hydrocarbon groups as those exemplified for $Ya^{21}$ in the foregoing general formula (a2-1). The divalent connecting group in $W^{201}$ may be linear, branched, or cyclic, and it is preferably cyclic. Above all, a group in which two carbonyl groups are combined at both ends of an arylene group is preferable. Examples of the arylene group include a phenylene group and a naphthylene group, with a phenylene group being especially preferable.

Examples of the trivalent connecting group in $W^{201}$ include a group in which one hydrogen atom is eliminated from the above-described divalent connecting group in $W^{201}$ and a group in which the above-described divalent connecting group is further bonded to the above-described divalent connecting group. The trivalent connecting group in $W^{201}$ is preferably a group in which two carbonyl groups are bonded to an arylene group.

Specifically, suitable examples of the cation represented by the foregoing formula (ca-1) include cations represented by the following formulae (ca-1-1) to (ca-1-67), respectively.

(Chemical formula 38)

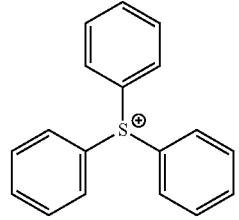

(ca-1-1)

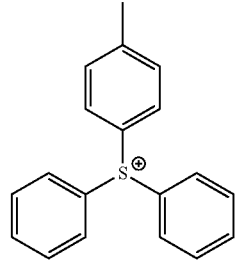

(ca-1-2)

(ca-1-3)
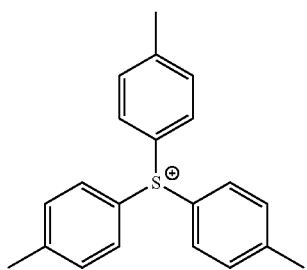
(ca-1-4)
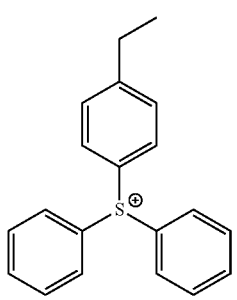
(ca-1-5)
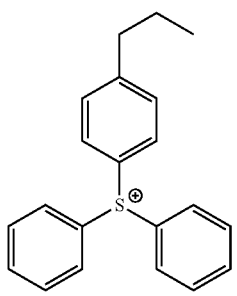
(ca-1-6)
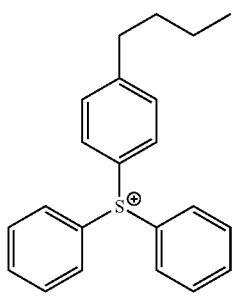
(ca-1-7)
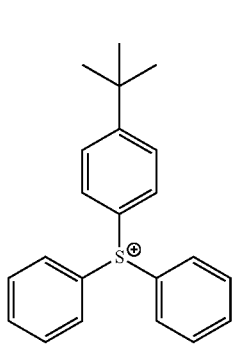
(ca-1-8)
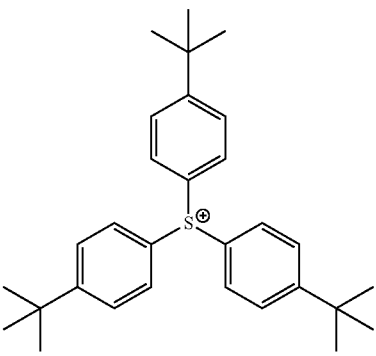
(ca-1-9)
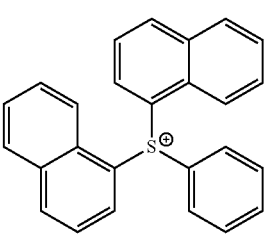
(ca-1-10)
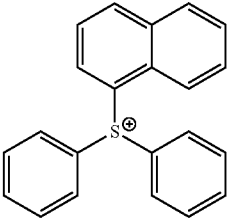
(ca-1-11)
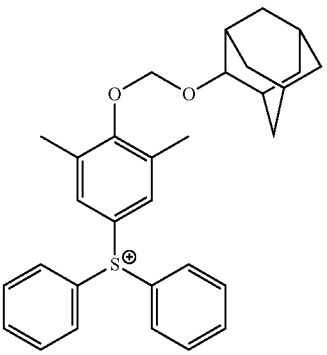
(ca-1-12)
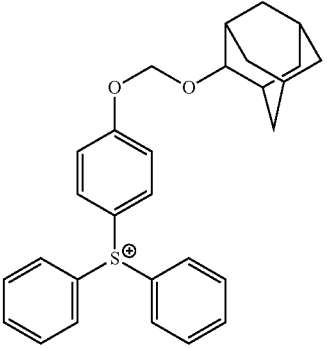

-continued
(ca-1-13)
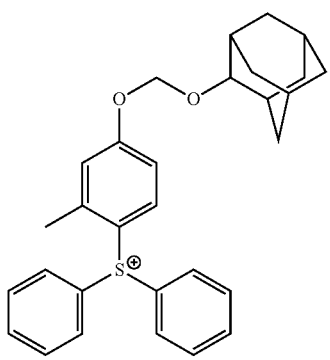
(ca-1-14)
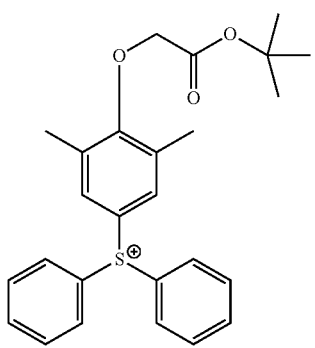
(ca-1-15)
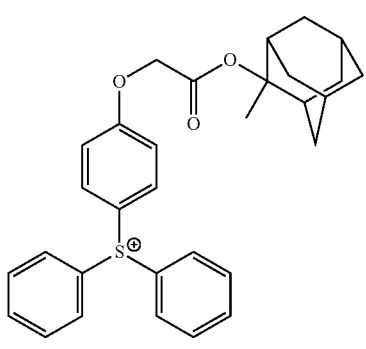
(ca-1-16)
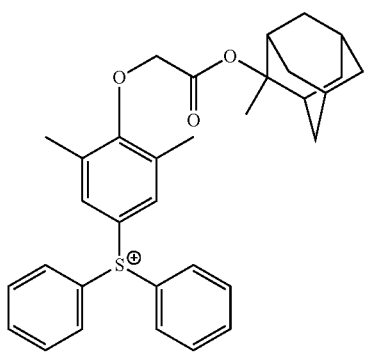
-continued
(Chemical formula 39)
(ca-1-17)
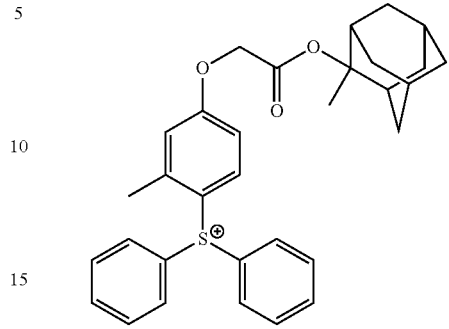
(ca-1-18)
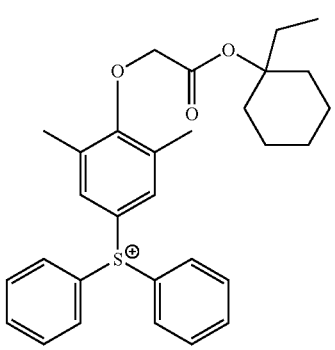
(ca-1-19)
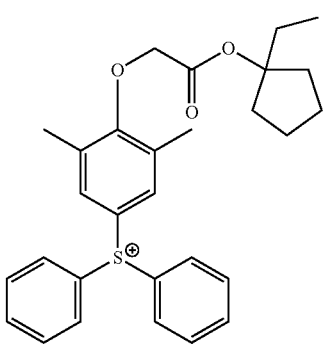
(ca-1-20)
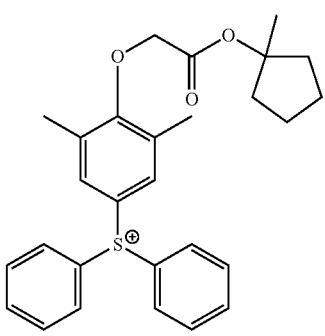

(ca-1-21)
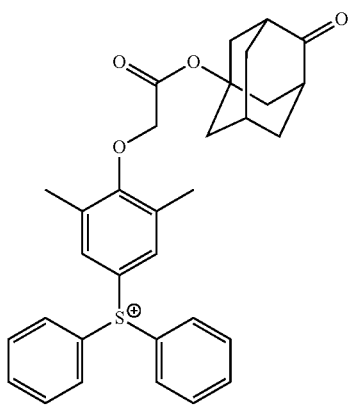
(ca-1-25)
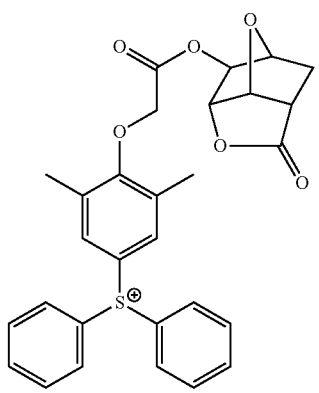
(ca-1-22)
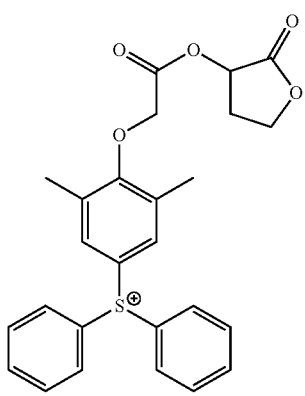
(ca-1-26)
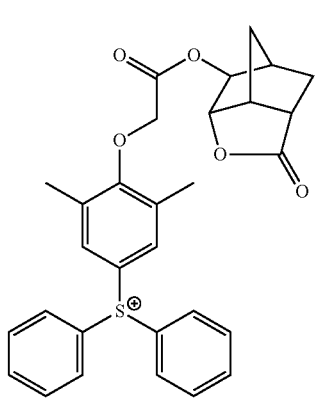
(ca-1-23)
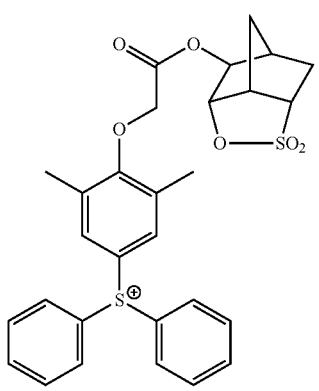
(ca-1-27)
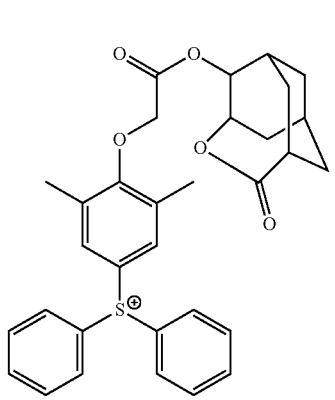
(ca-1-24)
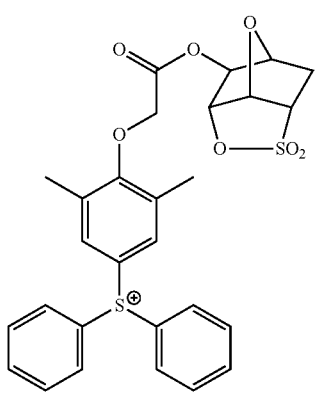
(ca-1-28)
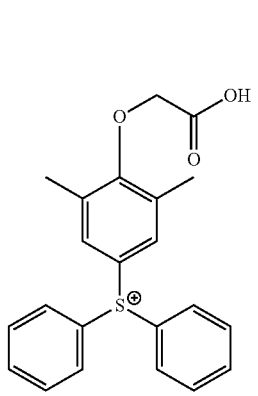

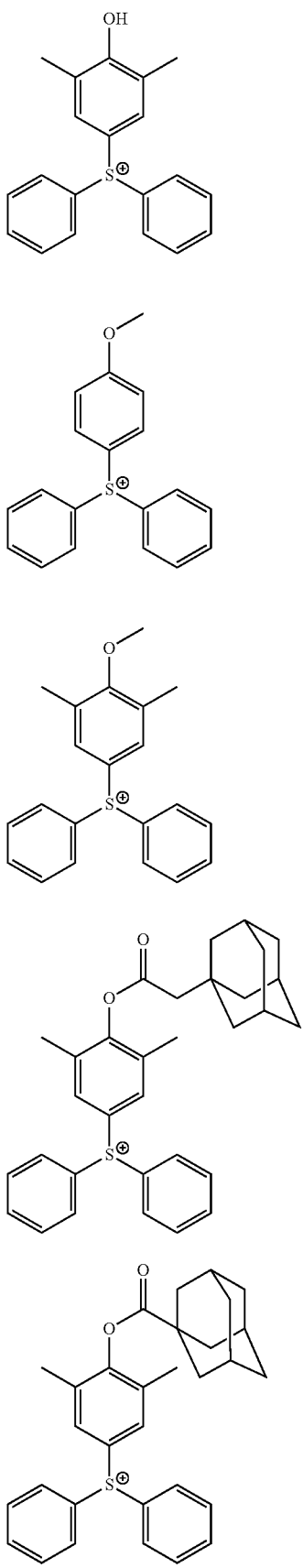
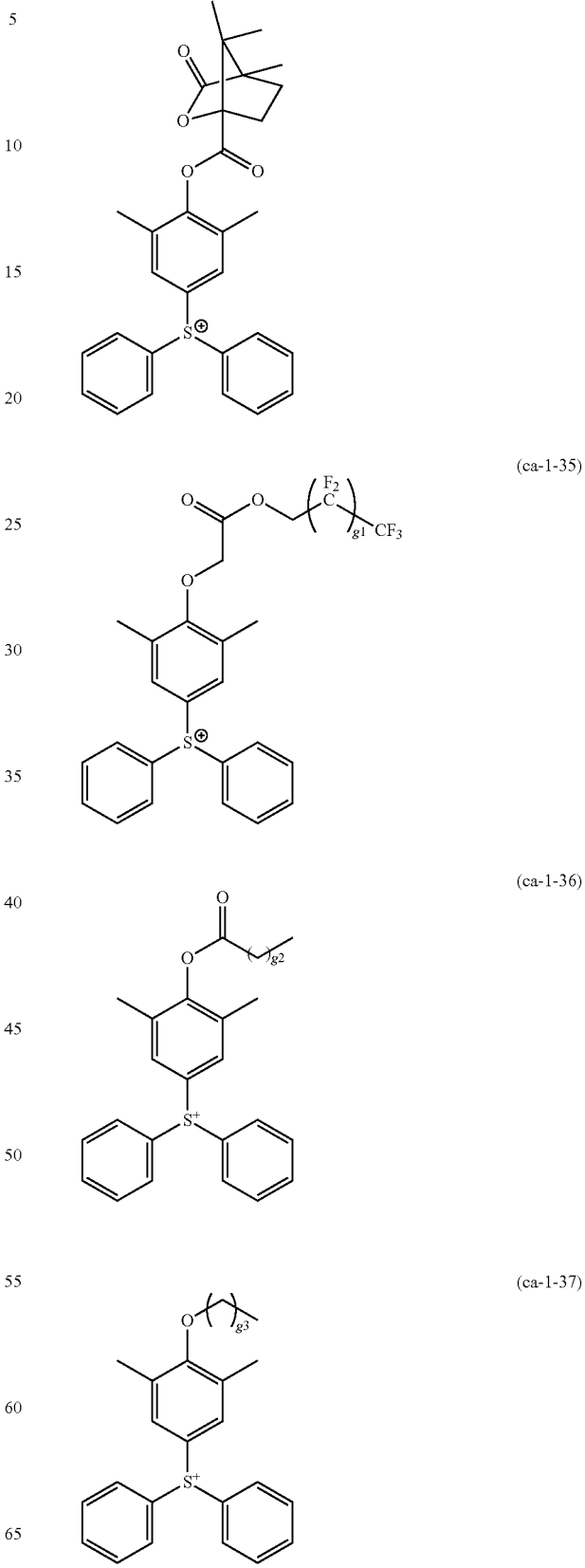

(ca-1-38)
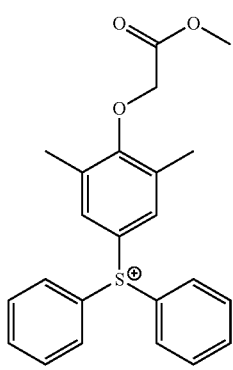
(ca-1-39)
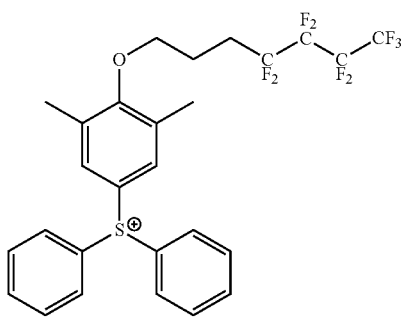
(ca-1-40)
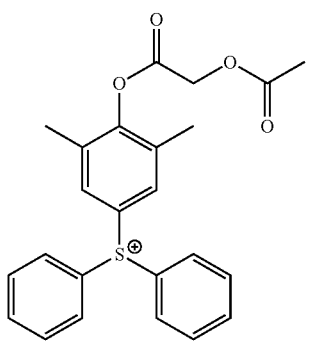
(ca-1-41)
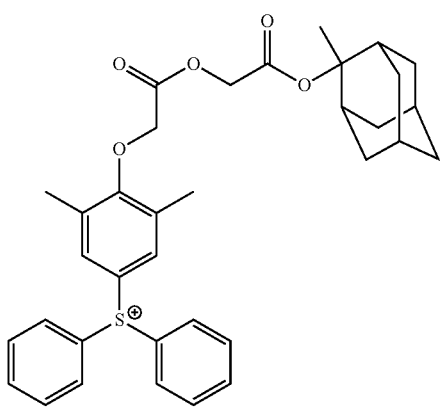
(ca-1-42)
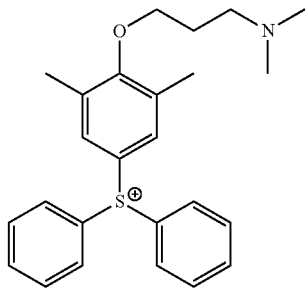
(ca-1-43)
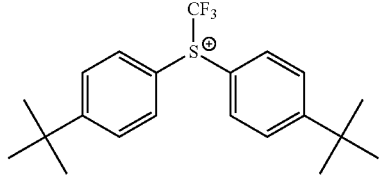
(ca-1-44)
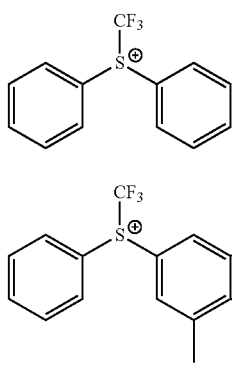
(ca-1-45)
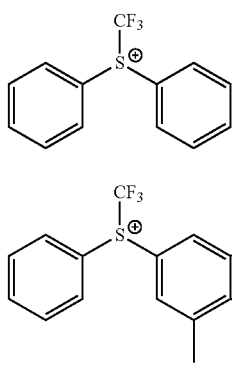
(ca-1-46)
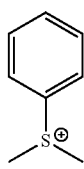
(ca-1-47)
(ca-1-48)
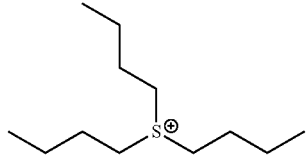
(ca-1-49)
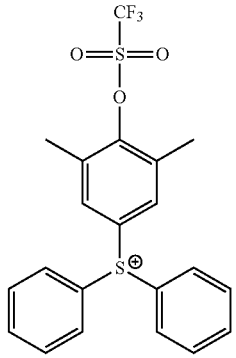

(ca-1-50)
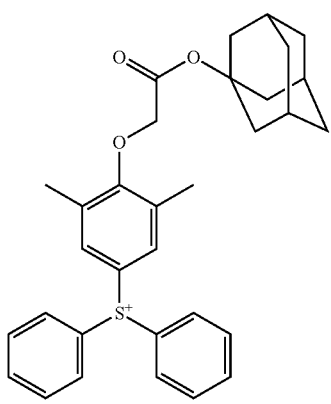
(ca-1-51)
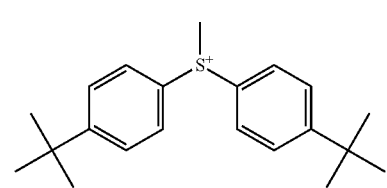
In the formulae, each of g1, g2, and g3 represents a repeating number; g1 is an integer of 1 to 5; g2 is an integer of 0 to 20; and g3 is an integer of 0 to 20.
(Chemical formula 41)
(ca-1-52)
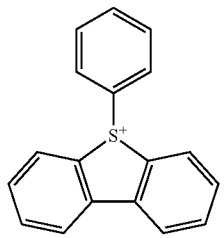
(ca-1-53)
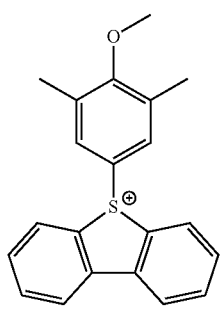
(ca-1-54)
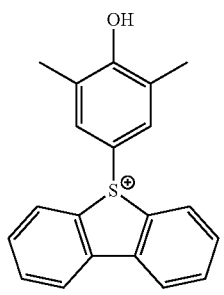
(ca-1-55)
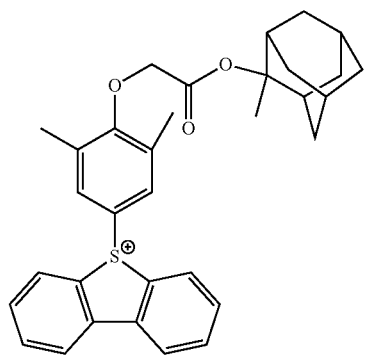
(ca-1-56)
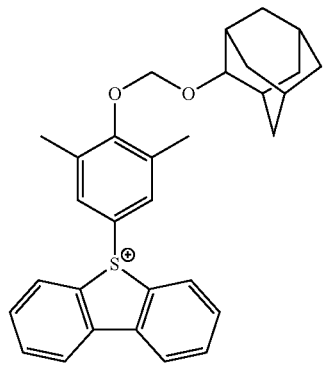
(ca-1-57)
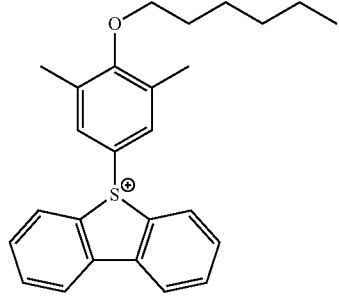
(ca-1-58)
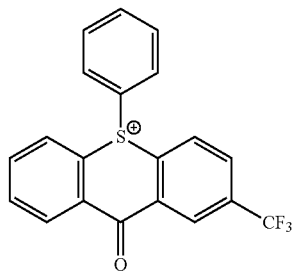
(ca-1-59)
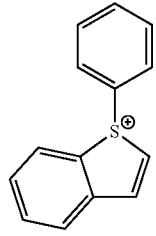

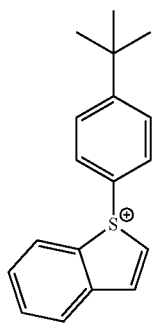
(ca-1-60)

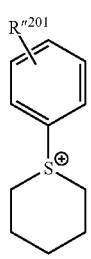
(ca-1-61)

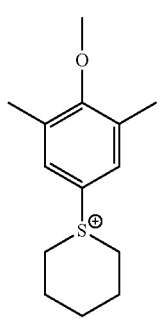
(ca-1-62)

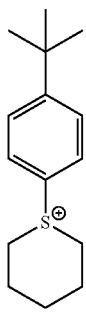
(ca-1-63)

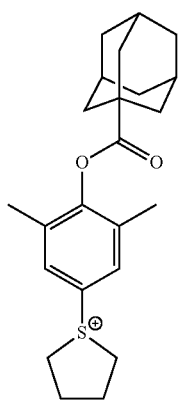
(ca-1-64)

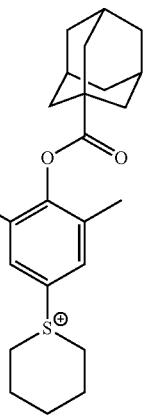
(ca-1-65)

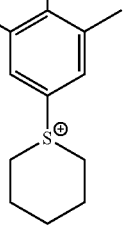
(ca-1-66)

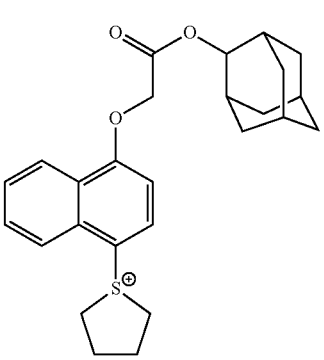
(ca-1-67)

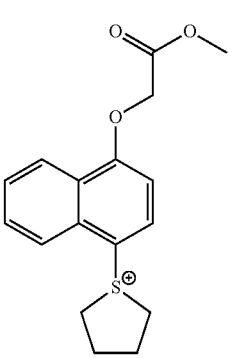

In the formulae, $R''^{201}$ represents a hydrogen atom or a substituent, and examples of the substituent include the same groups as those exemplified above for the substituent which each of $R^{201}$ to $R^{207}$ and $R^{210}$ to $R^{212}$ may have.

Specifically, suitable examples of the cation represented by the foregoing formula (ca-2) include a diphenyl iodonium cation and a bis(4-tert-butylphenyl) iodonium cation.

Specifically, suitable examples of the cation represented by the foregoing formula (ca-3) include cations represented by the following formulae (ca-3-1) to (ca-3-6), respectively.

(Chemical formula 42)

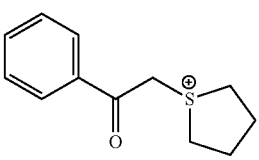
(ca-3-1)

-continued (ca-3-2)

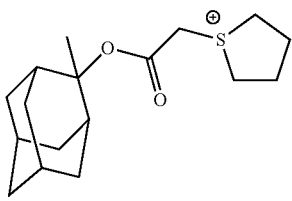

(ca-3-3)

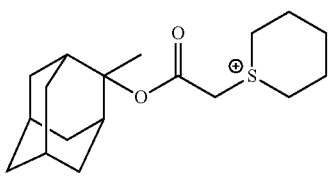

(ca-3-4)

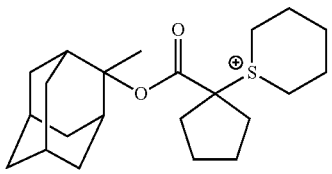

(ca-3-5)

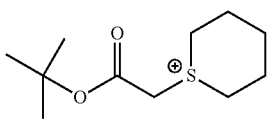

(ca-3-6)

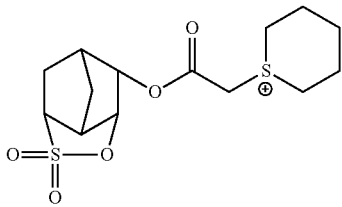

Specifically, suitable examples of the cation represented by the foregoing formula (ca-4) include cations represented by the following formulae (ca-4-1) to (ca-4-2), respectively.

(Chemical formula 43)

(ca-4-1)

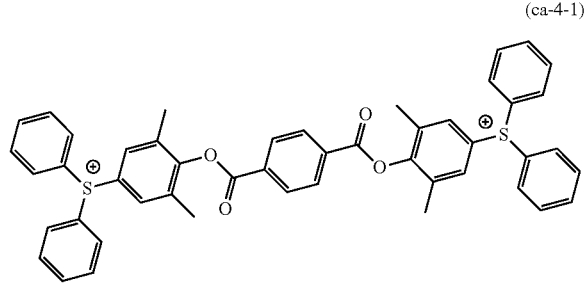

-continued (ca-4-2)

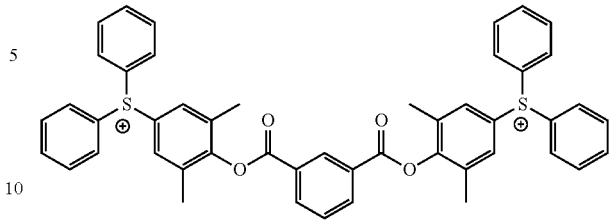

Among the foregoing, the cation moiety $[(M^{m+})_{1/m}]$ is preferably the cation represented by the general formula (ca-1), and more preferably the cation represented by each of the formulae (ca-1-1) to (ca-1-67).

In the component (B), the above-described acid generator may be used solely, or may be used in combination of two or more kinds thereof.

In the case where the resist composition contains the component (B), a content of the component (B) is preferably 0.5 to 60 mass parts, more preferably 1 to 50 mass parts, and still more preferably 1 to 40 mass parts based on 100 mass parts of the component (A).

By allowing the content of the component (B) to fall within the foregoing range, the pattern formation is sufficiently conducted. In addition, on the occasion of dissolving the respective components of the resist composition in an organic solvent, a uniform solution is easily obtained, and the storage stability as a resist composition becomes satisfactory, and hence, such is preferable.

[Component (D): Acid Diffusion Control Agent Component]

The resist composition of the present invention may also further contain, in addition to the component (A), or in addition to the component (A) and the component (B), an acid diffusion control agent component (hereinafter referred to as "component (D)"). The component (D) acts as a quencher (acid diffusion control agent) which traps an acid generated in the resist composition upon exposure.

The component (D) may be a photodegradable base (D1) (hereinafter referred to as "component (D1)") which is decomposed upon exposure to lose acid diffusion control properties, or may be a nitrogen-containing organic compound (D2) (hereinafter referred to as "component (D2)") which does not fall under the definition of the component (D1).

Re: Component (D1)

When a resist composition containing the component (D1) is formed, on the occasion of forming a resist pattern, a contrast between exposed areas and unexposed areas can be enhanced.

Though the component (D1) is not particularly limited so long as it is decomposed upon exposure to lose acid diffusion control properties, the component (D1) is preferably at least one compound selected from the group consisting of a compound represented by the following general formula (d1-1) (hereinafter referred to as "component (d1-1)"), a compound represented by the following general formula (d1-2) (hereinafter referred to as "component (d1-2)"), and a compound represented by the following general formula (d1-3) (hereinafter referred to as "component (d1-3)").

Each of the components (d1-1) to (d1-3) does not act as a quencher in exposed areas of the resist film because it is decomposed to lose acid diffusion control properties (basicity) but acts as a quencher in unexposed areas of the resist film.

(Chemical formula 44)

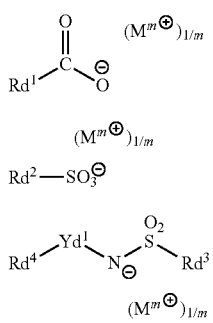

In the formulae, each of $Rd^1$ to $Rd^4$ represents an optionally substituted cyclic group, an optionally substituted chain alkyl group, or an optionally substituted chain alkenyl group, provided that a fluorine atom is not bonded to the carbon atom adjacent to the S atom in $Rd^2$ in the formula (d1-2); $Yd^1$ represents a single bond or a divalent connecting group; m is an integer of 1 or more; and each of $M^{m+}$s independently represents an m-valent organic cation.

{Component (d1-1)}
Anion Moiety:

In the formula (d1-1), $Rd^1$ represents an optionally substituted cyclic group, an optionally substituted chain alkyl group, or an optionally substituted chain alkenyl group, and examples of these groups include the same groups as those for $R^{101}$ in the foregoing formula (b-1), respectively.

Above all, $Rd^1$ is preferably an optionally substituted aromatic hydrocarbon group, an optionally substituted aliphatic cyclic group, or an optionally substituted chain alkyl group. Examples of the substituent which each of these groups may have include a hydroxyl group, an oxo group, an alkyl group, an aryl group, a fluorine atom, a fluorinated alkyl group, the lactone-containing cyclic groups represented by each of the foregoing general formulae (a2-r-1) to (a2-r-7), an ether bond, an ester bond, and combinations thereof. In the case where an ether bond or an ester bond is contained as the substituent, an alkylene group may be allowed to intervene therein. In that case, the substituent is preferably the connecting group represented by each of the foregoing formulae (y-a1-1) to (y-a1-5).

The aromatic hydrocarbon group is more preferably a phenyl group or a naphthyl group.

The aliphatic cyclic group is more preferably a group in which one or more hydrogen atoms are eliminated from a polycycloalkane such as adamantane, norbornane, isobornane, tricyclodecane, and tetracyclododecane.

The carbon number of the chain alkyl group is preferably 1 to 10. Specifically, examples of the chain alkyl group include a linear alkyl group such as a methyl group, an ethyl group, a propyl group, a butyl group, a pentyl group, a hexyl group, a heptyl group, an octyl group, a nonyl group, and a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

In the case where the chain alkyl group is a fluorinated alkyl group having, as a substituent, a fluorine atom or a fluorinated alkyl group, the carbon number of the fluorinated alkyl group is preferably 1 to 11, more preferably 1 to 8, and still more preferably 1 to 4. The fluorinated alkyl group may also contain an atom other than a fluorine atom. Examples of the atom other than a fluorine atom include an oxygen atom, a sulfur atom, and a nitrogen atom.

$Rd^1$ is preferably a fluorinated alkyl group in which a part or all of hydrogen atoms constituting a linear alkyl group are substituted with a fluorine atom, and especially preferably a fluorinated alkyl group (linear perfluoroalkyl group) in which all of hydrogen atoms constituting a linear alkyl group are substituted with a fluorine atom.

Preferred specific examples of the anion moiety of the component (d1-1) are given below.

(Chemical formula 45)

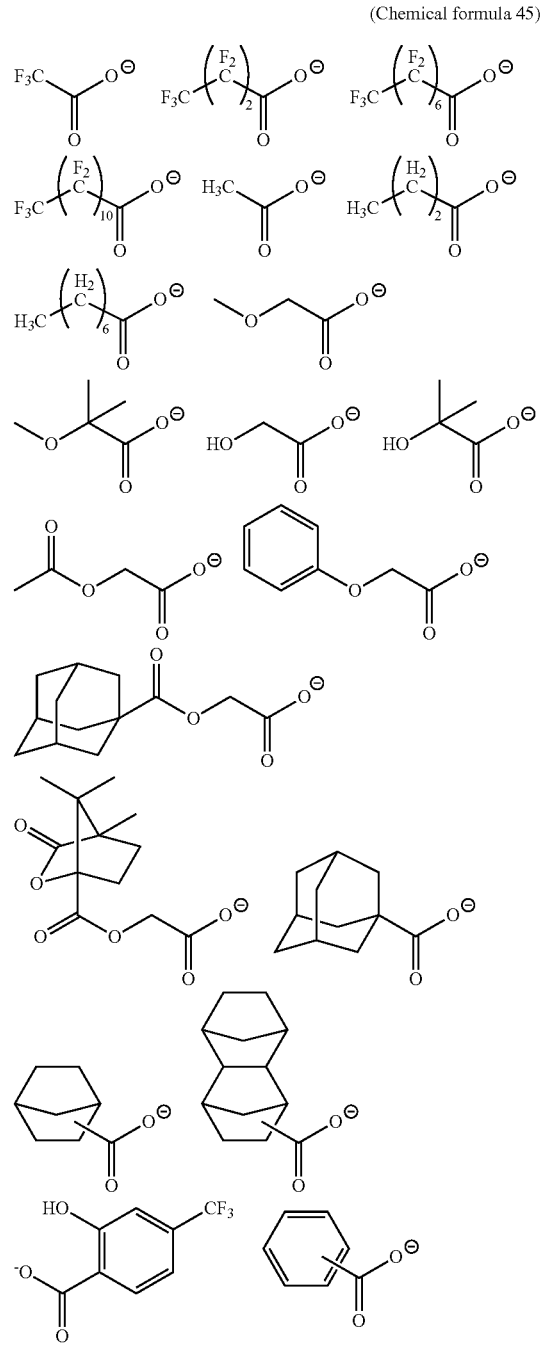

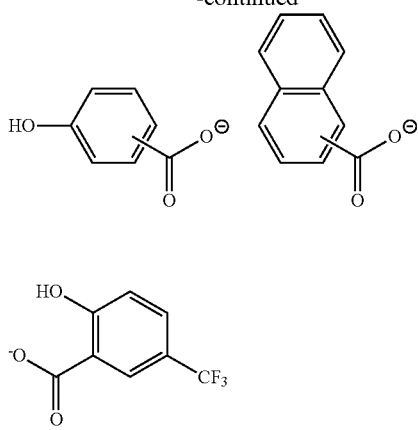

Cation Moiety:

In the formula (d1-1), $M^{m+}$ represents an m-valent organic cation.

Suitable examples of the organic cation represented by $M^{m+}$ include the same cations as those represented by the foregoing general formulae (ca-1) to (ca-4), respectively. Of these, the cations represented by the foregoing general formula (ca-1) are more preferable, and the cations represented by the foregoing formulae (ca-1-1) to (ca-1-67), respectively are still more preferable.

The component (d1-1) may be used solely, or may be used in combination of two or more kinds thereof.

{Component (d1-2)}

Anion Moiety:

In the formula (d1-2), $Rd^2$ represents an optionally substituted cyclic group, an optionally substituted chain alkyl group, or an optionally substituted chain alkenyl group, and examples of these groups include the same groups as those for $R^{101}$ in the foregoing formula (b-1).

However, it is to be noted that a fluorine atom is not bonded to the carbon atom adjacent to the S atom in $Rd^2$ (there is no fluorine substitution). According to this, the anion of the component (d1-2) becomes an appropriately weak acid anion, whereby the quenching ability as the component (D) is enhanced.

$Rd^2$ is preferably an optionally substituted chain alkyl group or an optionally substituted aliphatic cyclic group. The carbon number of the chain alkyl group is preferably 1 to 10, and more preferably 3 to 10. The aliphatic cyclic group is more preferably a group in which one or more hydrogen atoms are eliminated from adamantane, norbornane, isobornane, tricyclodecane, tetracyclododecane, or the like (the group may have a substituent); or a group in which one or more hydrogen atoms are eliminated from camphor or the like.

The hydrocarbon group represented by $Rd^2$ may have a substituent. Examples of the substituent include the same groups as those exemplified above for the substituent which the hydrocarbon group (an aromatic hydrocarbon group, an aliphatic cyclic group, or a chain alkyl group) in $Rd^1$ in the foregoing formula (d1-1) may have.

Preferred specific examples of the anion moiety of the component (d1-2) are given below.

(Chemical formula 46)

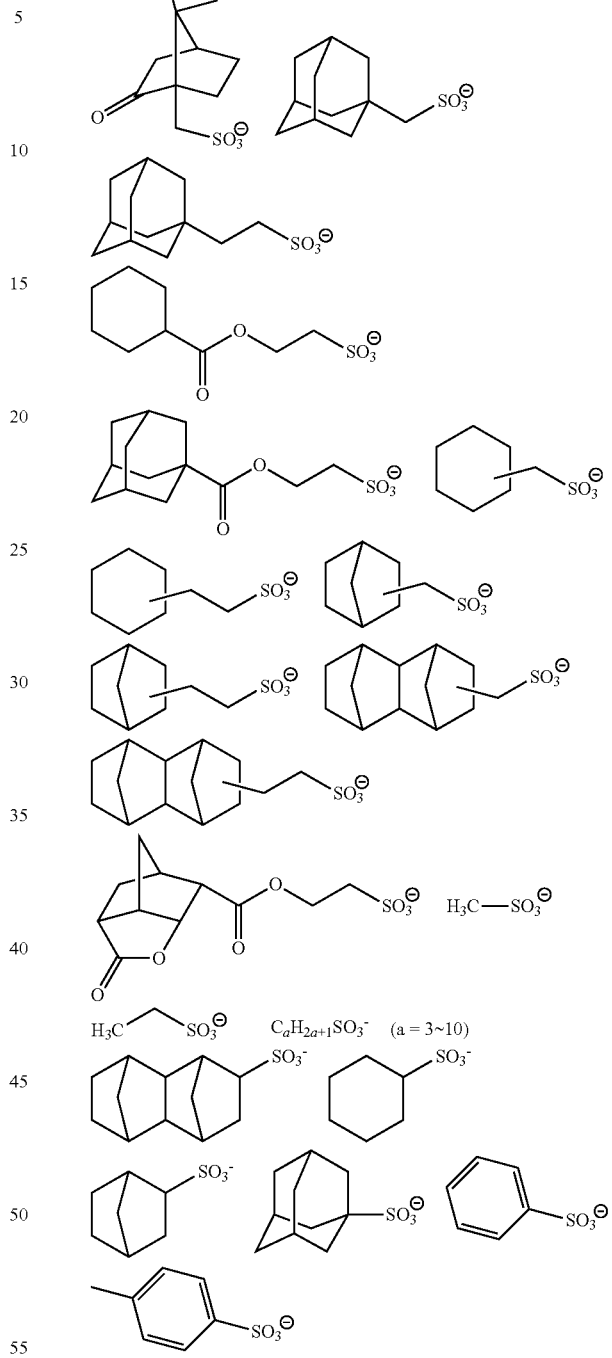

Cation Moiety:

In the formula (d1-2), $M^{m+}$ represents an m-valent organic cation and is the same as $M^{m+}$ in the foregoing formula (d1-1).

The component (d1-2) may be used solely or in combination of two or more kinds thereof.

{Component (d1-3)}

Anion Moiety:

In the formula (d1-3), $Rd^3$ represents an optionally substituted cyclic group, an optionally substituted chain alkyl group, or an optionally substituted chain alkenyl group, and examples of these groups include the same groups as those for $R^{101}$ in the foregoing formula (b-1). $Rd^3$ is preferably a cyclic group, a chain alkyl group, or a chain alkenyl group, each of which contains a fluorine atom. Above all, $Rd^3$ is preferably a fluorinated alkyl group, and more preferably the same fluorinated alkyl group as that for $Rd^1$ as described above.

In the formula (d1-3), $Rd^4$ represents an optionally substituted cyclic group, an optionally substituted chain alkyl group, or an optionally substituted chain alkenyl group, and examples of these groups include the same groups as those for $R^{101}$ in the foregoing formula (b-1).

Above all, $Rd^4$ is preferably an alkyl group, an alkoxy group, an alkenyl group, or a cyclic group, each of which may have a substituent.

The alkyl group in $Rd^4$ is preferably a linear or branched alkyl group having 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group. A part of the hydrogen atoms of the alkyl group represented by $Rd^4$ may be substituted with a hydroxyl group, a cyano group, or the like.

The alkoxy group in $Rd^4$ is preferably an alkoxy group having 1 to 5 carbon atoms. Specifically, examples of the alkoxy group having 1 to 5 carbon atoms include a methoxy group, an ethoxy group, an n-propoxy group, an isopropoxy group, an n-butoxy group, and a tert-butoxy group. Above all, a methoxy group or an ethoxy group is preferable.

Examples of the alkenyl group in $Rd^4$ include the same groups as those for $R^{101}$ in the foregoing formula (b-1). Above all, a vinyl group, a propenyl group (allyl group), a 1-methylpropenyl group, or a 2-methylpropenyl group is preferable. Each of these groups may further have, as a substituent, an alkyl group having 1 to 5 carbon atoms or a halogenated alkyl group having 1 to 5 carbon atoms.

Examples of the cyclic group in $Rd^4$ include the same groups as those for $R^{101}$ in the foregoing formula (b-1). Above all, an alicyclic group in which one or more hydrogen atoms are eliminated from a cycloalkane such as cyclopentane, cyclohexane, adamantane, norbornane, isobornane, tricyclodecane, and tetracyclododecane, or an aromatic group such as a phenyl group and a naphthyl group, is preferable. In the case where $Rd^4$ is an alicyclic group, in view of the fact that the resist composition is well dissolved in an organic solvent, the lithography properties become satisfactory. In addition, in the case where $Rd^4$ is an aromatic group, in the lithography using EUV or the like as an exposure light source, the resist composition exhibits excellent light absorption efficiency and satisfactory sensitivity and lithography properties.

In the formula (d1-3), $Yd^1$ represents a single bond or a divalent connecting group.

Though the divalent connecting group in $Yd^1$ is not particularly limited, examples thereof include an optionally substituted divalent hydrocarbon group (an aliphatic hydrocarbon group or an aromatic hydrocarbon group) and a divalent connecting group containing a hetero atom. Examples of each of these groups include the same groups as those for the optionally substituted divalent hydrocarbon group and the divalent connecting group containing a hetero atom exemplified above in the explanation regarding the divalent connecting group represented by $Ya^{21}$ in the foregoing formula (a2-1).

$Yd^1$ is preferably a carbonyl group, an ester bond, an amide bond, an alkylene group, or a combination thereof. The alkylene group is more preferably a linear or branched alkylene group, and still more preferably a methylene group or an ethylene group.

Preferred specific examples of the anion moiety of the component (d1-3) are given below.

(Chemical formula 47)

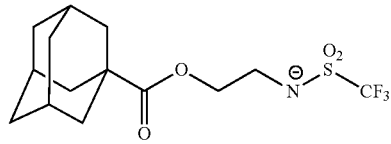

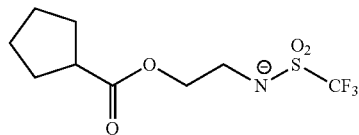

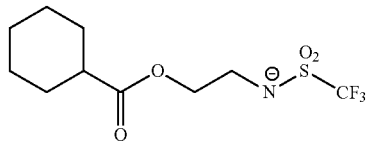

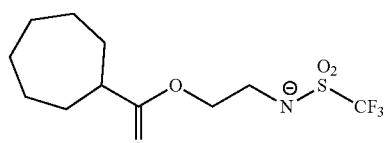

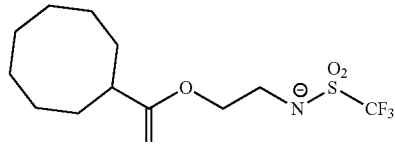

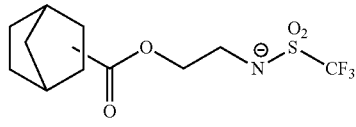

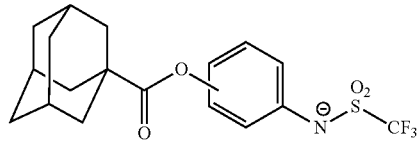

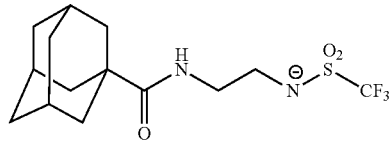

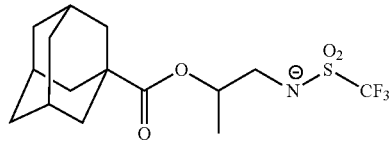

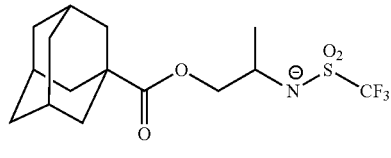

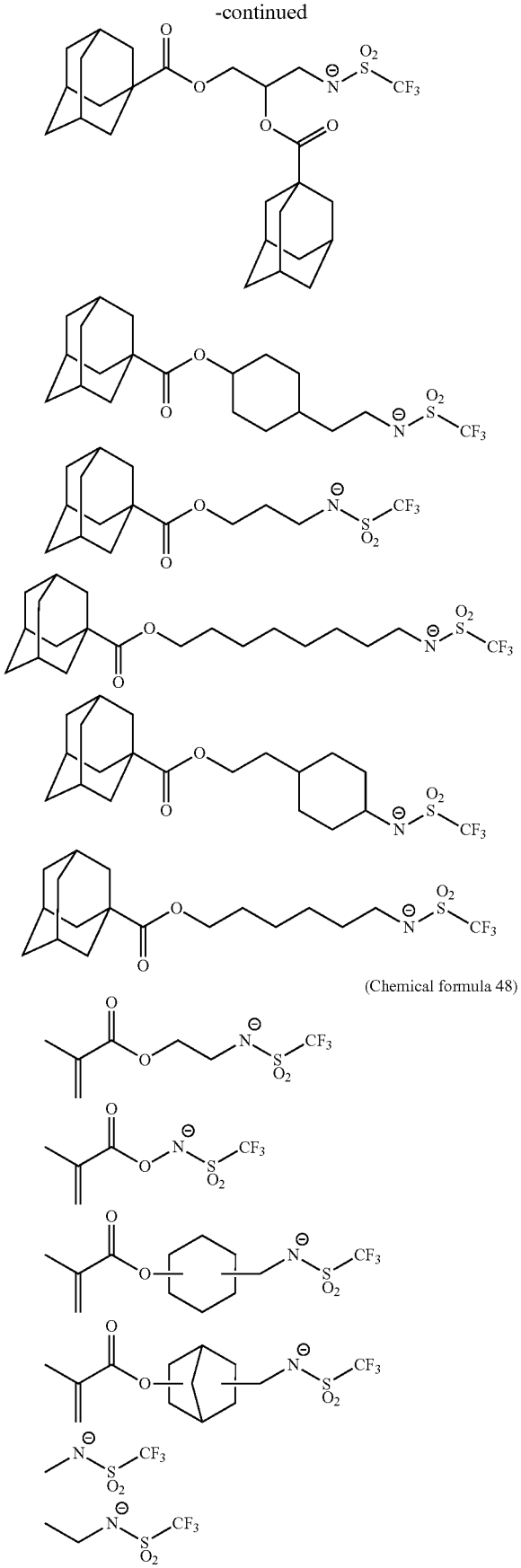

(Chemical formula 48)

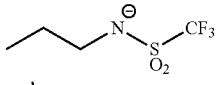
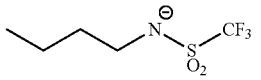
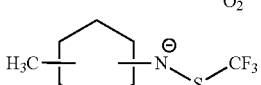
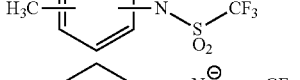
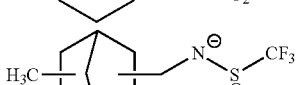
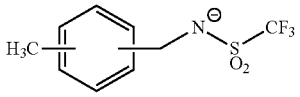

Cation Moiety:

In the formula (d1-3), $M^{m+}$ represents an m-valent organic cation and is the same as $M^{m+}$ in the foregoing formula (d1-1).

The component (d1-3) may be used solely, or may be used in combination of two or more kinds thereof.

As the component (D1), only one kind of the above-described components (d1-1) to (d1-3) may be used, or a combination of two or more kinds thereof may also be used.

In the case where the resist composition contains the component (D1), a content of the component (D1) is preferably 0.5 to 10 mass parts, more preferably 0.5 to 8 mass parts, and still more preferably 1 to 8 mass parts based on 100 mass parts of the component (A).

When the content of the component (D1) is the preferred lower limit value or more, especially satisfactory lithography properties and resist pattern shape are easily obtained. On the other hand, when it is the upper limit value or less, the sensitivity can be maintained at a satisfactory level, and the throughput becomes excellent.

Production Method of Component (D1):

A production method of each of the above-described component (d1-1) and component (d1-2) is not particularly limited, and each of the component (d1-1) and the component (d1-2) can be produced by a known method.

In addition, a production method of the component (d1-3) is not particularly limited, and the component (d1-3) is produced in the same method as a method disclosed in, for example, US-A-2012-0149916.

Re: Component (D2)

As the acid diffusion control agent component, a nitrogen-containing organic compound component (hereinafter referred to as "component (D2)") which does not fall under the definition of the above-described component (D1) may be contained.

The component (D2) is not particularly limited so long as it acts as an acid diffusion control agent and does not fall under the definition of the component (D1), and any known compound may be arbitrarily used. Above all, an aliphatic amine is preferable. Above all, in particular, a secondary aliphatic amine or a tertiary aliphatic amine is more preferable.

The aliphatic amine refers to an amine having one or more aliphatic groups, and the carbon number of the aliphatic group is preferably 1 to 12.

Examples of the aliphatic amine include an amine in which at least one of hydrogen atoms of ammonia $NH_3$ is substituted with an alkyl group or a hydroxyalkyl group each having not more than 12 carbon atoms (i.e., an alkylamine or an alkyl alcoholamine) and a cyclic amine.

Specific examples of the alkylamine and the alkyl alcoholamine include a monoalkylamine such as n-hexylamine, n-heptylamine, n-octylamine, n-nonylamine, and n-decylamine; a dialkylamine such as diethylamine, di-n-propylamine, di-n-heptylamine, di-n-octylamine, and dicyclohexylamine; a trialkylamine such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and an alkyl alcoholamine such as diethanolamine, triethanolamine, diisopropanolamine, triisopropanolamine, di-n-octanolamine, and tri-n-octanolamine. Of these, a trialkylamine having 5 to 10 carbon atoms is more preferable, and tri-n-pentylamine or tri-n-octylamine is especially preferable.

Examples of the cyclic amine include a heterocyclic compound containing a nitrogen atom as a hetero atom. The heterocyclic compound may be either a monocyclic compound (aliphatic monocyclic amine) or a polycyclic compound (aliphatic polycyclic amine).

Specifically, examples of the aliphatic monocyclic amine include piperidine and piperazine.

The aliphatic polycyclic amine is preferably an aliphatic polycyclic amine having 6 to 10 carbon atoms. Specifically, examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxyl)ethyl}amine, tris{2-(2-methoxyethoxymethoxyl)ethyl}amine, tris{2-(1-methoxyethoxyl)ethyl}amine, tris{2-(1-ethoxyethoxyl)ethyl}amine, tris{2-(1-ethoxypropoxyl)ethyl}amine, tris[2-{2-(2-hydroxyethoxyl)ethoxy}ethyl]amine, and triethanolamine triacetate, with triethanolamine triacetate being preferable.

In addition, an aromatic amine may also be used as the component (D2).

Examples of the aromatic amine include 4-dimethylaminopyridine, pyrrole, indole, pyrazole, imidazole, and derivatives thereof, as well as tribenzylamine, 2,6-diisopropylaniline, and N-tert-butoxycarbonylpyrrolidine.

The component (D2) may be used solely, or may be used in combination of two or more kinds thereof.

In the case where the resist composition contains the component (D2), the component (D2) is generally used in an amount in the range of 0.01 to 5 mass parts based on 100 mass parts of the component (A). When the amount of the component (D2) falls within the foregoing range, the resist pattern shape, the post-exposure temporal stability, and the like are enhanced.

[Component (E): At Least One Compound Selected from the Group Consisting of an Organic Carboxylic Acid and a Phosphorus Oxo Acid and a Derivative Thereof]

For the purposes of preventing deterioration in sensitivity and enhancing the resist pattern shape, the post-exposure temporal stability, and the like, the resist composition of the present invention can contain, as an arbitrary component, at least one compound (E) (hereafter referred to as "component (E)") selected from the group consisting of an organic carboxylic acid and a phosphorus oxo acid and a derivative thereof.

Suitable examples of the organic carboxylic acid include acetic acid, malonic acid, citric acid, malic acid, succinic acid, benzoic acid, and salicylic acid.

Examples of the phosphorus oxo acid include phosphoric acid, phosphonic acid, and phosphinic acid, with phosphonic acid being especially preferable.

Examples of the derivative of phosphorus oxo acid include an ester in which a hydrogen atom of the above-described oxo acid is substituted with a hydrocarbon group. Examples of the hydrocarbon group include an alkyl group having 1 to 5 carbon atoms and an aryl group having 6 to 15 carbon atoms.

Examples of the derivative of phosphoric acid include a phosphoric acid ester such as di-n-butyl phosphate and diphenyl phosphate.

Examples of the derivative of phosphonic acid include a phosphonic acid ester such as dimethyl phosphonate, di-n-butyl phosphonate, phenylphosphonic acid, diphenyl phosphonate, and dibenzyl phosphonate.

Examples of the derivative of phosphinic acid include a phosphinic acid ester and phenylphosphinic acid.

The component (E) may be used solely, or may be used in combination of two or more kinds thereof.

In the case where the resist composition contains the component (E), in general, the component (E) is used in an amount in the range of 0.01 to 5 mass parts based on 100 mass parts of the component (A).

[Component (F): Fluorine Additive Component]

For the purpose of imparting water repellency to the resist film, the resist composition of the present invention may contain a fluorine additive component (hereinafter referred to as "component (F)").

As the component (F), fluorine-containing high-molecular weight compounds disclosed in, for example, Japanese Unexamined Patent Application, Publication Nos. 2010-002870, 2010-032994, 2010-277043, 2011-13569, and 2011-128226 can be used.

More specifically, examples of the compound (F) include a polymer having a constituent unit (f1) represented by the following formula (f1-1). The polymer is preferably a polymer (homopolymer) composed of only the constituent unit (f1) represented by the following formula (f1-1); a copolymer composed of the constituent unit (f1) and the above-described constituent unit (a1); a copolymer composed of the constituent unit (f1) and the above-described constituent unit (a1'); or a copolymer composed of the constituent unit (f1), a constituent unit derived from acrylic acid or methacrylic acid, and the above-described constituent unit (a1). Here, the constituent unit (a1) which is copolymerized with the constituent unit (f1) is preferably a constituent unit derived from 1-ethyl-1-cyclooctyl(meth)acrylate.

(Chemical formula 49)

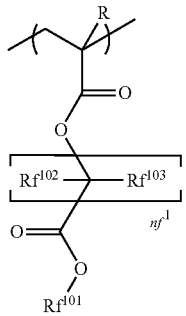

(f1-1)

In the formula, R is the same as that described above; each of $Rf^{102}$ and $Rf^{103}$ independently represents a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other; $nf^1$ is an integer of 1 to 5; and $Rf^{101}$ represents an organic group containing a fluorine atom.

In the formula (f1-1), R bonded to the carbon atom at the α-position is the same as that described above. R is preferably a hydrogen atom or a methyl group.

In the formula (f1-1), examples of the halogen atom represented by $Rf^{102}$ and $Rf^{103}$ include a fluorine atom, a chlorine atom, a bromine atom, and an iodine atom, with a fluorine atom being especially preferable. Examples of the alkyl group having 1 to 5 carbon atoms, as represented by $Rf^{102}$ and $Rf^{103}$, include the same groups as those exemplified above for the alkyl group having 1 to 5 carbon atoms, as represented by R. Of these, a methyl group or an ethyl group is preferable. Specifically, examples of the halogenated alkyl group having 1 to 5 carbon atoms, as represented by $Rf^{102}$ and $Rf^{103}$, include a group in which a part or all of hydrogen atoms of an alkyl group having 1 to 5 carbon atoms are substituted with a halogen atom. Examples of the halogen atom include a fluorine atom, a chlorine atom, a bromine atom, and an iodine atom, with a fluorine atom being especially preferable. Above all, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is more preferable.

In the formula (f1-1), $nf^1$ is an integer of 1 to 5, preferably an integer of 1 to 3, and more preferably 1 or 2.

In the formula (f1-1), $Rf^{101}$ represents an organic group containing a fluorine atom and is preferably a hydrocarbon group containing a fluorine atom.

The hydrocarbon group containing a fluorine atom may be linear, branched, or cyclic, and the carbon number thereof is preferably 1 to 20, more preferably 1 to 15, and especially preferably from 1 to 10.

In addition, in the hydrocarbon group containing a fluorine atom, it is preferable that 25% or more of the hydrogen atoms in the hydrocarbon group are fluorinated; it is more preferable that 50% or more of the hydrogen atoms in the hydrocarbon group are fluorinated; and in view of the fact that the hydrophobicity of the resist film at the time of immersion exposure is increased, it is especially preferable that 60% or more of the hydrogen atoms in the hydrocarbon group are fluorinated.

Above all, $Rf^{101}$ is more preferably a fluorinated hydrocarbon group having 1 to 5 carbon atoms, and especially preferably a trifluoromethyl group, —CH$_2$—CF$_3$, —CH$_2$—CF$_2$—CF$_3$, —CH(CF$_3$)$_2$, —CH$_2$—CH$_2$—CF$_3$, or —CH$_2$—CH$_2$—CF$_2$—CF$_2$—CF$_2$—CF$_3$.

A mass average molecular weight (Mw) (as converted into standard polystyrene by means of gel permeation chromatography) of the component (F) is preferably 1,000 to 50,000, more preferably 5,000 to 40,000, and most preferably 10,000 to 30,000. When the mass average molecular weight of the component (F) is the upper limit value of this range or less, sufficient solubility in a resist solvent for the use as a resist is exhibited, whereas when it is the lower limit value of this range or more, the dry etching resistance and the cross-sectional shape of a resist pattern are satisfactory.

A degree of dispersion (Mw/Mn) of the component (F) is preferably 1.0 to 5.0, more preferably 1.0 to 3.0, and most preferably 1.2 to 2.5.

The component (F) may be used solely, or may be used in combination of two or more kinds thereof.

In the case where the resist composition contains the component (F), in general, the component (F) is used in a proportion of 0.5 to 10 mass parts based on 100 mass parts of the component (A).

In the resist composition of the present invention, if desired, miscible additives, for example, an additional resin for improving the performance of a resist film, a dissolution inhibitor, a plasticizer, a stabilizer, a colorant, a halation inhibitor, or a dye can be further properly added and contained.

[Component (S): Organic Solvent Component]

The resist composition of the present invention can be produced by dissolving the resist materials in an organic solvent component (hereafter sometimes referred to as "component (S)").

The component (S) may be any organic solvent so long as it is able to dissolve the respective components to be used to give a uniform solution, and any arbitrary organic solvent can be appropriately selected from those which have been conventionally known as solvents for a chemically amplified resist composition and used.

Examples of the component (S) include a lactone such as γ-butyrolactone; a ketone such as acetone, methyl ethyl ketone, cyclohexanone, methyl n-pentyl ketone, methyl isopentyl ketone, and 2-heptanone; a polyhydric alcohol such as ethylene glycol, diethylene glycol, propylene glycol, and dipropylene glycol; a compound having an ester bond, such as ethylene glycol monoacetate, diethylene glycol monoacetate, propylene glycol monoacetate, and dipropylene glycol monoacetate; a derivative of a polyhydric alcohol including a compound having an ether bond, such as a monoalkyl ether (for example, monomethyl ether, monoethyl ether, monopropyl ether, or monobutyl ether) or monophenyl ether of the above-described polyhydric alcohol or the above-described compound having an ester bond [of these, propylene glycol monomethyl ether acetate (PGMEA) or propylene glycol monomethyl ether (PGME) is preferable]; a cyclic ether such as dioxane; an ester such as methyl lactate, ethyl lactate (EL), methyl acetate, ethyl acetate, butyl acetate, methyl pyruvate, ethyl pyruvate, methyl methoxypropionate, and ethyl ethoxypropionate; an aromatic organic solvent such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, and mesitylene; and dimethyl sulfoxide (DMSO).

The component (S) may be used solely, or may be used as a mixed solvent of two or more kinds thereof.

Above all, PGMEA, PGME, γ-butyrolactone, EL, or cyclohexanone is preferable.

In addition, a mixed solvent obtained by mixing PGMEA with a polar solvent is also preferable. Though a blending ratio (mass ratio) of the mixed solvent may be appropriately determined while taking into consideration the compatibility of PGMEA with the polar solvent or the like, it is preferable to allow the blending ratio to fall within the range of 1/9 to 9/1, and more preferably 2/8 to 8/2.

More specifically, in the case where EL or cyclohexanone is blended as the polar solvent, a mass ratio of PGMEA to EL or cyclohexanone is preferably 1/9 to 9/1, and more preferably 2/8 to 8/2. In addition, in the case where PGME is blended as the polar solvent, amass ratio of PGMEA to PGME is preferably 1/9 to 9/1, more preferably 2/8 to 8/2, and still more preferably 3/7 to 7/3. Furthermore, a mixed solvent of PGMEA, PGME, and cyclohexanone is also preferable.

In addition, as the component (S), besides, a mixed solvent of at least one member selected from PGMEA and EL with γ-butyrolactone is also preferable. In that case, a mixing proportion is preferably 70/30 to 95/5 in terms of amass ratio of the former to the latter.

An amount of the component (S) to be used is not particularly limited, and it is properly set in a concentration at which coating on a substrate or the like can be conducted, according to the thickness of the coating film. In general, the component (S) is used such that a solid content concentration of the resist composition falls within the range of 1 to 20 mass %, and preferably 2 to 15 mass %.

According to the resist composition and the resist pattern formation method using the same of the present invention, which have been described above, there are brought such effects that a resist pattern with high resolution can be formed; and that a process margin can be sufficiently ensured.

On the occasion of forming, as a finer pattern, for example, a trench pattern or a fine and high-density contact hole pattern, a region with a weak optical intensity is generated in exposed areas of a resist film particularly in the film thickness direction, and therefore, a method in which the region with a weak optical intensity is selectively dissolved and removed, whereby a resist pattern (negative type resist pattern) is formed may be considered to be useful.

In contrast, in the resist pattern formation method according to the present invention, a solvent development process in which a resist pattern (negative type resist pattern) is formed by means of negative type development is adopted. In addition thereto, in the resist composition according to the present invention, the high-molecular weight compound (A1) having the constituent unit (a0) represented by the general formula (a0-1) is used. In the constituent unit (a0), the structure of the acid decomposable group whose polarity increases by the action of an acid is bulky, and the component (A1) has satisfactory solubility in an organic developing solution.

In the present invention, by using the resist composition containing such a component (A1) and applying the solvent development process, the above-described effects of the present invention are exhibited.

EXAMPLES

The present invention is hereunder described in more detail by reference to the following Examples, but it should not be construed that the present invention is limited to these Examples.

<Base Material Component of Resist Composition: High-Molecular Weight Compound>

High-Molecular Weight Compounds A-1 to A-10 used in the present Examples were obtained, respectively by using the following monomers providing constituent units constituting each of the high-molecular weight compounds in a prescribed molar ratio and conducting radical polymerization.

(Chemical formula 50)

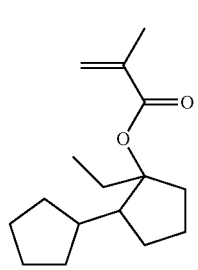

(01)

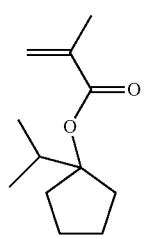

(11)

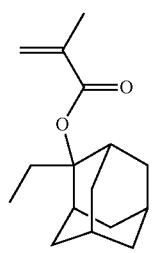

(12)

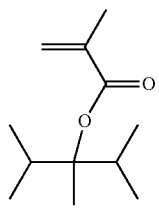

(13)

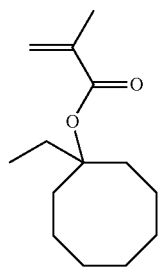

(14)

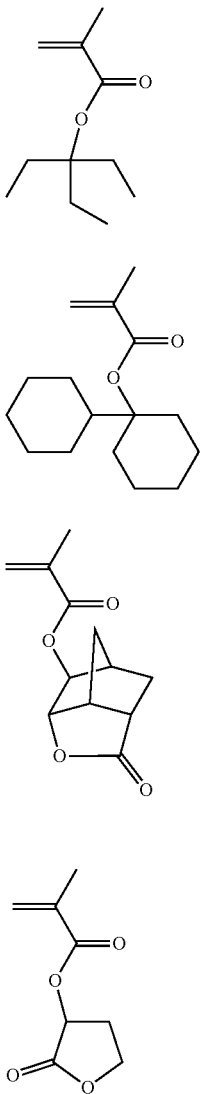

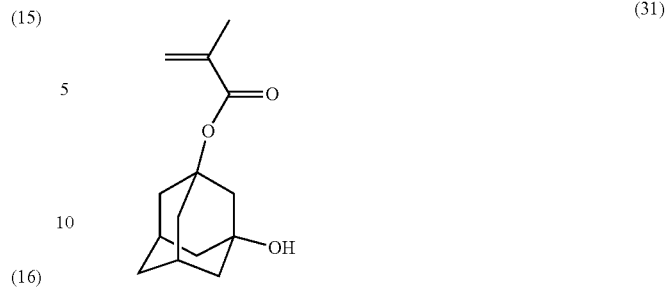

With respect to each of High-Molecular Weight Compounds A-1 to A-10, a copolymerization composition ratio of the high-molecular weight compound (proportion (molar ratio) of the respective constituent units in the high-molecular weight compound) determined by means of $^{13}$C-NMR, a mass average molecular weight (Mw) as converted into standard polystyrene determined by means of GPC measurement, and a degree of molecular weight dispersion (Mw/Mn) are shown jointly in Table 1.

TABLE 1

| High-Molecular Weight Compound | Copolymerization composition ratio (proportion (molar ratio) of respective constituent units) | Mw | Mw/Mn |
|---|---|---|---|
| A-1 | (21)/(01)/(31) = 5/4/1 | 7000 | 1.68 |
| A-2 | (22)/(01)/(31) = 3/6/1 | 12000 | 1.67 |
| A-3 | (21)/(11)/(31) = 5/4/1 | 7000 | 1.80 |
| A-4 | (21)/(12)/(31) = 5/4/1 | 7000 | 1.68 |
| A-5 | (21)/(13)/(31) = 5/4/1 | 7000 | 1.40 |
| A-6 | (21)/(14)/(31) = 5/4/1 | 7000 | 1.52 |
| A-7 | (21)/(15)/(31) = 5/4/1 | 7000 | 1.38 |
| A-8 | (22)/(11)/(31) = 3/6/1 | 12000 | 1.85 |
| A-9 | (21)/(11)/(31) = 3/6/1 | 12000 | 1.80 |
| A-10 | (22)/(16)/(31) = 3/6/1 | 12000 | 1.56 |

<Resist Composition>

Examples 1 to 2, Comparative Examples 1 to 8, and Referential Example 1

A resist composition of each of the Examples was prepared by mixing and dissolving respective components shown in Table 2.

TABLE 2

| | Component (A) | Component (B) | Component (D) | Component (E) | Component (F) | Component (S) | |
|---|---|---|---|---|---|---|---|
| Example 1 | (A)-1 [100] | (B)-1 [6.0] | (D)-1 [3.0] | (E)-1 [0.5] | (F)-1 [1.5] | (S)-1 [100] | (S)-2 [3093] |
| Comparative Example 1 | (A)-3 [100] | (B)-1 [6.0] | (D)-1 [3.0] | (E)-1 [0.5] | (F)-1 [1.5] | (S)-1 [100] | (S)-2 [3093] |
| Comparative Example 2 | (A)-4 [100] | (B)-1 [6.0] | (D)-1 [3.0] | (E)-1 [0.5] | (F)-1 [1.5] | (S)-1 [100] | (S)-2 [3093] |
| Comparative Example 3 | (A)-5 [100] | (B)-1 [6.0] | (D)-1 [3.0] | (E)-1 [0.5] | (F)-1 [1.5] | (S)-1 [100] | (S)-2 [3093] |
| Comparative Example 4 | (A)-6 [100] | (B)-1 [6.0] | (D)-1 [3.0] | (E)-1 [0.5] | (F)-1 [1.5] | (S)-1 [100] | (S)-2 [3093] |
| Comparative Example 5 | (A)-7 [100] | (B)-1 [6.0] | (D)-1 [3.0] | (E)-1 [0.5] | (F)-1 [1.5] | (S)-1 [100] | (S)-2 [3093] |
| Example 2 | (A)-2 [100] | (B)-1 [6.0] | (D)-1 [3.0] | (E)-1 [0.5] | (F)-1 [1.5] | (S)-1 [100] | (S)-2 [3093] |
| Comparative Example 6 | (A)-8 [100] | (B)-1 [6.0] | (D)-1 [3.0] | (E)-1 [0.5] | (F)-1 [1.5] | (S)-1 [100] | (S)-2 [3093] |
| Comparative Example 7 | (A)-9 [100] | (B)-1 [6.0] | (D)-1 [3.0] | (E)-1 [0.5] | (F)-1 [1.5] | (S)-1 [100] | (S)-2 [3093] |
| Comparative Example 8 | (A)-10 [100] | (B)-1 [6.0] | (D)-1 [3.0] | (E)-1 [0.5] | (F)-1 [1.5] | (S)-1 [100] | (S)-2 [3093] |

TABLE 2-continued

| | Component (A) | Component (B) | Component (D) | Component (E) | Component (F) | Component (S) |
|---|---|---|---|---|---|---|
| Referential Example 1 | (A)-1 [100] | (B)-1 [11.4] | (D)-2 [4.05] | (E)-1 [2.09] | (F)-1 [3.3] | (S)-2 [3332] |

In Table 2, the respective abbreviations have the following meanings. The numerical values in the square brackets are a blending amount (mass parts).

(A)-1 to (A)-10: High-Molecular Weight Compounds A-1 to A-10 as described above (B)-1: Acid generator composed of a compound represented by the following chemical formula (B)-1

(D)-1: Acid diffusion control agent composed of a compound represented by the following chemical formula (D)-1

(D)-2: Acid diffusion control agent composed of a compound represented by the following chemical formula (D)-2

(E)-1: Salicylic acid (F)-1: Fluorine-containing high-molecular weight compound represented by the following chemical formula (F)-1. A mass average molecular weight (Mw), as converted into standard polystyrene determined by means of GPC measurement, is 23,100, and a degree of molecular weight dispersion (Mw/Mn) is 1.78. A copolymerization composition ratio (proportion (molar ratio) of the respective constituent units in the structural formula) as determined by $^{13}$C-NMR is l/m=77/23.

(S)-1: γ-Butyrolactone (S)-2: Mixed solvent of propylene glycol monomethyl ether acetate/propylene glycol monomethyl ether/cyclohexanone=45/30/25 (mass ratio)

(Chemical formula 51)

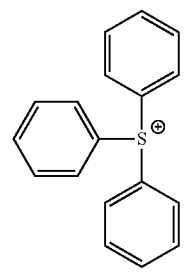
(B)-1

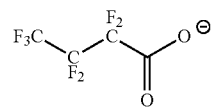

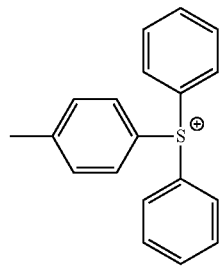
(D)-1

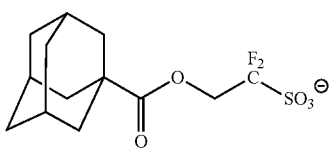

-continued

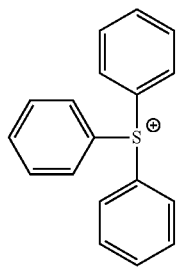
(D)-2

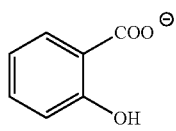

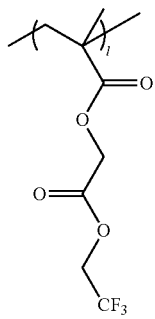
(F)-1

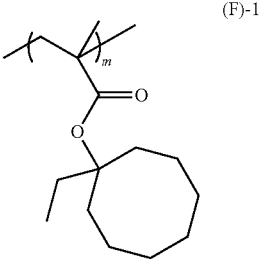

<Formation of Negative Type Resist Pattern>

An organic antireflection film having a thickness of 150 nm was formed on a 12-inch silicon wafer, and subsequently, an inorganic antireflection film having a film thickness of 35 nm was laminated on the organic antireflection film.

On the inorganic antireflection film, the resist composition of each of the Examples and Comparative Examples was coated by using a spinner and subjected to a prebake treatment on a hot plate at a heating temperature (PAB (° C.)) shown in the following tables for 60 seconds and dried, thereby forming a resist film having a thickness of 100 nm.

Subsequently, the resist film was selectively irradiated with ArF excimer lasers (193 nm) through each of the following photomasks (6% half tone) by an ArF exposure apparatus for liquid immersion, NSR-S609B [manufactured by Nikon Corporation, NA (numerical aperture)=1.07, annular (0.97/0.78) with Y-polarization, liquid immersion medium: water].

Target 1 (line width: 50 nm/pitch: 100 nm)
Target 2 (space width: 50 nm/pitch: 140 nm)

Thereafter, a post exposure bake (PEB) treatment was conducted at a heating temperature (PEB (° C.)) shown in the following tables for 60 seconds.

Subsequently, the resultant was subjected to solvent development with butyl acetate at 23° C. for 13 seconds and then dried by shaking.

As a result, in all of the Examples and Comparative Examples, in the case of Target 1, a line-and-space resist pattern with a line width of 50 nm and a pitch of 100 nm (hereinafter also referred to simply as "LS pattern") was formed; and in the case of Target 2, a space-and-line resist pattern with a space width of 50 nm and a pitch of 140 nm (hereinafter also referred to simply as "SL pattern") was formed.

<Formation of Positive Type Resist Pattern>

An organic antireflection film having a thickness of 150 nm was formed on a 12-inch silicon wafer, and subsequently, an inorganic antireflection film having a thickness of 35 nm was laminated on the organic antireflection film.

On the inorganic antireflection film, the resist composition of Referential Example 1 was coated by using a spinner and subjected to a prebake (PAB) treatment on a hot plate at 110° C. for 60 seconds and dried, thereby forming a resist film having a thickness of 100 nm.

Subsequently, the resist film was selectively irradiated with ArF excimer lasers (193 nm) through a photomask (6% half tone) by an ArF exposure apparatus for liquid immersion, NSR-5609B [manufactured by Nikon Corporation, NA (numerical aperture)=1.07, annular (0.97/0.78) with Y-polarization, liquid immersion medium: water].

Thereafter, a post exposure bake (PEB) treatment was conducted at 90° C. or 85° C. for 60 seconds.

Subsequently, the resultant was subjected to alkali development with a 2.38 mass % TMAH aqueous solution (a trade name: NMD-3, manufactured by Tokyo Ohka Kogyo Co., Ltd.) at 23° C. for 10 seconds, and thereafter, water rinse was conducted by using pure water for 30 seconds, followed by drying by shaking.

As a result, an LS pattern with a line width of 50 nm and a pitch of 100 nm was formed by using the resist composition of Referential Example 1.

[Evaluation of Optimum Exposure Amount (Eop)]

An optimum exposure amount, Eop (mJ/cm$^2$) at which a target resist pattern was formed by the above-described resist pattern formation was determined. The results are shown as "Eop (mJ/cm$^2$)" in Tables 3 to 5.

[Evaluation of Depth and Width of Focus (DOF) Properties]

In the above-described Eop, the focus was properly slid upward and downward, and a resist pattern was formed in the same manner as that in the above-described resist pattern formation, thereby determining a depth and width of focus (DOF, unit: nm) within a range where a line pattern or space pattern shape may be formed. The results are shown as "OPEN DOF (nm)" in Tables 3 to 5.

It is to be noted that the term "DOF" means a range of depth of focus where on the occasion of conducting exposure at the same exposure amount while sliding the focus upward and downward, a resist pattern having a prescribed shape can be formed, namely a range where a faithful resist pattern to a mask pattern may be obtained, and it is more preferable that a value thereof is larger.

[Evaluation of Exposure Latitude (EL Margin)]

In the above-described resist pattern formation, an exposure amount was determined on the occasion of forming lines of an LS pattern or spaces of an SL pattern within a range of ±5% of the target dimension (width: 50 nm) (47.5 nm to 52.5 nm), and an EL margin (unit: %) was determined according to the following equation. The results are shown in Tables 3 to 5.

EL margin (%)=(|E1−E2|/Eop)×100

E1: Exposure amount (mJ/cm$^2$) on the occasion of forming a pattern with a width of 47.5 nm E2: Exposure amount (mJ/cm$^2$) on the occasion of forming a pattern with a width of 52.5 nm As for the EL margin, it is meant that the larger the value of the EL margin is, the smaller the amount of change in the pattern size by the variation of the exposure amount is.

[Evaluation of Line Width Roughness (LWR)]

In the resist pattern formed by the above-described resist pattern formation, a line width of the LS pattern was measured at 400 points in the lengthwise direction of the line, or a space width of the SL pattern was measured at 400 points in the lengthwise direction of the space, by using a measuring SEM (scanning electron microscope) (a trade name: S-9380, manufactured by Hitachi High-Technologies Corporation; accelerating voltage: 300V). From the results, the value of 3 times the standard deviation (s) (i.e., 3s) was determined, and an average value (nm) of the 3s values at the 400 points was calculated as a yardstick of LWR. The results are shown in Tables 3 to 5.

The smaller this 3s value is, the lower the level of roughness of the line width is, indicating that an LS pattern or SL pattern with a more uniform width was obtained.

[Evaluation of Mask Error Factor (MEEF)]

LS patterns having a pitch of 100 nm and SL patterns having a pitch of 140 nm were formed, respectively by using a photo mask targeting a size (line width, space width) of 45 to 54 nm (at intervals of 1 nm, ten points in total) at the same exposure amount according to the same procedures as those in the resist pattern formation as described above.

On that occasion, a slope of a straight line at the time of plotting the target size (nm) on the abscissa and the line width or space width (nm) as formed on the resist film by using each mask pattern on the ordinate, respectively was calculated. This slope of the straight line is shown as "MEEF" in Tables 3 to 5.

[Evaluation of Minimum Dimension Value]

On the occasion of forming a resist pattern by properly changing the exposure amount (mJ/cm$^2$) and the focus, a minimum dimension of the resolved pattern was determined by using a measuring SEM (scanning electron microscope) (a trade name: S-9380, manufactured by Hitachi High-Technologies Corporation; accelerating voltage: 300 V). The results are shown as "Min CD (nm)" in Tables 3 to 5.

TABLE 3

|  | Resist pattern formation method | PAB (° C.) | PEB (° C.) | Eop (mJ/cm$^2$) | OPEN DOF (nm) | EL margin (%) | LWR (nm) | MEEF | Min CD (nm) |
|---|---|---|---|---|---|---|---|---|---|
| Example 1 | Solvent development process | 110 | 90 | 29.357 | 0.48 | 8.47 | 5.35 | 3.42 | 42.4 |
| Referential Example 1 | Alkali development process | 100 | 105 | 25.900 | 0.30 | 4.57 | 6.68 | 5.10 | 48.5 |

From the results shown in Table 3, it can be confirmed that on the occasion of forming a resist pattern with a minute dimension by using the resist composition of Example 1, the case of applying the solvent development process is more excellent than the case of applying the alkali development process in terms of the resolution of a resist pattern, the process margin, and the like.

TABLE 4

| Negative type resist pattern Case of Target 1 | PAB (° C.) | PEB (° C.) | Eop (mJ/cm$^2$) | OPEN DOF (nm) | EL margin (%) | LWR (nm) | MEEF | Min CD (nm) |
|---|---|---|---|---|---|---|---|---|
| Example 1 | 110 | 90 | 28.950 | 0.54 | 7.66 | 5.51 | 2.98 | 43.2 |
| Comparative Example 1 | 110 | 90 | 28.580 | 0.36 | 7.33 | 5.47 | 3.92 | 46.9 |
| Comparative Example 2 | 110 | 90 | 26.674 | 0.21 | 4.80 | 6.51 | 3.18 | 55.6 |
| Comparative Example 3 | 110 | 90 | 24.100 | 0.45 | 7.39 | 5.77 | 3.81 | 45.3 |
| Comparative Example 4 | 110 | 90 | 18.800 | 0.33 | 4.79 | 6.48 | 3.92 | 50.7 |
| Comparative Example 5 | 110 | 90 | 33.900 | 0.48 | 7.37 | 5.25 | 3.62 | 42.9 |
| Example 2 | 110 | 85 | 30.011 | 0.51 | 9.95 | 5.29 | 2.72 | 44.6 |
| Comparative Example 6 | 110 | 90 | 24.552 | 0.54 | 8.22 | 5.14 | 3.73 | 42.9 |
| Comparative Example 7 | 110 | 90 | 25.518 | 0.42 | 8.39 | 5.33 | 3.54 | 47.8 |
| Comparative Example 8 | 110 | 85 | 28.023 | 0.54 | 10.4 | 5.35 | 2.57 | 42.4 |

TABLE 5

| Negative type resist pattern Case of Target 2 | PAB (° C.) | PEB (° C.) | Eop (mJ/cm$^2$) | OPEN DOF (nm) | EL margin (%) | LWR (nm) | MEEF |
|---|---|---|---|---|---|---|---|
| Example 1 | 110 | 90 | 25.811 | 0.24 | 9.69 | 3.05 | 2.05 |
| Comparative Example 1 | 110 | 90 | 27.681 | 0.15 | 6.74 | 4.83 | 2.66 |
| Comparative Example 2 | 110 | 90 | 29.341 | 0.15 | 8.61 | 2.98 | 2.00 |
| Comparative Example 3 | 110 | 90 | 25.300 | 0.09 | 7.81 | 3.02 | 2.29 |
| Comparative Example 4 | 110 | 90 | 20.500 | 0.21 | 6.56 | 3.47 | 2.34 |
| Comparative Example 5 | 110 | 90 | 35.900 | 0.12 | 7.44 | 3.17 | 2.50 |
| Example 2 | 110 | 85 | 27.991 | 0.18 | 9.13 | 3.33 | 1.86 |
| Comparative Example 6 | 110 | 90 | 23.955 | 0.15 | 6.98 | 3.33 | 2.93 |
| Comparative Example 7 | 110 | 90 | 28.222 | 0.15 | 8.84 | 3.13 | 2.36 |
| Comparative Example 8 | 110 | 85 | 26.860 | 0.09 | 8.20 | 3.65 | 1.93 |

From the results shown in Tables 4 and 5, it is noted that according to the resist compositions of Examples 1 and 2 to which the present invention is applied and the resist pattern formation method using the same, not only a resist pattern with high resolution can be formed, but a process margin can be sufficiently ensured.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for forming a resist pattern comprising:
forming a resist film on a support by using a resist composition which generates an acid upon exposure and whose solubility in a developing solution changes by the action of the acid;
exposing the resist film; and
subjecting the exposed resist film to patterning by negative type development with a developing solution containing an organic solvent to form a resist pattern,
wherein the resist composition contains:
a high-molecular weight compound having a constituent unit (a1) represented by the following general formula, a constituent unit (a2) containing a lactone-containing cyclic group, and a constituent unit (a3) containing a polar group-containing aliphatic hydrocarbon group:

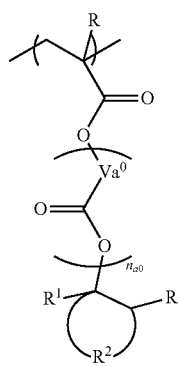

(a1)

wherein R represents a hydrogen atom, an alkyl group having 1 to 5 carbon atoms, or a halogenated alkyl group having 1 to 5 carbon atoms; $Va^0$ represents a divalent hydrocarbon group which may have an ether bond, a urethane bond, or an amide bond; $n_{a0}$ is an integer of 0 to 2; $R^1$ represents a chain or cyclic aliphatic hydrocarbon group; $R^2$ represents a group for forming a monocyclic group together with the carbon atom to which $R^1$ is bonded; and $R^3$ represents a cyclic group which may have a substituent; and
an acid generator which generates acid upon exposure, wherein the solubility of the high-molecular weight compound in a developing solution is changed by the action of the acid.

2. The method for forming a resist pattern according to claim 1, wherein the developing solution used for the negative type development contains one or more organic solvents selected from the group consisting of an ester-based organic solvent and a ketone-based organic solvent.

3. The method for forming a resist pattern according to claim 1, wherein the constituent unit (a2) has a lactone-containing cyclic group represented by any one of general formulae (a2-r-1) to (a2-r-7) shown below, and the constituent unit (a3) is represented by any one of general formulae (a3-1) to (a3-3) shown below:

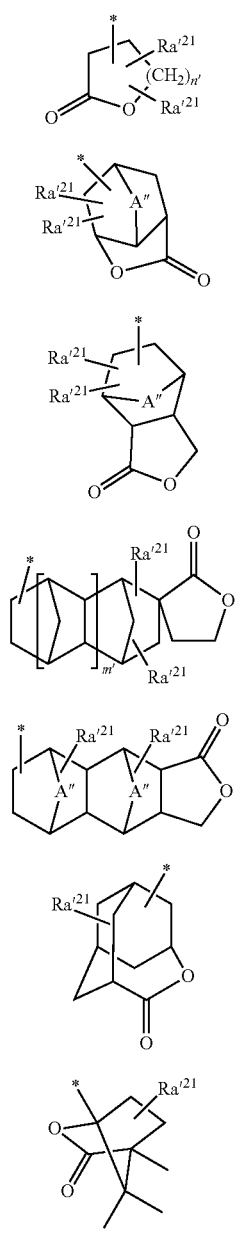

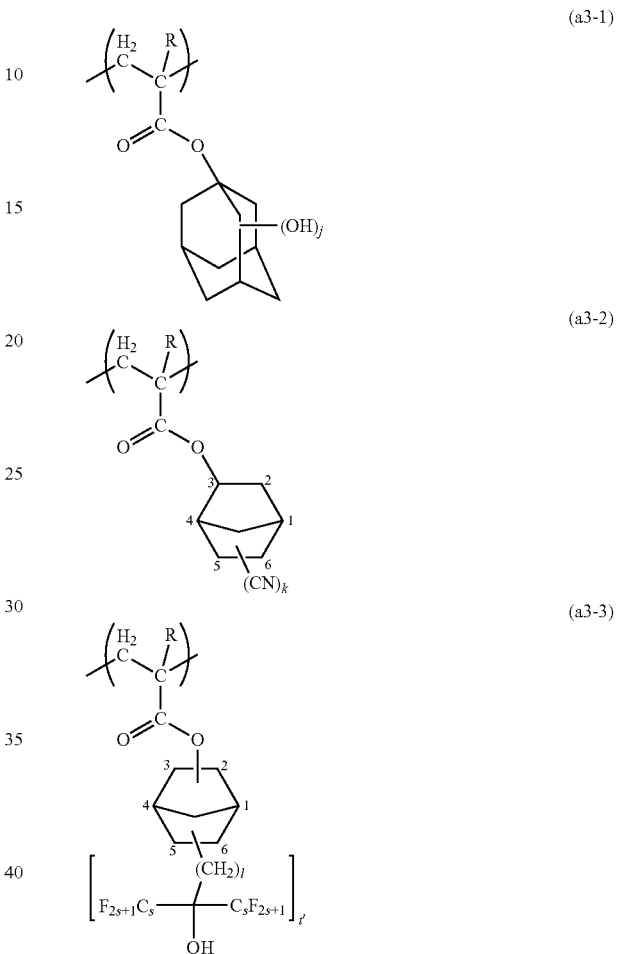

wherein each $Ra'^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or an —SO$_2$—-containing cyclic group; A" represents an alkylene group having 1 to 5 carbon atoms, which may contain an oxygen atom or a sulfur atom, an oxygen atom, or a sulfur atom; n' is an integer of 0 to 2; and m' is 0 or 1; and wherein R represents a hydrogen atom, an alkyl group having 1 to 5 carbon atoms, or a halogenated alkyl group having 1 to 5 carbon atoms; j is an integer of 1 to 3; k is an integer of 1 to 3; t' is an integer of 1 to 3; l is an integer of 1 to 5; and s is an integer of 1 to 3.

4. The method for forming a resist pattern according to claim 3, wherein the constituent unit (a2) is represented by general formula (a2-1) shown below:

wherein R represents a hydrogen atom, an alkyl group having 1 to 5 carbon atoms, or a halogenated alkyl group having 1 to 5 carbon atoms; $Ya^{2l}$ represents a single bond or a divalent connecting group; $La^{2l}$ represents —O—, —COOO—, or —OCO—; R' represents a hydrogen atom or a methyl group, provided that in the case where $La^{21}$ is —O—, then $Ya^{21}$ is not —CO—; and $Ra^{21}$ represents a lactone-containing cyclic group represented by any one of general formulae (a2-r-1) to (a2-r-7).

5. The method for forming a resist pattern according to claim 3, wherein the constituent unit (a2) has a lactone-containing cyclic group represented by general formula (a2-r-2), and the constituent unit (a3) is represented by general formula (a3-1).

6. The method for forming a resist pattern according to claim 5, wherein the constituent unit (a2) is represented by general formula (a2-1) shown below:

(a2-1)

wherein R represents a hydrogen atom, an alkyl group having 1 to 5 carbon atoms, or a halogenated alkyl group having 1 to 5 carbon atoms; $Ya^{21}$ represents a single bond or a divalent connecting group; $La^{2l}$ represents —O—, —COO—, or —OCO—; R' represents a hydrogen atom or a methyl group, provided that in the case where $La^{2l}$ is —O—, then $Ya^{21}$ is not —CO—; and $Ra^{2l}$ represents a lactone-containing cyclic group represented by general formula (a2-r-2).

* * * * *